(12) United States Patent
Kashiwagi et al.

(10) Patent No.: US 10,133,175 B2
(45) Date of Patent: Nov. 20, 2018

(54) PHOTOSENSITIVE RESIN COMPOSITION, CURED PRODUCT AND METHOD FOR PRODUCING SAME, METHOD FOR PRODUCING RESIN PATTERN, CURED FILM, LIQUID CRYSTAL DISPLAY DEVICE, ORGANIC EL DISPLAY DEVICE, INFRARED CUT FILTER, AND SOLID-STATE IMAGING DEVICE

(71) Applicant: FUJIFILM Corporation, Tokyo (JP)

(72) Inventors: Daisuke Kashiwagi, Shizuoka (JP); Takeshi Andou, Shizuoka (JP); Satoru Yamada, Shizuoka (JP); Yasumasa Kawabe, Shizuoka (JP); Hisamitsu Tomeba, Shizuoka (JP)

(73) Assignee: FUJIFILM Corporation, Minato-ku, Tokyo (JP)

( * ) Notice: Subject to any disclaimer, the term of this patent is extended or adjusted under 35 U.S.C. 154(b) by 0 days.

(21) Appl. No.: 15/209,870

(22) Filed: Jul. 14, 2016

(65) Prior Publication Data

US 2016/0320529 A1    Nov. 3, 2016

Related U.S. Application Data

(63) Continuation of application No. PCT/JP2015/054632, filed on Feb. 19, 2015.

(30) Foreign Application Priority Data

Feb. 20, 2014    (JP) ................................ 2014-030654

(51) Int. Cl.

| | | |
|---|---|---|
| *G03F 7/004* | (2006.01) | |
| *G03F 7/038* | (2006.01) | |
| *C08F 220/18* | (2006.01) | |
| *G02F 1/1335* | (2006.01) | |
| *G02B 5/20* | (2006.01) | |
| *G03F 7/00* | (2006.01) | |
| *G03F 7/039* | (2006.01) | |
| *G03F 7/32* | (2006.01) | |
| *G03F 7/40* | (2006.01) | |
| *H01L 51/52* | (2006.01) | |
| *H01L 27/32* | (2006.01) | |
| *C08F 212/14* | (2006.01) | |
| *C08F 220/16* | (2006.01) | |
| *C08F 220/28* | (2006.01) | |

(Continued)

(52) U.S. Cl.

CPC ............ *G03F 7/038* (2013.01); *C08F 212/14* (2013.01); *C08F 220/16* (2013.01); *C08F 220/18* (2013.01); *C08F 220/28* (2013.01); *C08F 220/36* (2013.01); *G02B 1/04* (2013.01); *G02B 5/206* (2013.01); *G02B 5/208* (2013.01); *G02B 5/223* (2013.01); *G02F 1/1335* (2013.01); *G03F 7/0007* (2013.01); *G03F 7/0045* (2013.01); *G03F 7/0392* (2013.01); *G03F 7/0397* (2013.01); *G03F 7/168* (2013.01); *G03F 7/20* (2013.01); *G03F 7/322* (2013.01); *G03F 7/40* (2013.01); *H01L 27/14621* (2013.01); *H01L 27/14623* (2013.01); *H01L 27/14685* (2013.01); *H01L 27/322* (2013.01); *H01L 51/004* (2013.01); *H01L 51/0043* (2013.01); *H01L 51/5284* (2013.01); *H01L 51/56* (2013.01); *C08F 2220/281* (2013.01); *C08F 2220/365* (2013.01)

(58) Field of Classification Search

CPC ........ G03F 7/0007; G03F 7/105; G03F 7/027; G03F 7/032; G03F 7/322; C08F 220/18; H01L 27/14621

USPC ...... 430/7, 329, 330, 331, 280.1, 281.1, 913

See application file for complete search history.

(56) References Cited

U.S. PATENT DOCUMENTS

| 6,806,024 B1 * | 10/2004 | Kura ..................... C07C 309/66 430/270.1 |
| 7,785,501 B2 * | 8/2010 | Segawa .................. G02B 5/003 252/520.22 |

(Continued)

FOREIGN PATENT DOCUMENTS

| JP | 05-341530 A | 12/1993 |
| JP | 2006-032886 A | 2/2006 |

(Continued)

OTHER PUBLICATIONS

Machine translation of JP 2008-009121 (no date).*

(Continued)

*Primary Examiner* — Amanda C. Walke
(74) *Attorney, Agent, or Firm* — Sughrue Mion, PLLC

(57) ABSTRACT

Provided are a photosensitive resin composition from which a cured product having a thin film thickness, excellent light-shielding properties, and a high surface hardness is obtained; as well as a cured product obtained by curing the photosensitive resin composition, a cured film and a method for producing the same, a method for producing a resin pattern, and a liquid crystal display device, an organic EL display device, an infrared cut filter, or a solid-state imaging device, each having the cured film. The photosensitive resin composition of the present invention includes (Component A) a polymer having a constitutional unit containing a group in which an acid group is protected by an acid-decomposable group; (Component B) a photoacid generator; (Component C) a solvent; (Component D) a compound having a crosslinkable group and a molecular weight in the range of 100 to 2,000; and (Component S) titanium black.

25 Claims, No Drawings

(51) Int. Cl.
*C08F 220/36* (2006.01)
*G02B 1/04* (2006.01)
*G02B 5/22* (2006.01)
*G03F 7/16* (2006.01)
*G03F 7/20* (2006.01)
*H01L 27/146* (2006.01)
*H01L 51/00* (2006.01)
*H01L 51/56* (2006.01)

(56) References Cited

U.S. PATENT DOCUMENTS

| | | |
|---|---|---|
| 2005/0275746 A1 | 12/2005 | Nishida et al. |
| 2009/0002532 A1 | 1/2009 | Nishida et al. |
| 2010/0137509 A1* | 6/2010 | Shimohara .......... C09D 11/101 524/612 |
| 2012/0199727 A1 | 8/2012 | Kubota |
| 2013/0171415 A1 | 7/2013 | Sakita et al. |
| 2013/0302728 A1* | 11/2013 | Kura ................ C07D 211/94 430/7 |
| 2013/0308219 A1* | 11/2013 | Kunimoto ........... C07D 327/06 359/891 |

FOREIGN PATENT DOCUMENTS

| | | |
|---|---|---|
| JP | 2006-251296 A | 9/2006 |
| JP | 2008-009121 A | 1/2008 |
| JP | 2009-244741 A | 10/2009 |
| JP | 2013-061616 A | 4/2013 |
| KR | 1020120099413 A | 9/2012 |
| KR | 1020130099079 A | 9/2013 |

OTHER PUBLICATIONS

Machine translation of JP 2006-251196 (no date).*
Notification of Reasons for Refusal, dated May 23, 2017, in related JP Application No. 2016-504163, 5 pages in English and Japanese.
Written Opinion of the International Searching Authority of PCT/JP2015/054632 dated May 12, 2015.
International Search Report of PCT/JP2015/054632 dated May 12, 2015.
Invitation to File Observations, mailed Aug. 17, 2017, in Korean Application No. 2016-7019770, 16 pages in English and Korean.
Office Action dated Feb. 1, 2018 issued by the Korean Intellectual Property Office in counterpart Korean application No. 10-2016-7019770.

* cited by examiner

PHOTOSENSITIVE RESIN COMPOSITION, CURED PRODUCT AND METHOD FOR PRODUCING SAME, METHOD FOR PRODUCING RESIN PATTERN, CURED FILM, LIQUID CRYSTAL DISPLAY DEVICE, ORGANIC EL DISPLAY DEVICE, INFRARED CUT FILTER, AND SOLID-STATE IMAGING DEVICE

CROSS-REFERENCE TO RELATED APPLICATIONS

This application is a Continuation of PCT International Application No. PCT/JP2015/054632 filed on Feb. 19, 2015, which claims priority under 35 U.S.C. § 119(a) to Japanese Patent Application No. 2014-030654 filed on Feb. 20, 2014. The contents of these applications are incorporated herein by reference in their entirety.

BACKGROUND OF THE INVENTION

1. Field of the Invention

The present invention relates to a photosensitive resin composition (hereinafter sometimes simply referred to as "resin composition of the present invention" or "composition of the present invention"). Further, the present invention relates to a method for producing a resin pattern using the photosensitive resin composition; a cured product obtained by curing the photosensitive resin composition; a cured film obtained by curing the photosensitive resin composition; and a variety of image display devices, infrared cut filters, and solid-state imaging devices using the cured film.

More specifically, the present invention relates to a photosensitive resin composition suitable for the formation of a black matrix of a color filter (light-shielding color filter) or a light-shielding film of an infrared cut filter which is used for a liquid crystal display device, an organic EL display device, a solid-state imaging device, or the like; as well as a method for producing a cured film using the same.

2. Description of the Related Art

In a color filter used for a liquid crystal display device, a light-shielding film called a black matrix is arranged for the purposes of shielding light between colored pixels, increasing contrast, and the like. Further, in a solid image pickup element, a black matrix is also arranged for the purposes of preventing noise and improving image quality, and the like. Generally, the black matrix is manufactured by forming a pattern using a polymerizable composition containing a dispersion of a light-shielding black color material, a polymerizable compound, a polymerization initiator, and other components.

As a conventional photosensitive resin composition, there are known those described in JP1993-341530A (JP-H05-341530A) or JP2009-244741A.

SUMMARY OF THE INVENTION

A black matrix, in a color filter, serves to partition colored pixels to define the shape thereof, to shield light from boundaries between colored pixels to prevent color bleeding, and the like.

There is an overlap portion between a black matrix and a colored pixel. When the swelling of the overlap portion is great, such swelling of the overlap portion has an adverse effect on display. Therefore, achievement of a thin film thickness is required in order to reduce the swelling. Furthermore, light-shielding properties in the visible light region are required in order to prevent color bleeding.

Furthermore, after forming a black matrix in the manufacture of a color filter, a step of forming a colored pixel portion, an ITO, or the like is performed, and thus the black matrix is required to have a certain surface hardness.

In other words, a black matrix has been required which has a thin film thickness and excellent light-shielding properties, and also exhibits a high surface hardness. Meanwhile, "has a thin film thickness and excellent light-shielding properties" indicates that a value of "OD/film thickness" which is obtained by dividing an optical density (OD) value by a thickness of the film is large.

Hereinafter, the details of the above-mentioned technical problems will be described.

In order to increase the OD/film thickness, the proportion of a colorant in the composition is increased to correspondingly decrease the proportion of components other than the colorant. Consequently, the proportion of a curing component in the composition is decreased and accordingly the surface hardness tends to be lower.

Furthermore, in order to increase the surface hardness, the proportion of a curing component in the composition is increased and accordingly the proportion of a colorant in the composition is decreased, leading to a tendency of OD/film thickness being decreased.

In this way, there is a tendency for a trade-off between OD/film thickness and surface hardness.

In order to impart sufficient light-shielding properties (high optical density (high OD)), it is necessary for a black matrix to have a sufficient amount of a colorant. Conventionally, carbon black has been used as a colorant (JP1993-341530A (JP-H05-341530A)).

Increasing the proportion of carbon black in the composition in order to cope with the requirements of high OD/film thickness described above has given rise to a problem in that the surface hardness of a black matrix is inferior.

Therefore, titanium black has recently been studied as a black colorant imparting superior surface hardness, (JP2009-244741A). It has been found through tests by the present inventors that the surface hardness is sufficient, but the OD/film thickness is not sufficient in the composition described in JP2009-244741A.

An object of the present invention is to provide a photosensitive resin composition from which a cured product having a thin film thickness, excellent light-shielding properties, and a high surface hardness is obtained; as well as a cured product obtained by curing the photosensitive resin composition, a cured film and a method for producing the same, a method for producing a resin pattern, and a liquid crystal display device, an organic EL display device, an infrared cut filter, or a solid-state imaging device, each having the cured film.

The above object of the present invention has been achieved by the following means described in <1>, <8> to <11>, or <13> to <16>. Preferred embodiments <2> to <7> and <12> are described below therewith.

<1> A photosensitive resin composition comprising:
(Component A) a polymer having a constitutional unit containing a group in which an acid group is protected by an acid-decomposable group;
(Component B) a photoacid generator;
(Component C) a solvent;
(Component D) a compound having a crosslinkable group and a molecular weight in the range of 100 to 2,000; and
(Component S) titanium black.

<2> The photosensitive resin composition according to <1>, in which the crosslinkable group is at least one selected from the group consisting of an epoxy group, an oxetanyl group, an alkoxymethyl group, a methylol group, a blocked isocyanate group, and a group having an ethylenically unsaturated bond.

<3> The photosensitive resin composition according to <1> or <2>, in which the crosslinkable group equivalent in the photosensitive resin composition is 100 to 1,000 per 1 g of organic solid content.

<4> The photosensitive resin composition according to any one of <1> to <3>, further comprising (Component E) a dispersant.

<5> The photosensitive resin composition according to any one of <1> to <4>, in which the content of Component S is 40 mass % to 80 mass % based on the total solid content of the photosensitive resin composition.

<6> The photosensitive resin composition according to any one of <1> to <5>, in which the crosslinkable group is at least one selected from the group consisting of an epoxy group, an oxetanyl group, and a (meth)acryloxy group.

<7> The photosensitive resin composition according to any one of <1> to <6>, in which Component B is an oxime sulfonate compound.

<8> A method for producing a cured product, comprising at least steps (a) to (c) in this order.

(a) a coating step of applying the photosensitive resin composition according to any one of <1> to <7> onto a substrate;

(b) a solvent removal step of removing a solvent from the applied resin composition; and (c) a heat treatment step of heat-treating the resin composition freed from the solvent, or an exposure step of irradiating the resin composition freed from the solvent with actinic rays.

<9> A method for producing a resin pattern, comprising at least steps (1) to (4) in this order.

(1) a coating step of applying the photosensitive resin composition according to any one of <1> to <7> onto a substrate;

(2) a solvent removal step of removing a solvent from the applied resin composition;

(3) an exposure step of patternwise exposing the resin composition freed from the solvent to actinic rays; and (4) a developing step of developing the exposed resin composition and the unexposed resin composition with an aqueous developer.

<10> A cured product obtained by the method for producing a cured product according to <8>, or the method for producing a resin pattern according to <9>.

<11> A cured film obtained by curing the photosensitive resin composition according to any one of <1> to <7>.

<12> The cured film according to <11>, which is a light-shielding color filter.

<13> A liquid crystal display device having the cured film according to <11> or <12>.

<14> An organic EL display device having the cured film according to <11> or <12>.

<15> An infrared cut filter having the cured film according to <11> or <12>.

<16> A solid-state imaging device having the cured film according to <11> or <12>.

According to the present invention, it is possible to provide a photosensitive resin composition from which a cured product having a thin film thickness, excellent light-shielding properties, and a high surface hardness is obtained; as well as a cured product obtained by curing the photosensitive resin composition, a cured film and a method for producing the same, a method for producing a resin pattern, and a liquid crystal display device, an organic EL display device, an infrared cut filter, or a solid-state imaging device, each having the cured film.

DESCRIPTION OF THE PREFERRED EMBODIMENTS

Hereinafter, the present invention will be described in detail. The description of the constituent element below is made based on the typical embodiment of the invention in some cases, but the invention should not be construed as being limited thereto.

In the specification, the description of "lower limit to upper limit", which indicates a range of values, indicates "equal to or more than the lower limit and equal to or less than the upper limit," and the description of "upper limit to lower limit" indicates "equal to or less than the upper limit and equal to or more than the lower limit." That is, those descriptions indicate the ranges of values including the upper limit and the lower limit.

According to the present invention, "(Component A) a polymer having a constitutional unit containing a group in which an acid group is protected by an acid-decomposable group" or the like will be also simply referred to as "Component A" or the like, and "(a1) a constitutional unit containing a group in which an acid group is protected by an acid-decomposable group" or the like will be also simply referred to as "Constitutional Unit (a1)" or the like.

In the description of the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present invention, "mass %" and "weight %" have the same definition, and "parts by mass" and "parts by weight" have the same definition.

In addition, in the present invention, a combination of preferred embodiments is more preferred.

(Photosensitive Resin Composition)

The photosensitive resin composition of the present invention (hereinafter, simply also referred to as "resin composition") includes (Component A) a polymer having a constitutional unit containing a group in which an acid group is protected by an acid-decomposable group; (Component B) a photoacid generator; (Component C) a solvent; (Component D) a compound having a crosslinkable group and a molecular weight in the range of 100 to 2,000; and (Component S) titanium black.

The photosensitive resin composition of the present invention can be suitably used as a positive resist composition.

The photosensitive resin composition of the present invention is preferably a resin composition having properties of being cured by heat.

Further, the photosensitive resin composition of the present invention is preferably a positive photosensitive resin composition, and more preferably a chemically amplified positive photosensitive resin composition (chemical amplification positive photosensitive resin composition).

The photosensitive resin composition of the present invention is preferably one which does not contain a 1,2-quinonediazide compound as a photoacid generator sensitive to actinic rays. The 1,2-quinonediazide compound produces a carboxy group by sequential photochemical reactions, and a quantum yield thereof is always 1 or less.

In contrast, regarding (Component B) a photoacid generator for use in the present invention, since an acid produced in response to actinic rays acts as a catalyst for the deprotection of the protected acid group in Component A, the acid generated by the action of a single photon contributes to a large number of deprotection reactions, such that the quantum yield exceeds 1, for example, becomes a large value of such as a value corresponding to multiplications of ten, and as a result of a so-called chemical amplification, high sensitivity is obtained.

Further, the photosensitive resin composition of the present invention is preferably a photosensitive resin composition for color filter black matrix (light-shielding color filter).

In addition, a cured film or a cured product obtained by curing the photosensitive resin composition of the present invention can be suitably used as a light-shielding film or a light-shielding member in various display devices.

Hereinafter, the photosensitive resin composition of the present invention will be described in detail.

(Component A) Polymer Having Constitutional Unit Containing Group in which Acid Group is Protected by Acid-Decomposable Group The photosensitive resin composition of the present invention includes (Component A) a polymer having a constitutional unit containing a group in which an acid group is protected by an acid-decomposable group.

In the present invention, the "constitutional unit having a group in which an acid group is protected by an acid-decomposable group" is also referred to as the "(a1) a constitutional unit having a group in which an acid group is protected by an acid-decomposable group".

The photosensitive resin composition of the present invention may further include a polymer other than the polymer having a constitutional unit containing a group in which an acid group is protected by an acid-decomposable group.

The photosensitive resin composition of the present invention may also contain a polymer component including polymers satisfying at least one of (1) or (2) below.

(1) a polymer having (a1) a constitutional unit containing a group in which an acid group is protected by an acid-decomposable group, and (a2) a constitutional unit containing a crosslinkable group.

(2) a polymer having (a1) a constitutional unit containing a group in which an acid group is protected by an acid-decomposable group, and a polymer having (a2) a constitutional unit containing a crosslinkable group.

The photosensitive resin composition of the present invention may further include a polymer other than these polymers. Unless otherwise stated, Component A in the present invention is intended to mean to encompass the "(a1) a constitutional unit containing a group in which an acid group is protected by an acid-decomposable group", and another polymer which is added as required.

Moreover, even in the case of containing a component which satisfies (1) above, the photosensitive resin composition of the present invention may further contain a polymer having (a1) a constitutional unit containing a group in which an acid group is protected by an acid-decomposable group and/or a polymer having (a2) a constitutional unit containing a crosslinkable group.

Moreover, even in the case of containing a component which satisfies (2) above, the case of at least containing one corresponding to a polymer having (a1) a constitutional unit containing a group in which an acid group is protected by an acid-decomposable group and (a2) a constitutional unit containing a crosslinkable group is considered as corresponding to the case of containing a component which satisfies (1) above.

Component A is preferably an addition polymerization-type resin, and more preferably a polymer containing a constitutional unit derived from (meth)acrylic acid and/or an ester thereof, or a constitutional unit derived from hydroxystyrene and/or an ester thereof. The polymer may have a constitutional unit other than the above-described units, for example, a constitutional unit derived from styrene, or a constitutional unit derived from a vinyl compound.

In the present specification, the "constitutional unit derived from (meth)acrylic acid and/or an ester thereof" is also referred to as an "acrylic constitutional unit." Furthermore, "(meth)acrylic acid" is meant to refer to "methacrylic acid and/or acrylic acid".

<Constitutional Unit (a1)>

Component A includes a polymer having at least (a1) a constitutional unit containing a group in which an acid group is protected by an acid-decomposable group. When Component A includes a polymer having Constitutional Unit (a1), a very sensitive photosensitive resin composition can be obtained.

In the present invention, the "group in which an acid group is protected by an acid-decomposable group" is not particularly limited, and known acid groups and acid-decomposable groups can be used. Preferred specific examples of the acid group include a carboxyl group and a phenolic hydroxyl group. On the other hand, the acid-decomposable group that can be used includes a group that is relatively easy to cleave by an acid (for example, an acetal functional group such as an ester structure of a group represented by Formula (a1-10) described later, a tetrahydropyranyl ester group, or a tetrahydrofuranyl ester group) and a group that is relatively difficult to cleave by an acid (for example, a tertiary alkyl ester group such as a tert-butyl ester group, or a tertiary alkyl carbonate group such as a tert-butyl carbonate group).

(a1) a constitutional unit containing a group in which an acid group is protected by an acid-decomposable group is preferably a constitutional unit containing a protected carboxyl group in which a carboxyl group is protected by an acid-decomposable group (also referred to as "constitutional unit containing a protected carboxyl group protected by an acid-decomposable group"), or a constitutional unit containing a protected phenolic hydroxyl group in which a phenolic hydroxyl group is protected by an acid-decomposable group (also referred to as "constitutional unit containing a protected phenolic hydroxyl protected by an acid-decomposable group").

Hereinafter, (a1-1) a constitutional unit containing a protected carboxyl group protected by an acid-decomposable group and (a1-2) a constitutional unit containing a protected phenolic hydroxyl protected by an acid-decomposable group will be explained respectively in order.

<<(a1-1) Constitutional Unit Containing Protected Carboxyl Group Protected by Acid-Decomposable Group>>

Constitutional Unit (a1-1) containing a protected carboxyl group protected by an acid-decomposable group is a constitutional unit containing a protected carboxyl group in which a carboxyl group of a constitutional unit containing a carboxyl group is protected by the acid-decomposable group explained in detail below.

The constitutional unit containing a carboxyl group that can be used as Constitutional Unit (a1-1) containing a protected carboxyl group protected by an acid-decomposable group is not particularly limited, and known constitutional units can be used. Examples thereof include (a1-1-1) a constitutional unit derived from an unsaturated carboxylic acid containing at least one carboxyl group in the molecule such as unsaturated monocarboxylic acid, unsaturated dicarboxylic acid, or unsaturated tricarboxylic acid, or the like and (a1-1-2) a constitutional unit containing both of a group having an ethylenically unsaturated bond and a structure derived from an acid anhydride.

Hereinafter, Constitutional Unit (a1-1-1) derived from an unsaturated carboxylic acid containing at least one carboxyl group in the molecule or the like and Constitutional Unit (a1-1-2) containing both of a group having an ethylenically unsaturated bond and a structure derived from an acid anhydride, used as the constitutional unit containing a carboxyl group, will be respectively explained in order.

<<<(a1-1-1) Constitutional Unit Derived from Unsaturated Carboxylic Acid Containing at Least One Carboxyl Group in Molecule or the Like>>>

The unsaturated carboxylic acids used in the present invention for Constitutional Unit (a1-1-1) derived from an unsaturated carboxylic acid containing at least one carboxyl group in the molecule or the like includes the followings. That is, examples of the unsaturated monocarboxylic acid include acrylic acid, methacrylic acid, crotonic acid, α-chloroacrylic acid, cinnamic acid, 2-(meth)acryloyloxyethyl succinic acid, 2-(meth)acryloyloxyethyl hexahydrophthalic acid, and 2-(meth)acryloyloxyethyl phthalic acid. Examples of the unsaturated dicarboxylic acid include maleic acid, fumaric acid, itaconic acid, citraconic acid, and mesaconic acid. The unsaturated polycarboxylic acid used to obtain the constitutional unit containing a carboxyl group may be an acid anhydride thereof. Specific examples thereof include a maleic anhydride, an itaconic anhydride, and a citraconic anhydride. Unsaturated polycarboxylic acids may also be mono(2-methacryloyloxyalkyl)esters of polycarboxylic acids such as mono(2-acryloyl oxyethyl)succinate, mono(2-methacryloyloxyethyl)succinate, mono(2-acryloyloxyethyl) phthalate, mono(2-methacryloyloxyethyl)phthalate, and the like. Further, unsaturated polycarboxylic acids may also be mono(meth)acrylates of dicarboxy terminated polymers thereof such as ω-carboxypolycaprolactone monoacrylate, ω-carboxypolycaprolactone monomethacrylate, and the like. Still further examples of the unsaturated carboxylic acid that can be used include 2-carboxyethyl acrylate ester, 2-carboxyethyl methacrylate ester, monoalkyl maleate ester, monoalkyl fumarate ester, and 4-carboxystyrene.

Among others, from the viewpoint of developability, acrylic acid, methacrylic acid, 2-(meth)acryloyloxyethyl succinic acid, 2-(meth)acryloyloxyethyl hexahydrophthalic acid, 2-(meth)acryloyloxyethyl phthalic acid or an unsaturated polycarboxylic anhydride, or the like is preferably used to form Constitutional Unit (a1-1-1) derived from an unsaturated carboxylic acid containing at least one carboxyl group in the molecule or the like, and acrylic acid, methacrylic acid, or 2-(meth)acryloyloxyethyl hexahydrophthalic acid is more preferably used to form such a constitutional unit.

Constitutional Unit (a1-1-1) derived from an unsaturated carboxylic acid containing at least one carboxyl group in the molecule or the like may consist of a single unit or two or more different units.

<<<(a1-1-2) Constitutional Unit Containing Both of Group Having Ethylenically Unsaturated Bond and Structure Derived from Acid Anhydride>>>

Constitutional Unit (a1-1-2) containing both of a group having an ethylenically unsaturated bond and a structure derived from an acid anhydride is preferably a unit derived from a monomer obtained by reacting a hydroxyl group present in a constitutional unit containing a group having an ethylenically unsaturated bond with an acid anhydride.

Examples of the acid anhydride that can be used include known ones, specifically a dibasic acid anhydride such as a maleic anhydride, a succinic anhydride, an itaconic anhydride, a phthalic anhydride, a tetrahydrophthalic anhydride, a hexahydrophthalic anhydride, or a chlorendic anhydride; as well as an acid anhydride such as a trimellitic anhydride, a pyromellitic anhydride, a benzophenone tetracarboxylic anhydride, or a biphenyl tetracarboxylic anhydride. Among them, a phthalic anhydride, a tetrahydrophthalic anhydride, or a succinic anhydride is preferred from the viewpoint of developability.

The proportion of the acid anhydride to be reacted with the hydroxyl group is preferably 10 mol % to 100 mol %, and more preferably 30 mol % to 100 mol % from the viewpoint of developability.

—Acid-Decomposable Group that can be Used in Constitutional Unit (a1-1)—

The acid-decomposable group that can be used in Constitutional Unit (a1-1) containing a protected carboxyl group protected by an acid-decomposable group includes the acid-decomposable groups described above.

Among these acid-decomposable groups, preferred are those in which the carboxyl group is a protected carboxyl group protected in the form of an acetal, from the viewpoints of fundamental properties of the photosensitive resin composition, especially sensitivity and pattern shape, the ease of forming contact holes, and storage stability of the photosensitive resin composition. Among the acid-decomposable groups, more preferred are those in which the carboxyl group is a protected carboxyl group protected in the form of an acetal represented by Formula (a1-10) below, from the viewpoint of sensitivity. It should be noted that in the case where the carboxyl group is a protected carboxyl group protected in the form of an acetal represented by Formula (a1-10) below, the protected carboxyl group as a whole has the structure —(C=O)—O—$CR^{101}R^{102}(OR^{103})$.

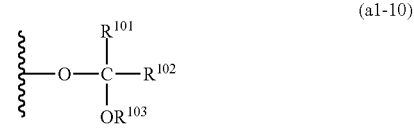

(a1-10)

(In Formula (a1-10), each of $R^{101}$ and $R^{102}$ independently represents a hydrogen atom, an alkyl group, or an aryl group, provided that both of $R^{101}$ and $R^{102}$ do not represent a hydrogen atom; $R^{103}$ represents an alkyl group or an aryl group; and $R^{101}$ or $R^{102}$ may be taken together with $R^{103}$ to form a cyclic ether.)

In Formula (a1-10) above, each of $R^{101}$ and $R^{102}$ independently represents a hydrogen atom, an alkyl group, or an aryl group, and $R^{103}$ represents an alkyl group or an aryl group, in which the alkyl group may be linear, branched or cyclic. However, both of $R^{101}$ and $R^{102}$ do not represent a hydrogen atom, and at least one of $R^{101}$ or $R^{102}$ represents an alkyl group.

In the case where $R^{101}$, $R^{102}$ and $R^{103}$ represent an alkyl group in Formula (a1-10) above, the alkyl group may be linear, branched or cyclic.

The linear or branched alkyl group preferably contains 1 to 12 carbon atoms, more preferably 1 to 6 carbon atoms, and still more preferably 1 to 4 carbon atoms. Specific examples thereof include a methyl group, an ethyl group, an n-propyl group, an i-propyl group, an n-butyl group, an i-butyl group, a sec-butyl group, a tert-butyl group, an n-pentyl group, a neopentyl group, an n-hexyl group, a thexyl (2,3-dimethyl-2-butyl) group, an n-heptyl group, an n-octyl group, a 2-ethylhexyl group, an n-nonyl group, and an n-decyl group.

The cyclic alkyl group preferably contains 3 to 12 carbon atoms, more preferably 4 to 8 carbon atoms, and still more preferably 4 to 6 carbon atoms. Examples of the cyclic alkyl group include a cyclopropyl group, a cyclobutyl group, a cyclopentyl group, a cyclohexyl group, a cycloheptyl group, a cyclooctyl group, a norbornyl group, and an isobornyl group.

The alkyl group may have a substituent, and examples of the substituent include a halogen atom, an aryl group, and an alkoxy group. In the case where the alkyl group has a halogen atom as the substituent $R^{101}$, $R^{102}$, and $R^{103}$ represent a haloalkyl group, or in the case where the alkyl group has an aryl group as the substituent $R^{101}$, $R^{102}$, and $R^{103}$ represent an aralkyl group.

Examples of the halogen atom include a fluorine atom, a chlorine atom, a bromine atom, and an iodine atom, among which a fluorine atom or a chlorine atom is preferred.

Further, the aryl group is preferably an aryl group containing 6 to 20 carbon atoms, more preferably an aryl group containing 6 to 12 carbon atoms, examples of which specifically include a phenyl group, an α-methylphenyl group, a naphthyl group, and the like, and examples of aryl-substituted alkyl groups, that is, aralkyl groups include a benzyl group, an α-methylbenzyl group, a phenethyl group, and a naphthylmethyl group.

The alkoxy group is preferably an alkoxy group containing 1 to 6 carbon atoms, more preferably an alkoxy group containing 1 to 4 carbon atoms, and still more preferably a methoxy group or an ethoxy group.

In the case where the alkyl group is a cycloalkyl group, the cycloalkyl group may have a linear or branched alkyl group containing 1 to 10 carbon atoms as the substituent, or in the case where the alkyl group is a linear or branched alkyl group, the linear or branched alkyl group may have a cycloalkyl group containing 3 to 12 carbon atoms as the substituent.

These substituents may be further substituted by the substituents described above.

In the case where $R^{101}$, $R^{102}$, and $R^{103}$ represent an aryl group in Formula (a1-10) above, the aryl group preferably contains 6 to 12 carbon atoms, and more preferably 6 to 10 carbon atoms. The aryl group may have a substituent, and examples of the substituent preferably include alkyl groups containing 1 to 6 carbon atoms. Examples of the aryl group include a phenyl group, a tolyl group, a xylyl group, a cumenyl group, and a 1-naphthyl group.

Alternatively, $R^{101}$, $R^{102}$, and $R^{103}$ can be taken together with the carbon atom to which they are attached to form a ring. Examples of the ring structure formed by $R^{101}$ and $R^{102}$, $R^{101}$ and $R^{103}$, or $R^{102}$ and $R^{103}$ taken together include a cyclobutyl group, a cyclopentyl group, a cyclohexyl group, a cycloheptyl group, a tetrahydrofuranyl group, an adamantyl group, and a tetrahydropyranyl group.

In Formula (a1-10) above, any one of $R^{101}$ and $R^{102}$ is preferably a hydrogen atom or a methyl group.

Radically polymerizable monomers used for forming the constitutional unit containing a protected carboxyl group represented by Formula (a1-10) above may be commercially available or may be synthesized by a known method. For example, those radically polymerizable monomers can be synthesized by the synthesis method described in paragraphs "0037" to "0040" of JP2011-221494A or the like.

A first preferred embodiment of Constitutional Unit (a1-1) containing a protected carboxyl group protected by an acid-decomposable group is a constitutional unit represented by the formula shown below.

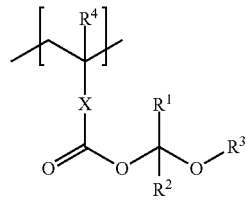

(In the formula, each of $R^1$ and $R^2$ independently represents a hydrogen atom, an alkyl group, or an aryl group, and at least one of $R^1$ or $R^2$ represents an alkyl group or an aryl group, $R^3$ represents an alkyl group or an aryl group, or $R^1$ or $R^2$ may be taken together with $R^3$ to form a cyclic ether, $R^4$ represents a hydrogen atom or a methyl group, and X represents a single bond or an arylene group.)

In the case where $R^1$ and $R^2$ represent an alkyl group, it is preferably an alkyl group containing 1 to 10 carbon atoms. In the case where $R^1$ and $R^2$ represent an aryl group, it is preferably a phenyl group. Preferably, each of $R^1$ and $R^2$ independently represents a hydrogen atom or an alkyl group containing 1 to 4 carbon atoms.

$R^3$ represents an alkyl group or an aryl group, preferably an alkyl group containing 1 to 10 carbon atoms, and more preferably an alkyl group containing 1 to 6 carbon atoms.

X represents a single bond or an arylene group, preferably a single bond.

A second preferred embodiment of Constitutional Unit (a1-1) containing a protected carboxyl group protected by an acid-decomposable group is a constitutional unit represented by the formula shown below.

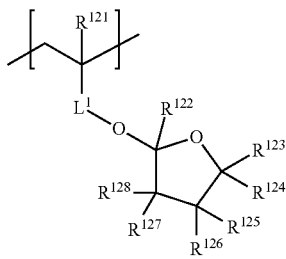

(In the formula, $R^{121}$ represents a hydrogen atom or an alkyl group containing 1 to 4 carbon atoms, $L^1$ represents a carbonyl group or a phenylenecarbonyl group, and each of $R^{122}$ to $R^{128}$ independently represents a hydrogen atom or an alkyl group containing 1 to 4 carbon atoms.)

Preferably, $R^{121}$ represents a hydrogen atom or a methyl group.

Preferably, $L^1$ represents a carbonyl group.

Preferably, $R^{122}$ to $R^{128}$ represent a hydrogen atom.

Preferred specific examples of Constitutional Unit (a1-1) containing a protected carboxyl group protected by an acid-decomposable group include the following constitutional units in which R represents a hydrogen atom or a methyl group.

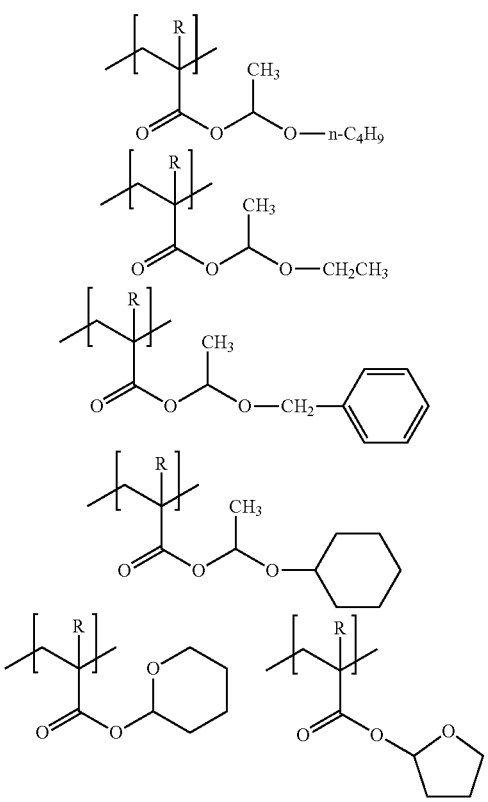

<<(a1-2) Constitutional Unit Containing Protected Phenolic Hydroxyl Group Protected by Acid-Decomposable Group>>

Constitutional Unit (a1-2) containing a protected phenolic hydroxyl group protected by an acid-decomposable group is a constitutional unit in which the constitutional unit containing a phenolic hydroxyl group has a protected phenolic hydroxyl group protected by an acid-decomposable group explained in detail below.

<<<(a1-2-1) Constitutional Unit Containing Phenolic Hydroxyl Group>>>

Examples of the constitutional unit containing a phenolic hydroxyl group include a hydroxystyrenic constitutional unit and a constitutional unit in a novolac resin, among which preferred is a constitutional unit derived from hydroxystyrene or α-methylhydroxystyrene from the viewpoint of sensitivity. Further, the constitutional unit containing a phenolic hydroxyl group is also preferably a constitutional unit represented by Formula (a1-20) below to improve sensitivity.

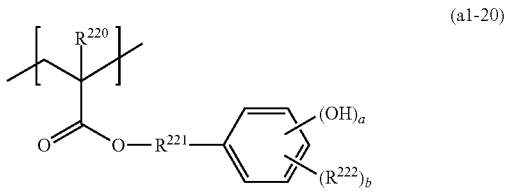

(a1-20)

(In Formula (a1-20), $R^{220}$ represents a hydrogen atom or a methyl group, $R^{221}$ represents a single bond or a divalent linking group, $R^{222}$ represents a halogen atom or a linear or branched alkyl group containing 1 to 5 carbon atoms, a represents an integer of 1 to 5, and b represents an integer of 0 to 4, provided that a+b is 5 or less. In the case where two or more $R^{222}$'s are present, these $R^{222}$'s may be the same or different.)

In Formula (a1-20), $R^{220}$ represents a hydrogen atom or a methyl group, preferably a methyl group.

$R^{221}$ represents a single bond or a divalent linking group. $R^{221}$ is preferably a single bond because sensitivity can be improved and the transparency of cured films can also be improved. Examples of the divalent linking group for $R^{221}$ include an alkylene group, preferably an alkylene group having 1 to 12 carbon atoms, more preferably an alkylene group having 1 to 8 carbon atoms, and still more preferably an alkylene group having 1 to 3 carbon atoms. Specific examples of the alkylene group for $R^{221}$ include a methylene group, an ethylene group, a propylene group, an isopropylene group, an n-butylene group, an isobutylene group, a tert-butylene group, a pentylene group, an isopentylene group, a neopentylene group, and a hexylene group. Among others, $R^{221}$ is preferably a single bond, a methylene group, an ethylene group, a 1,2-propylene group, 1,3-propylene group, or a 2-hydroxy-1,3-propylene group. Further, the divalent linking group may have a substituent, and examples of the substituent include a halogen atom, a hydroxyl group, and an alkoxy group. Further, a represents an integer of 1 to 5. From the viewpoint of the effect of the present invention and easy production, a is preferably 1 or 2, and more preferably 1.

The hydroxyl group is preferably attached to the benzene ring at the 4-position with respect to the carbon atom (the 1-position) attached to $R^{221}$.

$R^{222}$ each independently represents a halogen atom or a linear or branched alkyl group containing 1 to 5 carbon atoms. Specific examples thereof include a fluorine atom, a chlorine atom, a bromine atom, a methyl group, an ethyl group, a propyl group, an isopropyl group, an n-butyl group, an isobutyl group, a tert-butyl group, a pentyl group, an isopentyl group, and a neopentyl group. Among others, a chlorine atom, a bromine atom, a methyl group, or an ethyl group is preferred from the viewpoint of easy manufacturability.

Further, b represents 0 or an integer of 1 to 4.

—Acid-Decomposable Group that can be Used in Constitutional Unit (a1-2)—

The acid-decomposable group that can be used in Constitutional Unit (a1-2) containing a protected phenolic hydroxyl group protected by an acid-decomposable group is not particularly limited, and examples thereof include known ones similarly to the acid-decomposable groups that can be used in Constitutional Unit (a1-1) containing a protected carboxyl group protected by an acid-decomposable group. Among the acid-decomposable groups, preferred are those providing a constitutional unit containing a protected phenolic hydroxyl group protected as an acetal, from the viewpoints of fundamental properties of the photosensitive resin composition, especially sensitivity and pattern shape, storage stability of the photosensitive resin composition, and the ease of forming contact holes. Among the acid-decomposable groups, more preferred are those in which the phenolic hydroxyl group is a protected phenolic hydroxyl group protected in the form of an acetal represented by Formula (a1-10) above, from the viewpoint of sensitivity. It should be noted that in the case where the phenolic hydroxyl group is a protected phenolic hydroxyl group protected in the form of an acetal represented by Formula (a1-10) above, the protected phenolic hydroxyl group as a whole has the structure —Ar—O—CR$^{101}$R$^{102}$(OR$^{103}$) in which Ar represents an arylene group.

A preferred examples of an acetal ester structure of the phenolic hydroxyl group include a combination of R$^{101}$=hydrogen atom and R$^{102}$=R$^{103}$=methyl group, a combination of R$^{101}$=hydrogen atom, R$^{102}$=methyl group, and R$^{103}$=benzyl group, and a combination of R$^{101}$=hydrogen atom, R$^{102}$=methyl group, and R$^{103}$=ethyl group.

Examples of the radically polymerizable monomer used for forming the constitutional unit containing a protected phenolic hydroxyl group in which the phenolic hydroxyl group is protected in the form of an acetal include those described in paragraph "0042" of JP2011-215590A and the like.

Among them, a 1-alkoxyalkyl-protected product of 4-hydroxyphenyl methacrylate and a tetrahydropyranyl-protected product of 4-hydroxyphenyl methacrylate are preferred from the viewpoint of transparency.

Specific examples of the acetal protecting group of the phenolic hydroxyl group include 1-alkoxyalkyl groups such as a 1-ethoxyethyl group, a 1-methoxyethyl group, a 1-n-butoxyethyl group, a 1-isobutoxyethyl group, a 1-(2-chloroethoxy)ethyl group, a 1-(2-ethylhexyloxy)ethyl group, a 1-n-propoxyethyl group, a 1-cyclohexyloxyethyl group, a 1-(2-cyclohexylethoxy)ethyl group, and a 1-benzyloxyethyl group. These may be used alone or in combination of two or more thereof.

The radically polymerizable monomer used for forming Constitutional Unit (a1-2) containing a protected phenolic hydroxyl group protected by an acid-decomposable group may be commercially available or may be synthesized by a known method. For example, such a radically polymerizable monomer can be synthesized by reacting a compound containing a phenolic hydroxyl group with vinyl ether in the presence of an acid catalyst. Alternatively, such a radically polymerizable monomer may be synthesized by copolymerizing a monomer containing a phenolic hydroxyl group with another monomer in advance, and then reacting the resulting copolymer with vinyl ether in the presence of an acid catalyst.

Preferred specific examples of Constitutional Unit (a1-2) containing a protected phenolic hydroxyl group protected by an acid-decomposable group include the following constitutional units, but the present invention is not limited thereto. In the following specific examples, R represents a hydrogen atom or a methyl group.

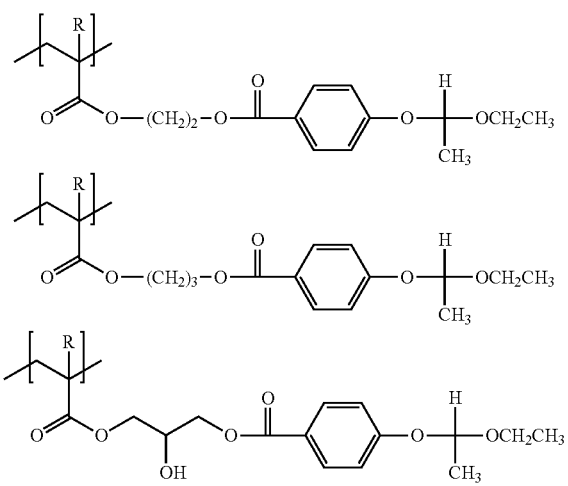

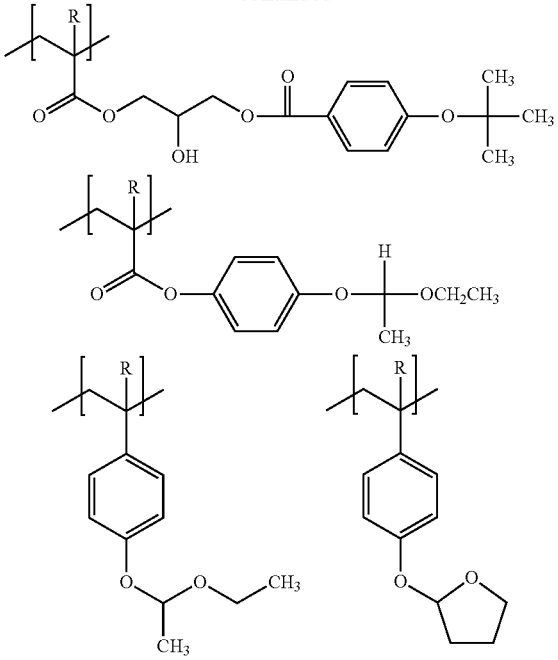

—Preferred Embodiment of Constitutional Unit (a1)—

In the case where a polymer having Constitutional Unit (a1) is substantially free from Constitutional Unit (a2), Constitutional Unit (a1) is preferably present at 20 mol % to 100 mol % and more preferably 30 mol % to 90 mol % in the polymer having Constitutional Unit (a1).

In the case where a polymer having Constitutional Unit (a1) includes Constitutional Unit (a2) below, single Constitutional Unit (a1) is preferably present at 3 mol % to 70 mol % and more preferably 10 mol % to 60 mol % in the polymer including Constitutional Unit (a1) and Constitutional Unit (a2), from the viewpoint of sensitivity. Especially in the case where Constitutional Unit (a1) is a constitutional unit containing a protected carboxyl group in which the carboxyl group is protected in the form of an acetal, it is preferably present at 20 mol % to 50 mol %.

In the present invention, in the case of defining the content of the "constitutional unit" in terms of molar ratio, the "constitutional unit" is assumed to be synonymous with the "monomeric unit". In addition, the "monomeric unit" in the present invention may be modified after polymerization by polymer reaction or the like. The same applies hereinafter.

Constitutional Unit (a1-1) containing a protected carboxyl group protected by an acid-decomposable group is characterized in that it is more rapidly developed as compared with Constitutional Unit (a1-2) containing a protected phenolic hydroxyl group protected by an acid-decomposable group. Therefore, in the case where rapid development is desired, Constitutional Unit (a1-1) containing a protected carboxyl group protected by an acid-decomposable group is preferred. Conversely, in the case where slow development is desired, Constitutional Unit (a1-2) containing a protected phenolic hydroxyl group protected by an acid-decomposable group is preferably used.

<(a2) Constitutional Unit Containing Crosslinkable Group>

Component A may contain a polymer having (a2) a constitutional unit containing a crosslinkable group. The crosslinkable group is not particularly limited as long as it is a group that undergoes a curing reaction by heating. An embodiment of the constitutional unit containing a crosslinkable group is preferably a constitutional unit containing at least one selected from the group consisting of an epoxy group, an oxetanyl group, a group represented by —NH—CH$_2$—O—R (in which R represents a hydrogen atom or an alkyl group containing 1 to 20 carbon atoms), a blocked cyanate group, and a group having an ethylenically unsaturated bond, and more preferably a constitutional unit containing at least one selected from the group consisting of an epoxy group, an oxetanyl group, and a group represented by —NH—CH$_2$—O—R (in which R represents a hydrogen atom or an alkyl group containing 1 to 20 carbon atoms). Especially, Component A in the photosensitive resin composition of the present invention more preferably includes a constitutional unit containing at least one of an epoxy group or an oxetanyl group. More specifically, it includes the following.

<<(a2-1) Constitutional Unit Containing Epoxy Group and/or Oxetanyl Group>>

Component A preferably contains a polymer having a constitutional unit containing an epoxy group and/or an oxetanyl group (Constitutional Unit (a2-1)). A 3-membered cyclic ether group is also referred to as an epoxy group, and a 4-membered cyclic ether group is also referred to as an oxetanyl group.

Constitutional Unit (a2-1) containing an epoxy group and/or an oxetanyl group may contain at least one of epoxy group or oxetanyl group in one constitutional unit, specifically one or more epoxy groups and one or more oxetanyl groups, or two or more epoxy groups, or two or more oxetanyl groups, preferably, but not particularly limited to, a total of one to three epoxy groups and/or oxetanyl groups, more preferably a total of one or two epoxy groups and/or oxetanyl groups, and still more preferably one epoxy group or oxetanyl group.

Specific examples of the radically polymerizable monomer used to form the constitutional unit containing an epoxy group include glycidyl acrylate, glycidyl methacrylate, α-ethylglycidyl acrylate, α-n-propylglycidyl acrylate, α-n-butylglycidyl acrylate, 3,4-epoxybutyl acrylate, 3,4-epoxybutyl methacrylate, 3,4-epoxycyclohexylmethyl acrylate, 3,4-epoxycyclohexylmethyl methacrylate, α-ethyl-3,4-epoxycyclohexylmethyl acrylate, o-vinylbenzyl glycidyl ether, m-vinylbenzyl glycidyl ether, p-vinylbenzyl glycidyl ether, the compounds containing an alicyclic epoxy skeleton described in paragraphs "0031" to "0035" of JP 4168443B and the like, the contents of which are incorporated herein by reference.

Specific examples of the radically polymerizable monomer used to form the constitutional unit containing an oxetanyl group include the (meth)acrylic acid esters containing an oxetanyl group described in paragraphs "0011" to "0016" of JP2001-330953A and the like, the contents of which are incorporated herein by reference.

Specific examples of the radically polymerizable monomer used to form Constitutional Unit (a2-1) containing an epoxy group and/or an oxetanyl group preferably include a monomer containing a methacrylate ester structure and a monomer containing an acrylate ester structure.

Among them, preferred are glycidyl methacrylate, 3,4-epoxycyclohexylmethyl acrylate, 3,4-epoxycyclohexylmethyl methacrylate, (3-ethyloxetan-3-yl)methyl acrylate, and (3-ethyloxetan-3-yl)methyl methacrylate. These constitutional units may be used alone or in combination of two or more thereof.

Preferred specific examples of Constitutional Unit (a2-1) containing an epoxy group and/or an oxetanyl group include the following constitutional units in which R represents a hydrogen atom or a methyl group.

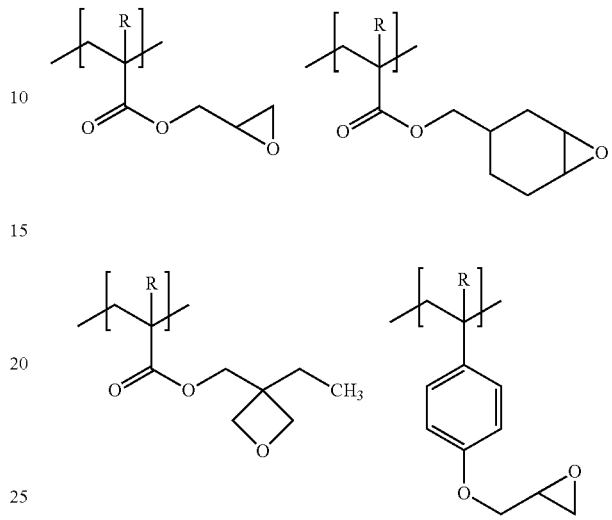

<<(a2-2) Constitutional Unit Having Group Containing Ethylenically Unsaturated Bond>>

One example of (a2) a constitutional unit containing a crosslinkable group is (a2-2) a constitutional unit having a group containing an ethylenically unsaturated bond (hereinafter also referred to as "Constitutional Unit (a2-2)"). Constitutional Unit (a2-2) having a group containing an ethylenically unsaturated bond is preferably a constitutional unit having a group containing an ethylenically unsaturated bond in the side chain, and more preferably a constitutional unit having a group containing an ethylenically unsaturated bond at the terminal and having a side chain containing 3 to 16 carbon atoms.

Description about other Constitutional Units (a2-2) having a group containing an ethylenically unsaturated bond can be found in paragraphs "0072" to "0090" of JP2011-215580A and paragraphs "0013" to "0031" of JP2008-256974A, the contents of which are incorporated herein by reference.

<<(a2-3) Constitutional Unit Containing Group Represented by —NH—CH$_2$—O—R (R Represents Hydrogen Atom or Alkyl Group Containing 1 to 20 Carbon Atoms)>>

The copolymer used in the present invention is also preferably (a2-3) a constitutional unit containing a group represented by —NH—CH$_2$—O—R (R represents a hydrogen atom or an alkyl group containing 1 to 20 carbon atoms). When Constitutional Unit (a2-3) is contained, a curing reaction can be induced by mild heating so that a cured film having various excellent properties can be obtained. Here, R is preferably an alkyl group containing 1 to 20 carbon atoms, more preferably an alkyl group containing 1 to 9 carbon atoms, and still more preferably an alkyl group containing 1 to 4 carbon atoms. Further, the alkyl group may be a linear, branched or cyclic alkyl group, but it is preferably a linear or branched alkyl group. Constitutional Unit (a2) is more preferably a constitutional unit containing a group represented by Formula (a2-30) below.

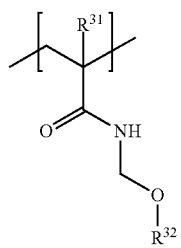

(a2-30)

(In Formula (a2-30), $R^{31}$ represents a hydrogen atom or a methyl group, and $R^{32}$ represents an alkyl group containing 1 to 20 carbon atoms.)

$R^{32}$ is preferably an alkyl group containing 1 to 9 carbon atoms and more preferably an alkyl group containing 1 to 4 carbon atoms. Further, the alkyl group may be a linear, branched or cyclic alkyl group, but it is preferably a linear or branched alkyl group.

Specific examples of $R^{32}$ include a methyl group, an ethyl group, an n-butyl group, an i-butyl group, a cyclohexyl group, and an n-hexyl group. Among them, preferred are an i-butyl group, an n-butyl group, and a methyl group.

<<Preferred Embodiment of Constitutional Unit (a2)>>

In the case where a polymer having Constitutional Unit (a2) is substantially free from Constitutional Unit (a1), Constitutional Unit (a2) is preferably present at 5 mol % to 90 mol % and more preferably 20 mol % to 80 mol % in the polymer having Constitutional Unit (a2).

In the case where a polymer having Constitutional Unit (a2) includes Constitutional Unit (a1), the content of Constitutional Unit (a2) is preferably 3 mol % to 70 mol % and more preferably 10 mol % to 60 mol % in the polymer having Constitutional Unit (a1) and Constitutional Unit (a2) in view of chemical resistance.

In the present invention, any embodiment preferably contains Constitutional Unit (a2) in an amount of 3 mol % to 70 mol % and more preferably 10 mol % to 60 mol %, based on the total constitutional units of Component A.

When the content of Constitutional Unit (a2) is within the above numerical range, a cured film obtained from the photosensitive resin composition has improved transparency and chemical resistance.

<(a3) Additional Constitutional Unit>

In the present invention, Component A may contain Additional Constitutional Unit (a3) other than Constitutional Units (a1) and/or (a2) in addition to these units. Polymer Components (1) and/or (2) may include such additional constitutional units. Alternatively, a polymer component substantially free from (a1) and (a2) and having Additional Constitutional Unit (a3) may be contained in addition to Polymer Component (1) or (2). When a polymer component substantially free from (a1) and (a2) and having Additional Constitutional Unit (a3) is contained in addition to Polymer Component (1) or (2), such a polymer component is preferably contained in amount of 60 mass % or less, more preferably 40 mass % or less, and still more preferably 20 mass % or less among all of the polymer components.

Monomers forming Additional Constitutional Unit (a3) are not particularly limited, and include, for example, styrenes, (meth)acrylic acid alkyl esters, (meth)acrylic acid cyclic alkyl esters, (meth)acrylic acid aryl esters, unsaturated dicarboxylic acid diesters, unsaturated bicyclic compounds, maleimide compounds, unsaturated aromatic compounds, conjugated diene compounds, unsaturated monocarboxylic acids, unsaturated dicarboxylic acids, unsaturated dicarboxylic anhydrides, and other unsaturated compounds. Further, constitutional units containing an acid group may be contained as described later. The monomers forming Additional Constitutional Unit (a3) may be used alone or in combination of two or more thereof.

Additional Constitutional Unit (a3) specifically includes constitutional units consisting of styrene, methyl styrene, hydroxystyrene, α-methyl styrene, acetoxystyrene, methoxystyrene, ethoxystyrene, chlorostyrene, methyl vinylbenzoate, ethyl vinylbenzoate, 4-hydroxybenzoic acid (3-methacryloyloxypropyl)ester, (meth)acrylic acid, methyl(meth)acrylate, ethyl (meth)acrylate, n-propyl (meth)acrylate, isopropyl (meth)acrylate, 2-hydroxyethyl (meth)acrylate, 2-hydroxypropyl (meth)acrylate, benzyl (meth)acrylate, isobornyl (meth)acrylate, acrylonitrile, and ethylene glycol monoacetoacetate mono(meth)acrylate. In addition, the compounds described in paragraphs "0021" to "0024" of JP2004-264623A are also included.

Further, Additional Constitutional Unit (a3) is preferably styrenes, or a constitutional unit derived from a monomer having an alicyclic skeleton, from the viewpoint of electrical properties. Specifically, examples include styrene, methylstyrene, hydroxystyrene, α-methyl styrene, dicyclopentanyl (meth)acrylate, cyclohexyl(meth)acrylate, isobornyl(meth)acrylate, and benzyl(meth)acrylate.

Furthermore, Additional Constitutional Unit (a3) is preferably a constitutional unit derived from (meth)acrylic acid alkyl esters in view of adhesion. Specific examples thereof include methyl(meth)acrylate, ethyl(meth)acrylate, propyl (meth)acrylate, and n-butyl(meth)acrylate and more preferably methyl(meth)acrylate. Among the constitutional units constituting the polymer, the content of Constitutional Unit (a3) is preferably 60 mol % or less, more preferably 50 mol % or less, and still more preferably 40 mol % or less. The lower limit may be 0 mol %, or for example, preferably 1 mol % or more, or more preferably 5 mol % or more. When the content of Constitutional Unit (a3) is within the above numerical range, various properties of a cured film obtained from the photosensitive resin composition are improved.

The polymer included in Component A preferably has a constitutional unit containing an acid group, as Additional Constitutional Unit (a3). When the polymer contains an acid group, the polymer is more soluble in an alkaline developer so that the developability is improved. The "acid group" in the present invention refers to a proton-dissociating group having a pKa of less than 11. The acid group is typically incorporated into a polymer as a constitutional unit containing the acid group by using a monomer capable of forming the acid group. When the polymer includes a constitutional unit containing such an acid group, it tends to be more soluble in an alkaline developer.

Examples of the acid group used in the present invention include a carboxylic acid group, a sulfonamide group, a phosphonic acid group, a sulfonic acid group, a phenolic hydroxyl group, a sulfonamide group, a sulfonylimide group, and an acid anhydride group of these acid groups, as well as a group having a neutralized salt structure of these acid groups. Preferred are a carboxylic acid group and/or a phenolic hydroxyl group. The salt is not particularly limited, and preferred examples thereof include an alkali metal salt, an alkaline earth metal salt, and an organic ammonium salt.

More preferably, the constitutional unit containing an acid group used in the present invention is a constitutional unit derived from styrene, or a constitutional unit derived from a vinyl compound, or a constitutional unit derived from (meth)acrylic acid and/or an ester thereof. For example, it is possible to use those compounds described in paragraphs "0021" to "0023" and paragraphs "0029" to "0044" of JP2012-88459A, the contents of which are incorporated herein by reference. Among them, preferred is a constitutional unit derived from p-hydroxystyrene, (meth)acrylic acid, maleic acid, or a maleic anhydride.

In the present invention, a polymer substantially free from Polymer Component (a1) and Polymer Component (a2) and containing Additional Constitutional Unit (a3) may be contained in addition to Polymer Component (1) or (2).

Such a polymer is preferably a resin containing a carboxyl group in the side chain. For example, preferred examples thereof include a methacrylic acid copolymer, an acrylic acid copolymer, an itaconic acid copolymer, a crotonic acid copolymer, a maleic acid copolymer, and a partially esterified maleic acid copolymer, as well as an acidic cellulose derivative containing a carboxyl group in the side chain, an adduct of a polymer containing a hydroxyl group with an acid anhydride or the like, and a high molecular-weight polymer containing a (meth)acryloyl group in the side chain, as described in JP1984-44615A (JP-S59-44615A), JP1979-34327B (JP554-34327B), JP1983-12577B (JP-S58-12577B), JP1979-25957B (JP-S54-25957B), JP1984-53836A (JP-S59-53836A), and JP1984-71048A (JP-S59-71048A). The "substantially free from" refers to that the weight ratio in the polymer is 1 mass % or less.

Examples of such a polymer include a benzyl(meth)acrylate/(meth)acrylic acid copolymer; a 2-hydroxyethyl (meth)acrylate/benzyl(meth)acrylate/(meth)acrylic acid copolymer; and the 2-hydroxypropyl(meth)acrylate/polystyrene macromonomer/benzyl methacrylate/methacrylic acid copolymer, 2-hydroxy-3-phenoxypropyl acrylate/polymethyl methacrylate macromonomer/benzyl methacrylate/methacrylic acid copolymer, 2-hydroxyethyl methacrylate/polystyrene macromonomer/methyl methacrylate/methacrylic acid copolymer, and 2-hydroxyethyl methacrylate/polystyrene macromonomer/benzyl methacrylate/methacrylic acid copolymer described in JP1995-140654A (JP-H07-140654A).

Other examples that can be used include the known high molecular-weight compounds described in JP1995-207211A (JP-H07-207211A), JP1996-259876A (JP-H08-259876A), JP1998-300922A (JP-H10-300922A), JP1999-140144A (JP-H11-140144A), JP1999-174224A (JP-H11-174224A), JP2000-56118A, JP2003-233179A, JP2009-52020A, and the like, the contents of which are incorporated herein by reference.

Only one or more than one of these polymers may be contained.

These polymers are also commercially available, such as SMA 1000P, SMA 2000P, SMA 3000P, SMA 1440F, SMA 17352P, SMA 2625P, and SMA 3840F (all manufactured by Sartomer); ARUFON UC-3000, ARUFON UC-3510, ARUFON UC-3900, ARUFON UC-3910, ARUFON UC-3920, and ARUFON UC-3080 (all manufactured by Toagosei Co., Ltd.); and JONCRYL 690, JONCRYL 678, JONCRYL 67, and JONCRYL 586 (all manufactured by BASF).

In the present invention, in particular, a constitutional unit containing a carboxyl group or a constitutional unit containing a phenolic hydroxyl group is preferably contained in view of sensitivity. For example, it is possible to use compounds described in paragraphs "0021" to "0023" and paragraphs "0029" to "0044" of JP2012-88459A, the contents of which are incorporated herein by reference.

The constitutional unit containing an acid group is preferably present at 1 mol % to 80 mol %, more preferably 1 mol % to 50 mol %, still more preferably 5 mol % to 40 mol %, particularly preferably 5 mol % to 30 mol %, and most preferably 5 mol % to 20 mol % of the constitutional units of all of the polymer components.

Preferred embodiments of polymer components of the present invention are shown below, but the present invention is not limited thereto.

First Embodiment

An embodiment in which Polymer Component (1) further includes one or more Additional Constitutional Units (a3).

Second Embodiment

An embodiment in which the polymer having the constitutional unit containing a group in which an acid group is protected by an acid-decomposable group (a1) of Polymer Component (2) further includes one or more Additional Constitutional Units (a3).

Third Embodiment

An embodiment in which the polymer having (a2) a constitutional unit containing a crosslinkable group of Polymer Component (2) further includes one or more Additional Constitutional Units (a3).

Fourth Embodiment

An embodiment according to any one of the first to third embodiments, in which Additional Constitutional Unit (a3) includes a constitutional unit containing at least an acid group in any one polymer.

Fifth Embodiment

An embodiment further including a polymer which is substantially free from Constitutional Unit (a1) and Constitutional Unit (a2) and includes Additional Constitutional Unit (a3) in addition to Polymer Component (1) or (2).

Sixth Embodiment

An embodiment including a combination of two or more of the first to fifth embodiments.

—Molecular Weight of Polymer in Component A—

The molecular weight of the polymer in Component A preferably has a molecular weight in the range of 1,000 to 200,000, and more preferably 2,000 to 50,000 in terms of polystyrene-converted weight average molecular weight. When the molecular weight of the polymer in Component A is in the above numerical range, various properties are improved. The ratio of the number average molecular weight Mn and the weight average molecular weight Mw (polydispersity, Mw/Mn) is preferably 1.0 to 5.0, and more preferably 1.5 to 3.5.

Meanwhile, the weight average molecular weight and number average molecular weight in the present invention is preferably measured by a gel permeation chromatography (GPC) method. The measurement by a gel permeation chromatography method in the present invention is preferably carried out using HLC-8020GPC (manufactured by Tosoh Corporation), TSKgel Super HZ M-H, TSK gel Super HZ4000, TSKgel Super HZ200 (all manufactured by Tosoh Corp., 4.6 mmID×15 cm) as columns, and tetrahydrofuran (THF) as an eluent.

—Method for Preparing Polymer in Component A—

According to one example of various known methods for synthesizing a polymer in Component A, the polymer can be synthesized by polymerizing a radically polymerizable monomer mixture including radically polymerizable monomers used for forming at least Constitutional Unit (a1) and Constitutional Unit (a3) above in an organic solvent using a radical polymerization initiator. Alternatively, the polymer can also be synthesized by a so-called polymer reaction.

The content of Component A in the photosensitive resin composition of the present invention is preferably 30 mass % to 99 mass %, more preferably 40 mass % to 98 mass %, and still more preferably 60 mass % to 95 mass %, based on the solid content other than titanium black in the photosensitive resin composition. When the content of Component A is within the above-specified range, the effect of the present invention is more exerted. As used herein, the term "solid content of the photosensitive resin composition" refers to a component excluding volatile components such as solvents.

F the photosensitive resin composition of the present invention exhibits a large development margin due to containing Component A.

Furthermore, in the case of being applied onto an infrared cut filter (in particular, a glass substrate) to be described later, the content of Component A in the photosensitive resin composition of the present invention is preferably 20 mass % to 99 mass %, more preferably 25 mass % to 98 mass %, and still more preferably 30 mass % to 95 mass % based on the solid content other than titanium black in the photosensitive resin composition. When the content of Component A is within the above-specified range, the effect of the present invention is more exerted.

(Component B) Photoacid Generator

The photosensitive resin composition of the present invention contains (Component B) a photoacid generator. The photoacid generator used in the present invention (also referred to as "Component B") is preferably a compound which generates an acid in response to actinic rays having a wavelength of 300 nm or longer, and preferably a wavelength of 300 nm to 450 nm, but there are no limitations on the chemical structure. Furthermore, even in the case of a photoacid generator which does not directly respond to actinic rays having a wavelength of 300 nm or longer, any compound which generates an acid in response to actinic rays having a wavelength of 300 nm or longer when used together with a sensitizer, may be preferably used in combination with a sensitizer. The photoacid generator used in the present invention is preferably a photoacid generator which generates an acid having a pKa of 4 or lower, more preferably a photoacid generator which generates an acid having a pKa of 3 or lower, and still more preferably a photoacid generator which generates an acid having a pKa of 2 or lower.

Examples of the photoacid generator include trichloromethyl-s-triazines, sulfonium salts or iodonium salts (onium salt), quaternary ammonium salts, diazomethane compounds, imidosulfonate compounds, and oxime sulfonate compounds. Among these, it is preferable to use oxime sulfonate compounds from the viewpoint of having insulating high sensitivity. These photoacid generators may be used alone or in combination of two or more thereof. Specific examples of richloromethyl-s-triazines, diaryl iodonium salts, triaryl sulfonium salts, quaternary ammonium salts, and diazomethane derivatives include compounds described in paragraphs "0083" to "0088" of JP2011-221494A.

The oxime sulfonate compound, that is, a compound having an oxime sulfonate structure is preferably exemplified by a compound containing an oxime sulfonate structure represented by Formula (B1) below, the contents of which are incorporated herein by reference.

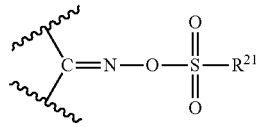

(B1)

(In Formula (B1), $R^{21}$ represents an alkyl group or an aryl group, and the wavy lines indicate a binding site to other groups.)

All of these groups may be substituted, and the alkyl group represented by $R^{21}$ may be linear, branched or cyclic. Acceptable substituents will be explained below.

The alkyl group represented by $R^{21}$ is preferably a linear or branched alkyl group having 1 to 10 carbon atoms. The alkyl group represented by $R^{21}$ may be substituted by an aryl group having 6 to 11 carbon atoms, an alkoxy group having 1 to 10 carbon atoms, or a cycloalkyl group (including a bridged alicyclic group such as 7,7-dimethyl-2-oxonorbornyl group, preferably a bicycloalkyl group).

The aryl group represented by $R^{21}$ is preferably an aryl group having 6 to 11 carbon atoms, and more preferably a phenyl group or a naphthyl group. The aryl group represented by $R^{21}$ may be substituted by an alkyl group having 1 to 10 carbon atoms, an alkoxy group having 1 to 10 carbon atoms, or a halogen atom.

The compound containing an oxime sulfonate structure represented by Formula (B1) above is also preferably an oxime sulfonate compound represented by Formula (B2) below.

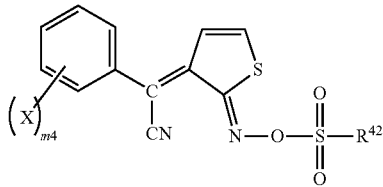

(B2)

(In Formula (B2), $R^{42}$ represents an alkyl group or an aryl group, X represents an alkyl group, an alkoxy group, or a halogen atom, m4 represents an integer of 0 to 3, and when m4 is 2 or 3, a plurality of X's may be the same or different.)

The alkyl group represented by X is preferably a linear or branched alkyl group having 1 to 4 carbon atoms.

The alkoxy group represented by X is preferably a linear or branched alkoxy group having 1 to 4 carbon atoms.

The halogen atom represented by X is preferably a chlorine atom or a fluorine atom.

m4 is preferably 0 or 1. Particularly preferred is a compound in which, in Formula (B2), m4 is 1; X is a methyl group; the substitution position of X is the ortho-position; and $R^{42}$ is a linear alkyl group having 1 to 10 carbon atoms, a 7,7-dimethyl-2-oxonorbornylmethyl group, or a p-toluyl group.

The compound containing an oxime sulfonate structure represented by Formula (B1) above is also preferably an oxime sulfonate compound represented by Formula (B3) below.

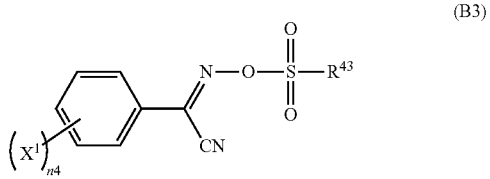

(In Formula (B3), $R^{43}$ represents an alkyl group or an aryl group, $X^1$ represents a halogen atom, a hydroxyl group, an alkyl group having 1 to 4 carbon atoms, an alkoxy group having 1 to 4 carbon atoms, a cyano group, or a nitro group, and n4 represents an integer of 0 to 5.)

$R^{43}$ in Formula (B3) is preferably a methyl group, an ethyl group, an n-propyl group, an n-butyl group, an n-octyl group, a trifluoromethyl group, a pentafluoroethyl group, a perfluoro-n-propyl group, a perfluoro-n-butyl group, a p-tolyl group, a 4-chlorophenyl group, or a pentafluorophenyl group, and particularly preferably an n-octyl group.

$X^1$ is preferably an alkoxy group having 1 to 5 carbon atoms, and more preferably a methoxy group.

n4 is preferably an integer of 0 to 2, particularly preferably 0 or 1.

Specific examples of the compound represented by Formula (B3), and specific examples of the preferred oxime sulfonate compound may be referred to the description of paragraphs "0080" to "0082" of JP2012-163937A, the contents of which are incorporated herein by reference.

The compound containing an oxime sulfonate structure represented by Formula (B1) above is also preferably a compound represented by Formula (OS-1) below.

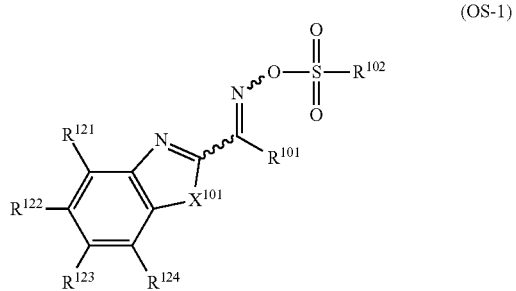

In Formula (OS-1), $R^{101}$ represents a hydrogen atom, an alkyl group, an alkenyl group, an alkoxy group, an alkoxycarbonyl group, an acyl group, a carbamoyl group, a sulfamoyl group, a sulfo group, a cyano group, an aryl group, or a heteroaryl group. $R^{102}$ represents an alkyl group or an aryl group.

$X^{101}$ represents —O—, —S—, —NH—, —NR$^{105}$—, —CH$_2$—, —CR$^{106}$H—, or —CR$^{105}$R$^{107}$—, and R$^{105}$ to R$^{107}$ represent an alkyl group, or an aryl group.

Each of $R^{121}$ to $R^{124}$ independently represents a hydrogen atom, a halogen atom, an alkyl group, an alkenyl group, an alkoxy group, an amino group, an alkoxycarbonyl group, an alkylcarbonyl group, an arylcarbonyl group, an amido group, a sulfo group, a cyano group, or an aryl group. Two of $R^{121}$ to $R^{124}$ may be taken together to form a ring.

Each of $R^{121}$ to $R^{124}$ is independently preferably a hydrogen atom, a halogen atom, or an alkyl group. Also preferred is an embodiment in which at least two of $R^{121}$ to $R^{124}$ taken together form an aryl group. Above all, an embodiment in which all of $R^{121}$ to $R^{124}$ is a hydrogen atom is preferred from the viewpoint of sensitivity.

All of the aforementioned functional groups may further have a substituent.

The compound represented by Formula (OS-1) above is preferably, for example, a compound represented by Formula (OS-2) as described in paragraphs "0087" to "0089" of JP2012-163937A, the contents of which are incorporated herein by reference.

Specific examples of the compound represented by above Formula (OS-1) that can be suitably used in the present invention include compounds described in paragraphs "0128" to "0132" of JP2011-221494A (Exemplary Compounds b-1 to b-34), but the present invention is not limited thereto.

In the present invention, the compound containing an oxime sulfonate structure represented by Formula (B1) above is preferably an oxime sulfonate compound represented by Formula (OS-3) below, Formula (OS-4) below, or Formula (OS-5) below.

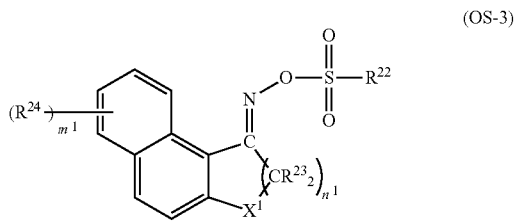

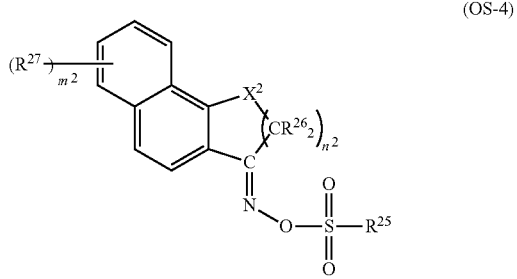

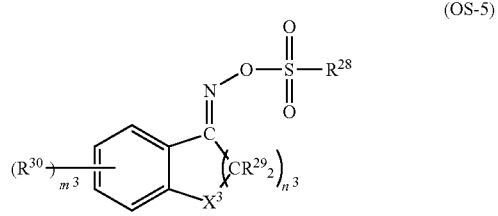

(In Formula (OS-3) to Formula (OS-5), each of $R^{22}$, $R^{25}$, and $R^{28}$ independently represents an alkyl group, an aryl group, or a heteroaryl group, each of $R^{23}$, $R^{26}$, and $R^{29}$ independently represents a hydrogen atom, an alkyl group, an aryl group, or a halogen atom, each of $R^{24}$, $R^{27}$, and $R^{30}$ independently represents a halogen atom, an alkyl group, an alkyloxy group, a sulfonic acid group, an aminosulfonyl group, or an alkoxysulfonyl group, each of $X^1$ to $X^3$ independently represents an oxygen atom or a sulfur atom, each of $n^1$ to $n^3$ independently represents 1 or 2, and each of $m^1$ to $m^3$ independently represents an integer of 0 to 6.)

In addition, the compound containing an oxime sulfonate structure represented by Formula (B1) above is particularly preferably, for example, the compound represented by any one of General Formulae (OS-6) to (OS-11) described in paragraph "0117" of JP2012-163937A, the contents of which are incorporated herein by reference.

The preferred range in General Formulae (OS-6) to (OS-11) is the same as the preferred range of the General Formulae (OS-6) to (OS-11) as described in paragraphs "0110" to "0112" of JP2011-221494A.

Specific examples of the oxime sulfonate compound represented by Formula (OS-3) above to Formula (OS-5) above include the compounds described in paragraphs "0114" to "0120" of JP2011-221494A, but the present invention is not limited thereto.

The compound containing an oxime sulfonate structure represented by Formula (B1) above is also preferably an oxime sulfonate compound represented by Formula (B1-4) below.

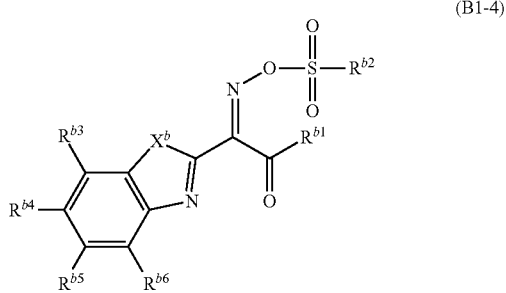

(B1-4)

(In Formula (B1-4), $R^{b1}$ represents an alkyl group or an aryl group, $R^{b2}$ represents an alkyl group, an aryl group, or a heteroaryl group. Each of $R^{b3}$ to $R^{b6}$ represents a hydrogen atom, an alkyl group, an aryl group, or a halogen atom. Alternatively, $R^{b3}$ and $R^{b4}$, $R^{b4}$ and $R^{b5}$, or $R^{b5}$ and $R^{b6}$ may be taken together to form an alicyclic ring or an aromatic ring. $X^b$ represents —O— or —S—.)

$R^{b1}$ represents an alkyl group or an aryl group. The alkyl group is preferably an alkyl group having a branched structure or an alkyl group having a cyclic structure.

Preferably, the alkyl group contains 3 to 10 carbon atoms. Especially, the alkyl group is preferably an alkyl group containing 3 to 6 carbon atoms in the case where it has a branched structure, or the alkyl group is preferably an alkyl group containing 5 to 7 carbon atoms in the case where it has a cyclic structure. Examples of the alkyl group include an propyl group, an isopropyl group, an n-butyl group, an s-butyl group, an isobutyl group, a tert-butyl group, a pentyl group, an isopentyl group, a neopentyl group, a 1,1-dimethylpropyl group, a hexyl group, a 2-ethylhexyl group, a cyclohexyl group, and an octyl group, and preferably an isopropyl group, a tert-butyl group, a neopentyl group, and a cyclohexyl group.

The aryl group preferably contains 6 to 12 carbon atoms, more preferably 6 to 8 carbon atoms, and still more preferably 6 to 7 carbon atoms. Such an aryl group includes a phenyl group and a naphthyl group, and preferably a phenyl group.

The alkyl group and aryl group represented by $R^{b1}$ may have a substituent. Examples of the substituent include a halogen atom (a fluorine atom, a chlorine atom, a bromine atom, or an iodine atom), a linear, branched or cyclic alkyl group (for example, a methyl group, an ethyl group, or a propyl group), an alkenyl group, an alkynyl group, an aryl group, an acyl group, an alkoxycarbonyl group, an aryloxycarbonyl group, a carbamoyl group, a cyano group, a carboxyl group, a hydroxyl group, an alkoxy group, an aryloxy group, an alkylthio group, an arylthio group, a heterocyclyloxy group, an acyloxy group, an amino group, a nitro group, a hydrazino group, and a heterocyclic group. The substituent may be further substituted by these groups. Preferred are a halogen atom and a methyl group.

In the photosensitive resin composition of the present invention, $R^{b1}$ is preferably an alkyl group from the viewpoint of transparency, or $R^{b1}$ is preferably an alkyl group containing 3 to 6 carbon atoms and having a branched structure, an alkyl group containing 5 to 7 carbon atoms and having a cyclic structure, or a phenyl group, and more preferably an alkyl group containing 3 to 6 carbon atoms and having a branched structure, or an alkyl group containing 5 to 7 carbon atoms and having a cyclic structure, from the viewpoint of achieving both storage stability and sensitivity. By employing such a bulky group (especially a bulky alkyl group) for $R^{b1}$, transparency can be further improved.

Among bulky substituents, preferred are an isopropyl group, a tert-butyl group, a neopentyl group, and a cyclohexyl group, and more preferred are a tert-butyl group, and a cyclohexyl group.

$R^{b2}$ represents an alkyl group, an aryl group, or a heteroaryl group. The alkyl group represented by $R^{b2}$ is preferably a linear, branched or cyclic alkyl group containing 1 to 10 carbon atoms. Examples of the alkyl group include a methyl group, an ethyl group, a propyl group, an isopropyl group, an n-butyl group, a tert-butyl group, a pentyl group, a neopentyl group, a hexyl group, and a cyclohexyl group, preferably a methyl group.

The aryl group is preferably an aryl group containing 6 to 10 carbon atoms. Examples of the aryl group include a phenyl group, a naphthyl group, and a p-toluyl (p-methylphenyl), preferably a phenyl group and a p-toluyl group.

Examples of the heteroaryl group include a pyrrole group, an indole group, a carbazole group, a furan group, and a thiophene group.

The alkyl group, aryl group, and heteroaryl group represented by $R^{b2}$ may have a substituent. The substituent is as defined for the substituent by which the alkyl group and aryl group represented by $R^{b1}$ may be substituted.

$R^{b2}$ preferably represents an alkyl group or an aryl group, more preferably an aryl group, and still more preferably a phenyl group. The substituent on the phenyl group is preferably a methyl group.

Each of $R^{b3}$ to $R^{b6}$ independently represents a hydrogen atom, an alkyl group, an aryl group, or a halogen atom (a fluorine atom, a chlorine atom, a bromine atom, or an iodine atom). The alkyl group represented by $R^{b3}$ to $R^{b6}$ has the same definition as the alkyl group represented by $R^{b2}$, and the preferred range thereof is also the same. Further, the aryl group represented by $R^{b3}$ to $R^{b6}$ has the same definition as the aryl group represented by $R^{b1}$, and the preferred range thereof is also the same.

Among $R^{b3}$ to $R^{b6}$, $R^{b3}$ and $R^{b4}$, $R^{b4}$ and $R^{b5}$, or $R^{b5}$ and $R^{b6}$ may be taken together to form a ring, preferably an alicyclic ring or an aromatic ring, and more preferably a benzene ring.

Preferably, $R^{b3}$ to $R^{b6}$ represent a hydrogen atom, an alkyl group, or a halogen atom (a fluorine atom, a chlorine atom, or a bromine atom), or $R^{b3}$ and $R^{b4}$, $R^{b4}$ and $R^{b5}$, or $R^{b5}$ and $R^{b6}$ are taken together to form a benzene ring. More preferably, $R^{b3}$ to $R^{b6}$ represent a hydrogen atom, a methyl group, a fluorine atom, a chlorine atom, or a bromine atom, or $R^{b3}$ and $R^{b4}$, $R^{b4}$, and $R^{b5}$, or $R^{b5}$ and $R^{b6}$ are taken together to form a benzene ring.

Preferred embodiments of $R^{b3}$ to $R^{b6}$ are as follows.

Embodiment 1

At least two represent a hydrogen atom.

Embodiment 2

The total number of alkyl groups, aryl groups, or halogen atoms is one or less.

Embodiment 3

$R^{b3}$ and $R^{b4}$, $R^{b4}$ and $R^{b5}$, or $R^{b5}$ and $R^{b6}$ are taken together to form a benzene ring.

Embodiment 4

An embodiment satisfying the embodiments 1 and 2, and/or an embodiment satisfying the embodiments 1 and 3.

$X^b$ represents —O— or —S—.

Specific examples of Formula (B1-4) above include the compounds shown below, but the present invention is not particularly limited thereto. In the exemplary compounds, Ts represents a tosyl group (p-toluenesulfonyl group), Me represents a methyl group, Bu represents an n-butyl group, and Ph represents a phenyl group.

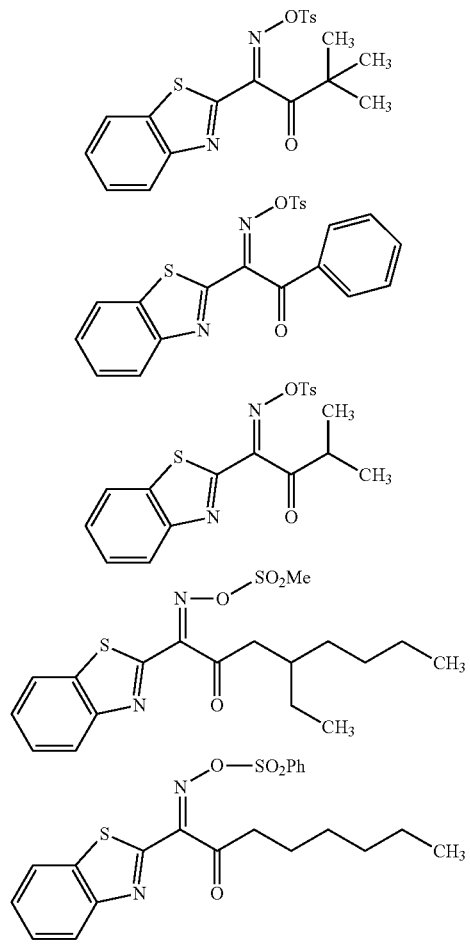

-continued

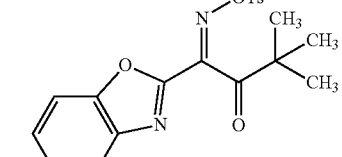

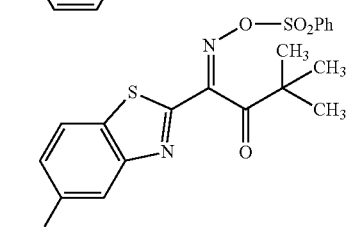

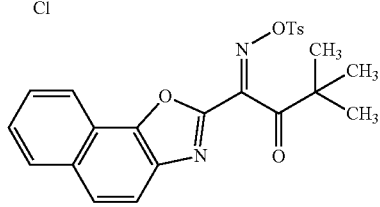

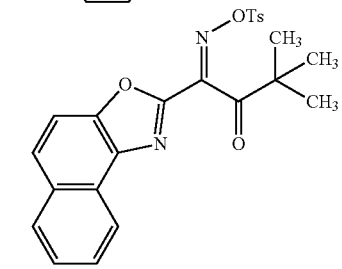

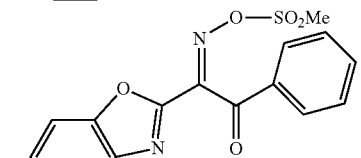

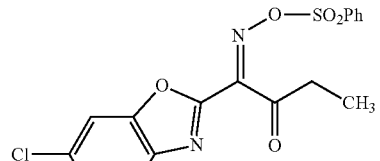

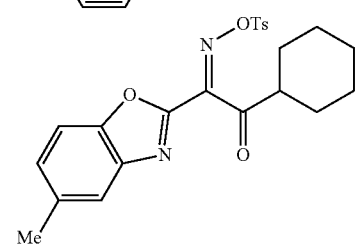

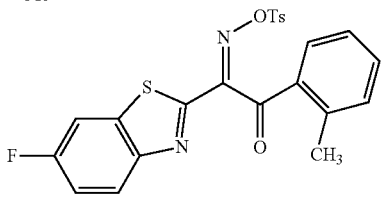

-continued

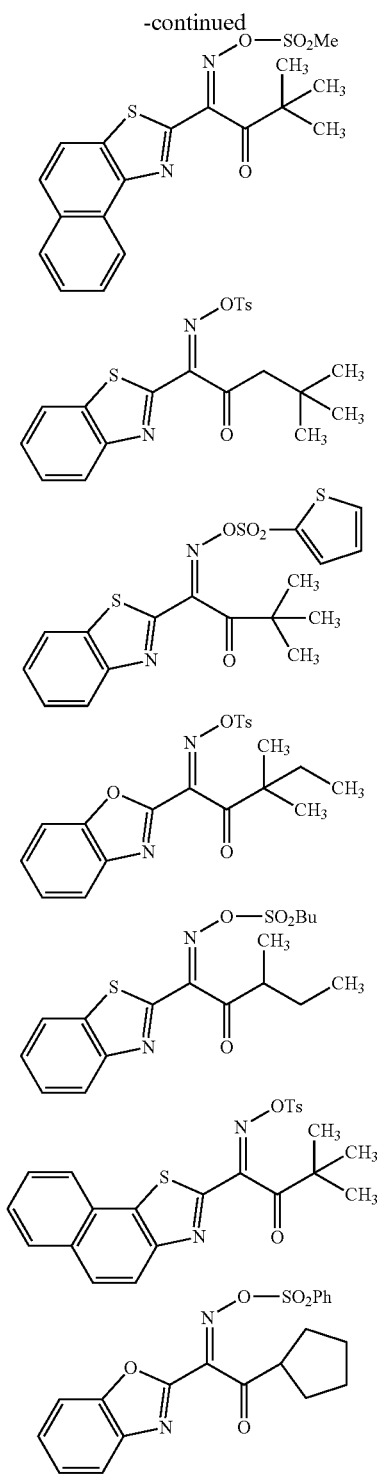

In the photosensitive resin composition of the present invention, (Component B) a photoacid generator is preferably used in an amount of 0.1 parts by mass to 15 parts by mass and more preferably 0.5 parts by mass to 10 parts by mass, based on 100 parts by mass of Component A in the photosensitive resin composition. Component B may be used alone or in combination of two or more thereof.

Further, in the case of being applied onto an infrared cut filter (in particular, a glass substrate), (Component B) a photoacid generator in the photosensitive resin composition of the present invention is preferably used in an amount of 0.1 parts by mass to 30 parts by mass and more preferably 0.5 parts by mass to 20 parts by mass, based on 100 parts by mass of Component A in the photosensitive resin composition.

(Component C) Solvent

The photosensitive resin composition of the present invention contains (Component C) a solvent. The photosensitive resin composition of the present invention is preferably prepared as a solution of essential components and optional components as described later dissolved or dispersed in (Component C) a solvent.

Examples of the solvent that can be used in the photosensitive resin composition of the present invention include known solvents such as ethylene glycol monoalkyl ethers, ethylene glycol dialkyl ethers, ethylene glycol monoalkyl ether acetates, propylene glycol monoalkyl ethers, propylene glycol dialkyl ethers, propylene glycol monoalkyl ether acetates, diethylene glycol dialkyl ethers, diethylene glycol monoalkyl ether acetates, dipropylene glycol monoalkyl ethers, dipropylene glycol dialkyl ethers, dipropylene glycol monoalkyl ether acetates, esters, ketones, amides, and lactones. Further, specific examples of the solvent used in the photosensitive resin composition of the present invention also include the solvents described in paragraphs "0174" to "0178" of JP2011-221494A, and the solvents described in paragraphs "0167" to "0168" of JP2012-194290A, the contents of which are incorporated herein by reference.

In addition to these solvents, other solvents may be added as appropriate, such as benzyl ethyl ether, dihexyl ether, ethylene glycol monophenyl ether acetate, diethylene glycol monomethyl ether, diethylene glycol monoethyl ether, isophorone, caproic acid, caprylic acid, 1-octanol, 1-nonanol, benzyl alcohol, anisole, benzyl acetate, ethyl benzoate, diethyl oxalate, diethyl maleate, ethylene carbonate, and propylene carbonate.

These solvents may be used alone or in admixture of two or more thereof. The solvents that can be used in the present invention are preferably used alone or in combination of two solvents.

Further, Component C is preferably a solvent having a boiling point of 130° C. or higher and lower than 160° C., or a solvent having a boiling point of 160° C. or higher, or a mixture thereof.

Examples of the solvent having a boiling point of 130° C. or higher and lower than 160° C. include propylene glycol monomethyl ether acetate (boiling point of 146° C.), propylene glycol monoethyl ether acetate (boiling point of 158° C.), propylene glycol methyl-n-butyl ether (boiling point of 155° C.), and propylene glycol methyl-n-propyl ether (boiling point of 131° C.).

Examples of the solvent having a boiling point of 160° C. or higher include ethyl 3-ethoxyproionate (boiling point of 170° C.), diethylene glycol methyl ethyl ether (boiling point of 176° C.), propylene glycol monomethyl ether propionate (boiling point of 160° C.), dipropylene glycol methyl ether acetate (boiling point of 213° C.), 3-methoxybutyl ether acetate (boiling point of 171° C.), diethylene glycol diethyl ether (boiling point of 189° C.), diethylene glycol dimethyl ether (boiling point of 162° C.), propylene glycol diacetate (boiling point of 190° C.), diethylene glycol monoethyl ether acetate (boiling point of 220° C.), dipropylene glycol dimethyl ether (boiling point of 175° C.), and 1,3-butylene glycol diacetate (boiling point of 232° C.).

Among them, the solvent is preferably at least one solvent selected from the group consisting of propylene glycol monoalkyl ether acetates, diethylene glycol dialkyl ethers and esters; more preferably propylene glycol monomethyl ether acetate, diethylene glycol methyl ethyl ether and/or ethyl 3-ethoxypropionate; and particularly preferably propylene glycol monomethyl ether acetate, diethylene glycol methyl ethyl ether and ethyl 3-ethoxypropionate.

The content of (Component C) a solvent in the photosensitive resin composition of the present invention is preferably 10 mass % to 95 mass %, more preferably 50 mass % to 95 mass %, and still more preferably 60 mass % to 90 mass % in the photosensitive resin composition.

(Component D) Compound Containing Crosslinkable Group and Having Molecular Weight in Range of 100 to 2,000

The photosensitive resin composition of the present invention preferably contains a compound containing a crosslinkable group and having a molecular weight in the range of 100 to 2,000 (hereinafter, simply also referred to as "crosslinking agent"). When a crosslinking agent is added, a stronger cured film can be obtained from the photosensitive resin composition of the present invention. In addition, Component D is preferably a compound which does not contain the above-mentioned acid-decomposable group.

The crosslinking agent is not limited as long as it induces a crosslinking reaction by heat (except for Component A). That is, a thermal crosslinking agent is preferably used as the crosslinking agent. For example, the compound described below can be added, such as a compound containing two or more epoxy groups or oxetanyl groups in the molecule, an alkoxymethyl group-containing crosslinking agent, a compound containing at least one ethylenically unsaturated bond, a blocked isocyanate compound, or an alkoxysilane compound. Among them, preferred is a compound having two or more epoxy groups or oxetanyl groups in the molecule, and more preferred is a compound having two or more epoxy groups in the molecule.

The molecular weight of Component D is in the range of 100 to 2,000, preferably in the range of 150 to 1,000, more preferably in the range of 180 to 800, and still more preferably in the range of 200 to 500.

The total content of Component D in the photosensitive resin composition of the present invention is preferably 1 part by mass to 50 parts by mass, more preferably 2 parts by mass to 30 parts by mass, and still more preferably 3 parts by mass to 20 parts by mass, based on 100 parts by mass of the solid content other than titanium black in the photosensitive resin composition. When Component D is added in the above specified range, a cured film having excellent mechanical strength and solvent resistance is obtained. Plural crosslinking agents may also be used in combination, in which case the total amount of the crosslinking agents should be in the ranges defined above.

The crosslinkable group in Component D is preferably at least one selected from the group consisting of an epoxy group, an oxetanyl group, an alkoxymethyl group, a methylol group, a blocked isocyanate group, and a group having an ethylenically unsaturated bond, and more preferably at least one selected from the group consisting of an epoxy group, an oxetanyl group, and a group having an ethylenically unsaturated bond. The above-mentioned embodiments provide superior optical density and surface strength of the cured product.

<Compound Containing Two or More Epoxy Groups or Oxetanyl Groups in Molecule>

Specific examples of the compound containing two or more epoxy groups in the molecule include a bisphenol A epoxy resin, a bisphenol F epoxy resin, a phenol novolac epoxy resin, a cresol novolac epoxy resin, and an aliphatic epoxy resin.

These compounds are commercially available. Examples thereof include the commercially available products described in paragraph "0189" of JP2011-221494A such as JER152, JER157S70, JER157S65, JER806, JER828, and JER1007 (all manufactured by Mitsubishi Chemical Holdings Corporation). Other examples include ADEKA RESIN series EP-40005, EP-40035, EP-40105, and EP-40115 (all manufactured by ADEKA CORPORATION); NC-2000, NC-3000, NC-7300, XD-1000, EPPN-501, and EPPN-502 (all manufactured by ADEKA CORPORATION); DENACOL EX-611, EX-612, EX-614, EX-614B, EX-622, EX-512, EX-521, EX-411, EX-421, EX-313, EX-314, EX-321, EX-211, EX-212, EX-810, EX-811, EX-850, EX-851, EX-821, EX-830, EX-832, EX-841, EX-911, EX-941, EX-920, EX-931, EX-212L, EX-214L, EX-216L, EX-321L, EX-850L, DLC-201, DLC-203, DLC-204, DLC-205, DLC-206, DLC-301, and DLC-402 (all manufactured by Nagase ChemteX Corporation); and YH-300, YH-301, YH-302, YH-315, YH-324, and YH-325 (all manufactured by the new Nippon Steel Chemical Co., Ltd.).

These compounds may be used alone or in combination of two or more thereof.

Among them, more preferred are a bisphenol A epoxy resin, a bisphenol F epoxy resin, a phenol novolac epoxy resin, and an aliphatic epoxy resin, among which particularly preferred is a bisphenol A epoxy resin.

Specific examples of the compound containing two or more oxetanyl groups in the molecule that can be used include ARON OXETANE OXT-121, OXT-221, OX-SQ, and PNOX (all manufactured by Toagosei Co., Ltd.).

Further, the compound containing an oxetanyl group is preferably used alone or in admixture with a compound containing an epoxy group.

<Alkoxymethyl Group-Containing Crosslinking Agent>

The alkoxymethyl group-containing crosslinking agent is preferably alkoxymethylated melamine, akloxymethylated benzoguanamine, alkoxymethylated glycoluril, alkoxymethylated urea, or the like. These compounds are obtained by converting the respective methylol groups of methylolated melamine, methylolated benzoguanamine, methylolated glycoluril, and methylolated urea into alkoxymethyl groups. There are no particular limitations on the type of this alkoxymethyl group, and examples thereof include a methoxymethyl group, an ethoxymethyl group, a propoxymethyl group, and a butoxymethyl group. From the viewpoint of the amount of outgas generation, a methoxymethyl group is particularly preferable.

Among these crosslinkable compounds, preferred examples of the crosslinkable compound include alkoxymethylated melamine, alkoxymethylated benzoguanamine, and alkoxymethylated glycoluril. From the viewpoint of transparency, alkoxymethylated glycoluril is particularly preferable.

These alkoxymethyl group-containing crosslinking agents are commercially available, and preferred examples thereof that can be used include CYMEL 300, 301, 303, 370, 325, 327, 701, 266, 267, 238, 1141, 272, 202, 1156, 1158, 1123, 1170, 1174, UFR 65, and 300 (all manufactured by Mitsui Cyanamide, Ltd.); NIKALAC MX-750, -032, -706, -708, -40, -31, -270, -280, -290, NIKALAC MS-11, NIKALAC MW-30HM, -100LM, and -390 (all manufactured by Sanwa Chemical Co., Ltd.).

<Blocked Isocyanate Compound>

In the photosensitive resin composition of the present invention, a blocked isocyanate compound may also be preferably employed as the crosslinking agent. The blocked isocyanate compound is not particularly limited as long as it is a compound containing a blocked isocyanate group. From the viewpoint of curability, preferred is a compound containing two or more blocked isocyanate groups in one molecule.

As used herein, the term "blocked isocyanate group" refers to a group capable of generating an isocyanate group by heat, and preferably includes, for example, an isocyanate group protected by reaction with a blocking agent. Preferably, the blocked isocyanate group is a group capable of generating an isocyanate group by heating at 90° C. to 250° C.

The blocked isocyanate compound may have any skeleton containing two isocyanate groups in one molecule without any particular limitation, and may be aliphatic, alicyclic or aromatic polyisocyanate, and examples thereof that can be suitably used include isocyanate compounds such as 2,4-tolylene diisocyanate, 2,6-tolylene diisocyanate, isophorone diisocyanate, 1,6-hexamethylene diisocyanate, 1,3-trimethylene diisocyanate, 1,4-tetramethylene diisocyanate, 2,2,4-trimethylhexamethylene diisocyanate, 2,4,4-trimethylhexamethylene diisocyanate, 1,9-nonamethylene diisocyanate, 1,10-decamethylene diisocyanate, 1,4-cyclohexane diisocyanate, 2,2'-diethyl ether diisocyanate, diphenylmethane-4,4'-diisocyanate, o-xylene diisocyanate, m-xylene diisocyanate, p-xylene diisocyanate, methylene bis(cyclohexyl isocyanate), cyclohexane-1,3-dimethylene diisocyanate, cyclohexane-1,4-dimethylene diisocyanate, 1,5-naphthalene diisocyanate, p-phenylene diisocyanate, 3,3'-methylene ditolylene-4,4'-diisocyanate, 4,4'-diphenyl ether diisocyanate, tetrachlorophenylene diisocyanate, norbornane diisocyanate, hydrogenated 1,3-xylylene diisocyanate, and hydrogenated 1,4-xylylene diisocyanate; and compounds having a prepolymer skeleton derived from these compounds. Among them, tolylene diisocyanate (TDI), diphenylmethane diisocyanate (MDI), hexamethylene diisocyanate (HDI), and isophorone diisocyanate (IPDI) are particularly preferred.

Parent structures of the blocked isocyanate compound in the photosensitive resin composition of the present invention include a biuret type, an isocyanurate type, an adduct type, and a difunctional prepolymer type.

Examples of the blocking agent forming the blocked structure of the blocked isocyanate compound include an oxime compound, a lactam compound, a phenol compound, an alcohol compound, an amine compound, an active methylene compound, a pyrazole compound, a mercaptan compound, an imidazole compound, and an imide compound. Among them, particularly preferred is a blocking agent selected from an oxime compound, a lactam compound, a phenol compound, an alcohol compound, an amine compound, an active methylene compound, and a pyrazole compound.

The oxime compound includes aldoxime and ketoxime. Specific examples thereof include acetoxime, formaldoxime, cyclohexane oxime, methyl ethyl ketone oxime, cyclohexanone oxime, and benzophenone oxime.

Examples of the lactam compound include ε-caprolactam and γ-butyrolactam.

Examples of the phenol compound include phenol, naphthol, cresol, xylenol, and halogen-substituted phenol.

Examples of the alcohol compound include methanol, ethanol, propanol, butanol, cyclohexanol, ethylene glycol monoalkyl ether, propylene glycol monoalkyl ether, and alkyl lactate.

Examples of the amine compound include a primary amine and a secondary amine, which may be any of an aromatic amine, an aliphatic amine, or an alicyclic amine, examples of which include aniline, diphenylamine, ethyleneimine, and polyethyleneimine.

Examples of the active methylene compound include diethyl malonate, dimethyl malonate, ethyl acetoacetate, and methyl acetoacetate.

Examples of the pyrazole compound include pyrazole, methylpyrazole, and dimethylpyrazole.

Examples of the mercaptan compound include alkyl mercaptan and aryl mercaptan.

The blocked isocyanate compound that can be used in the photosensitive resin composition of the present invention is commercially available, and examples thereof that can be preferably used include CORONATE AP STABLE M, CORONATE 2503, 2515, 2507, 2513, and 2555, and MILLIONATE MS-50 (all manufactured by Nippon Polyurethane Industry Co., Ltd.); TAKENATE B-830, B-815N, B-820NSU, B-842N, B-846N, B-870N, B-874N, and B-882N (all manufactured by Mitsui Chemicals, Inc.); DURANATE 17B-60PX, 17B-60P, TPA-B80X, TPA-B80E, MF-B60X, MF-B60B, MF-K60X, MF-K60B, E402-B80B, SBN-70D, SBB-70P, and K6000 (all manufactured by Asahi Kasei Chemicals Corp.); DESMODUR BL1100, BL1265 MPA/X, BL3575/1, BL3272MPA, BL3370MPA, BL3475BA/SN, BL5375MPA, VPLS2078/2, BL4265SN, PL340, and PL350, and SUMIDUR BL3175 (all manufactured by Sumika Bayer Urethane Co., Ltd.).

<Alkoxysilane Compound>

The crosslinking agent having an alkoxysilyl group is preferably a compound having a trialkoxysilyl group. The crosslinking agent may also have a crosslinking group other than an alkoxysilyl group. In the present invention, the crosslinking agent having an alkoxysilyl group, which may have a crosslinking group other than an alkoxysilyl group, is accepted as an alkoxysilane compound.

Specific examples of the alkoxysilane compound include γ-aminopropyltrimethoxysilane, γ-aminopropyltriethoxysilane, γ-glycidoxypropyltrialkoxysilane, γ-glycidoxypropylalkyldialkoxysilane, γ-methacryloxypropyltrialkoxysilane, γ-methacryloxypropylalkyldialkoxysilane, γ-chloropropyltrialkoxysilane, γ-mercaptopropyltrialkoxysilane, β-(3,4-epoxycyclohexyl)ethyltrialkoxysilane, and vinyltrialkoxysilane. Among them, the alkoxysilane compound is more preferably γ-glycidoxypropyltrialkoxysilane and γ-methacryloxypropyltrialkoxysilane, still more preferably γ-glycidoxypropyltrialkoxysilane, and particularly preferably 3-glycidoxypropyltrimethoxysilane. These compounds may be used alone or in combination of two or more thereof.

The compounds represented by the following formula can also preferably be employed.

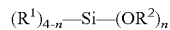

In the formula, $R^1$ is a hydrocarbon group having 1 to 20 carbon atoms and having no reactive group, $R^2$ is an alkyl group having 1 to 3 carbon atoms or a phenyl group, and n is an integer of 1 to 3.

Specific examples thereof include the following compounds in which Ph represents a phenyl group.

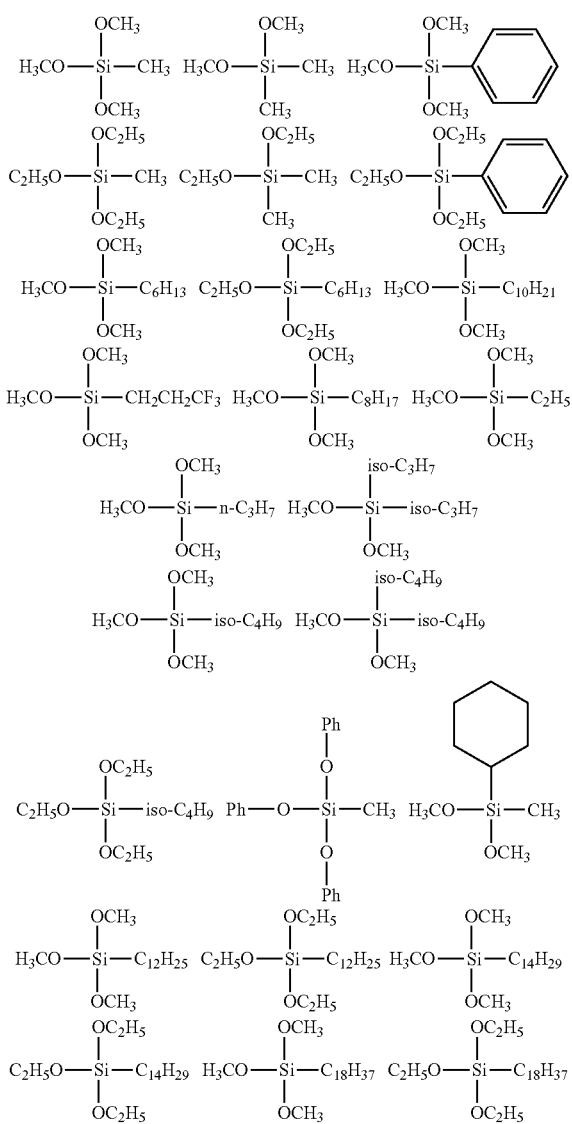

The alkoxysilane compound that can be used in the photosensitive resin composition of the present invention is not particularly limited thereto and include known ones.

Moreover, the use of the alkoxysilane compound can improve the adhesion between the substrate and the film formed by the photosensitive resin composition of the present invention as well as surface hardness.

<Compound Having at Least One Ethylenically Unsaturated Bond>

As the compound having at least one ethylenically unsaturated bond, a (meth)acrylate compound may be preferably used such as a monofunctional (meth)acrylate, a difunctional (meth)acrylate, or a three or higher functional (meth)acrylate compound.

Examples of the monofunctional (meth)acrylate include 2-hydroxyethyl (meth)acrylate, carbitol (meth)acrylate, isobornyl (meth)acrylate, 3-methoxybutyl (meth)acrylate, and 2-(meth)acryloyloxyethyl-2-hydroxypropyl phthalate.

Examples of the difunctional (meth)acrylate include ethylene glycol (meth)acrylate, 1,6-hexanediol di(meth)acrylate, 1,9-nonanediol di(meth)acrylate, polypropylene glycol di(meth)acrylate, tetraethylene glycol di(meth)acrylate, and bisphenoxyethanolfluorene diacrylate.

Examples of the three or higher functional (meth)acrylate compound include trimethylolpropane tri(meth)acrylate, pentaerythritol tri(meth)acrylate, tri((meth)acryloyloxyethyl)phosphate, pentaerythritol tetra(meth)acrylate, dipentaerythritol penta(meth)acrylate, and dipentaerythritol hexa(meth)acrylate.

These compounds having at least one ethylenically unsaturated bond are used alone or in combination of two or more thereof.

Further, in the case of adding a compound having at least one ethylenically unsaturated bond, it is preferred to add a radical polymerization initiator, and it is more preferred to add a thermal radical polymerization initiator. The radical polymerization initiator that can be used includes known ones.

Further, if the polymerization initiator is a compound having a (meth)acryl group, crosslinking by Michael addition reaction is also possible.

—Crosslinkable Group Equivalent in Photosensitive Resin Composition—

Description will be given on crosslinkable group equivalent in the solid content of the photosensitive resin composition.

The crosslinkable group equivalent in the solid content refers to a mass (g) of the solid content in the case where 1 mol of the crosslinkable group is present in the solid content of the composition. The crosslinkable group equivalent can be determined by taking a certain amount of solid content of the composition and measuring an amount of the crosslinkable groups in the solid content.

Specifically, the measurement is performed as described above, using a sample in which titanium black was allowed to precipitate from the photosensitive resin composition of the present invention. The precipitation of titanium black may also be performed by once diluting the photosensitive resin composition with a solvent.

In the case where the crosslinkable group is an epoxy group, the crosslinkable group equivalent can be determined in the same manner as "Determination of epoxy equivalent" specified in JIS K7236: 2001. Further, other crosslinkable groups may also be determined in the same manner as above.

From the viewpoint of strength of the cured film, the crosslinkable group equivalent in the photosensitive resin composition of the present invention is preferably 1,000 or less, more preferably 550 or less, still more preferably 300 or less, and most preferably 200 or less, per 1 g of organic solid content of the photosensitive resin composition. The lower limit of the crosslinkable group equivalent is not particularly limited, but is preferably 100 or more from the viewpoint of sensitivity and developability. The term "organic solid content of the photosensitive resin composition" refers to a component excluding volatile components such as solvents, and inorganic components such as titanium black.

(Component S) Titanium Black

The photosensitive resin composition of the present invention contains (Component S) titanium black.

The term "titanium black" as used herein refers to black particles containing a titanium atom, and a specific component thereof is a lower titanium oxide, a titanium oxynitride, or the like.

Examples of a method for producing titanium black include a method of heating and reducing a mixture of titanium dioxide and metallic titanium under a reducing atmosphere; a method of reducing, under a hydrogen-containing reducing atmosphere, ultrafine titanium dioxide obtained by high-temperature hydrolysis of titanium tetrachloride; a method of reducing titanium dioxide or titanium hydroxide at a high temperature in the presence of ammonia; and a method of depositing a vanadium compound on titanium dioxide or titanium hydroxide, and reducing the resultant at a high temperature in the presence of ammonia.

The titanium black particles may be surface-modified for the purpose of improving dispersibility, suppressing aggregating properties, or the like, as necessary. For example, the titanium black particles may be coated with silicon oxide, titanium oxide, germanium oxide, aluminum oxide, magnesium oxide, or zirconium oxide. Surface treatment of the titanium black particles with a water-repellent substance as described in JP2007-302836A is also permissible.

The shape of titanium black is not particularly limited, but is preferably of particulate form.

The particle diameter of the titanium black is not particularly limited, and the average primary particle diameter is preferably in the range of from 3 nm to 2,000 nm, more preferably in the range of from 10 nm to 500 nm, and still more preferably in the range of from 10 nm to 100 nm, from the viewpoint of dispersibility and colorability.

The particle diameter of the titanium black may be measured by the following method.

It is known that the particle diameter may be measured by a method of directly observing the particles using a transmission electron microscope, and measuring the minor axis diameter and major axis diameter, or a method of determining the particle content with respect to a predetermined particle diameter in the object to be measured, using a small-angle X-ray scattering method.

The specific surface area of the titanium black is not particularly limited, and the specific surface area of the titanium black, as measured by a BET method, is preferably from 5 $m^2/g$ to 150 $m^2/g$, and more preferably from 20 $m^2/g$ to 100 $m^2/g$, in order that the titanium black exhibits a desired water repellency after being surface-treated with a water repellent.

Examples of commercially available products of titanium black include TITANIUM BLACK 10S, 12S, 13M, 13M-C, 13R, and 13R-N (manufactured by Mitsubishi Materials Corporation), and TILACK D (manufactured by Ako Kasei Co., Ltd.). The present invention is not limited thereto, and a variety of titanium black may be used.

If necessary, an extender pigment may be added to the titanium black in the present invention. Examples of the extender pigment include barium sulfate, barium carbonate, calcium carbonate, silica, basic magnesium carbonate, alumina white, gloss white, saturn white, and hydrotalcite. These extender pigments may be used alone or in admixture of two or more thereof. The amount of the extender pigment to be used is preferably 0 parts by mass to 100 parts by mass, more preferably 5 parts by mass to 50 parts by mass, and still more preferably 10 parts by mass to 40 parts by mass, with respect to 100 parts by mass of the titanium black. In the present invention, if necessary, the surface of the titanium black and the extender pigment may be modified with a polymer.

The content of titanium black in the photosensitive resin composition of the present invention may be suitably determined in consideration of light-shielding properties, the film thickness, and the like required for a light-shielding color filter or the like obtained by a photosensitive resin composition, but, it is preferably 5 mass % or more, more preferably 10 mass % or more, still more preferably 20 mass % or more, particularly preferably 25 mass % or more, and most preferably 40 mass % or more; and preferably 80 mass %, more preferably 70 mass % or less, still more preferably 65 mass % or less, and particularly preferably 60 mass % or less, based on the total solid content of the photosensitive resin composition of the present invention.

Further, in the case of being used in a light-shielding color filter and an infrared cut filter, the content of titanium black in the photosensitive resin composition of the present invention is preferably 40 mass % to 70 mass %, more preferably 45 mass % to 65 mass %, and particularly preferably 50 mass % to 65 mass %, based on the total solid content of the photosensitive resin composition of the present invention. When the content of titanium black falls within the above-specified range, a cured product having a thin film thickness, excellent light-shielding properties, a high surface hardness, and excellent resolution is obtained.

Further, a light-shielding pigment other than titanium black can be used in admixture with the titanium black in the photosensitive resin composition of the present invention.

Such a miscible light-shielding pigment is not particularly limited as long as the light-shielding pigment has an absorbance in the visible light region. Examples of the light-shielding pigment include the above-described extender pigment, carbon black, and organic pigments such as C.I. Pigment Blue 1, 2, 15, 15:1, 15:2, 15:3, 15:4, 15:6, 16, 22, 60, 64, 66, 79, and 80, C.I. Pigment Violet 1, 19, 23, 27, 32, 37, and 42, C.I. Pigment Brown 25 and 28, or C.I. Pigment Black 1 and 7.

Examples of a combination of the titanium black and the light-shielding pigment other than titanium black include: a combination of titanium black and carbon black in a ratio of 6:1, and a combination of titanium black and titanium oxide in a ratio of 3:1.

The content of the light-shielding pigment used in combination with the titanium black is preferably in the range of 0 parts by mass to 90 parts by mass, and more preferably in the range of 0 parts by mass to 50 parts by mass, based on 100 parts by mass of the titanium black.

In the present invention, titanium black may also be provided for use as a dispersion liquid prepared by mixing and dispersing the titanium black in a suitable dispersant and solvent by using a mixing device such as a ball mill, or a rod mill.

Examples of the solvent used for preparing the dispersion liquid include alcohols such as 1-propanol, 2-propanol, 1-butanol, 2-butanol, 2-methyl-2-propanol, 1-pentanol, 2-pentanol, 3-pentanol, 3-methyl-1-butanol, 2-methyl-2-butanol, neopentanol, cyclopentanol, 1-hexanol, and cyclohexanol, in addition to the above-mentioned (Component C) solvent.

These solvents may be used alone or in combination of two or more thereof.

Titanium black which can be used in the present invention may also be used as a titanium black dispersion liquid in the preparation of the photosensitive resin composition.

The titanium black dispersion liquid is adjusted such that the content of titanium black in the dispersion liquid is from 5 mass % to 99 mass %, more preferably from 40 mass % to 92 mass %, and still more preferably from 40 mass % to 80 mass %.

Furthermore, in the case where a resist using the titanium black dispersion liquid of the present invention is applied onto an infrared cut filter (in particular, a glass substrate), the content of titanium black is preferably 20 mass % to 99 mass %, more preferably 25 mass % to 98 mass %, and still more preferably 30 mass % to 95 mass %, based on the solid content other than titanium black in the photosensitive resin composition. When the content of titanium black is within this range, the effect of the present invention is more exerted.

(Component E) Dispersant

The photosensitive resin composition of the present invention preferably contains (Component E) a dispersant. By containing the dispersant, the dispersibility of Component S in the resin composition can be further improved.

The dispersant that can be used is a known dispersant and is suitably selectable from, for example, known pigment dispersants.

A polymer dispersant can be preferably used as the dispersant. As used herein, the term "polymer dispersant" refers to a dispersant having a molecular weight (weight average molecular weight) of 1,000 or more.

A variety of compounds may be used as the dispersant, and specific examples thereof include cationic surfactants such as (meth)acrylic (co)polymer POLYFLOW No. 75, No. 90, and No. 95 (manufactured by Kyoeisha Chemical Co., Ltd.), and W001 (manufactured by Yusho Co., Ltd.); nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid ester; anionic surfactant such as W004, W005, and W017 (manufactured by Yusho Co., Ltd.); polymer dispersants such as EFKA-46, EFKA-47, EFKA-47EA, EFKA polymer 100, EFKA polymer 400, EFKA polymer 401, EFKA polymer 450 (all manufactured by CIBA Specialty Chemicals), DISPERSE AID 6, DISPERSE AID 8, DISPERSE AID 15, and DISPERSE AID 9100 (all manufactured by San Nopco Ltd.); various SOLSPERSE dispersants such as SOLSPERSE 3000, 5000, 9000, 12000, 13240, 13940, 17000, 24000, 26000, and 28000 (manufactured by AstraZeneca plc); and ADEKA PLURONIC L31, F38, L42, L44, L61, L64, F68, L72, P95, F77, P84, F87, P94, L101, P103, F108, L121, P-123 (manufactured by Adeka Corporation), IONET S-20 (manufactured by Sanyo Chemical Industries, Ltd.), and DISPERBYK 101, 103, 106, 108, 109, 111, 112, 116, 130, 140, 142, 162, 163, 164, 166, 167, 170, 171, 174, 176, 180, 182, 2000, 2001, 2050, 2150 (manufactured by BYK-Chemie GmbH). Besides them, also exemplified are oligomers or polymers having a polar group at the molecular terminal or side chain, such as acrylic copolymer.

Specific examples of the dispersant used in the photosensitive resin composition of the present invention include the following Exemplary Compounds 1 to 26, in addition to the above-described compounds.

The dispersant is preferably a polymer dispersant having an acid group in the side chain, and more preferably a polymer dispersant having a carboxyl group in the side chain.

Further, the dispersant is preferably a polymer dispersant having a graft chain in the side chain, and more preferably a polymer dispersant having an acid group and a graft chain in the side chain. Further, the graft chain is a polymer chain which is contained in the side chain and is different from the main chain. The number of atoms excluding hydrogen atoms in one graft chain is preferably in the range of 40 to 10,000, more preferably in the range of 50 to 2,000, and still more preferably in the range of 60 to 1,000.

Exemplary Compound 1

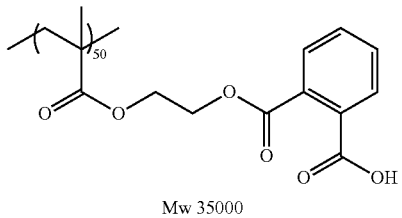

Mw 35000

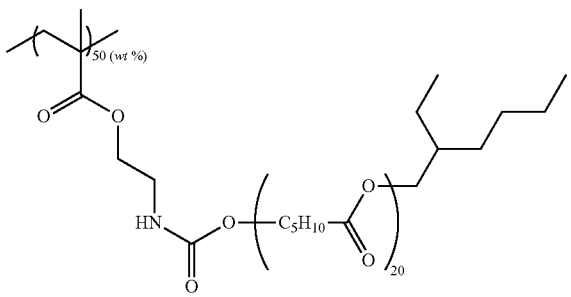

Exemplary Compound 2

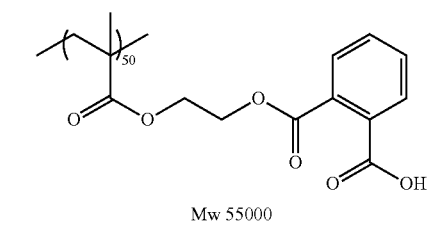

Mw 55000

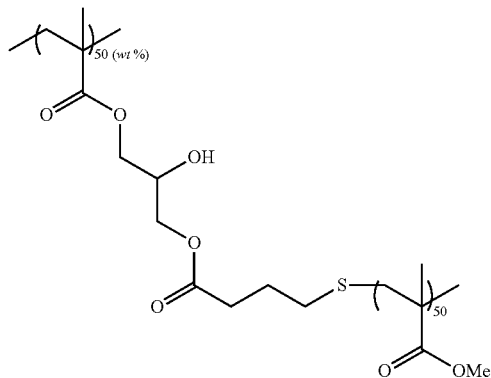

Exemplary Compound 3

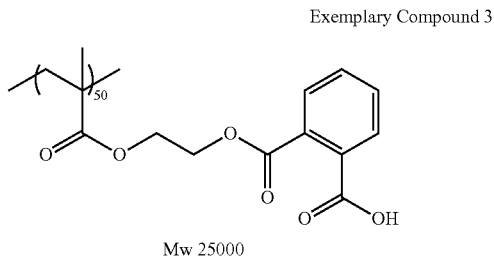

Mw 25000

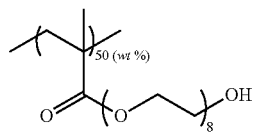

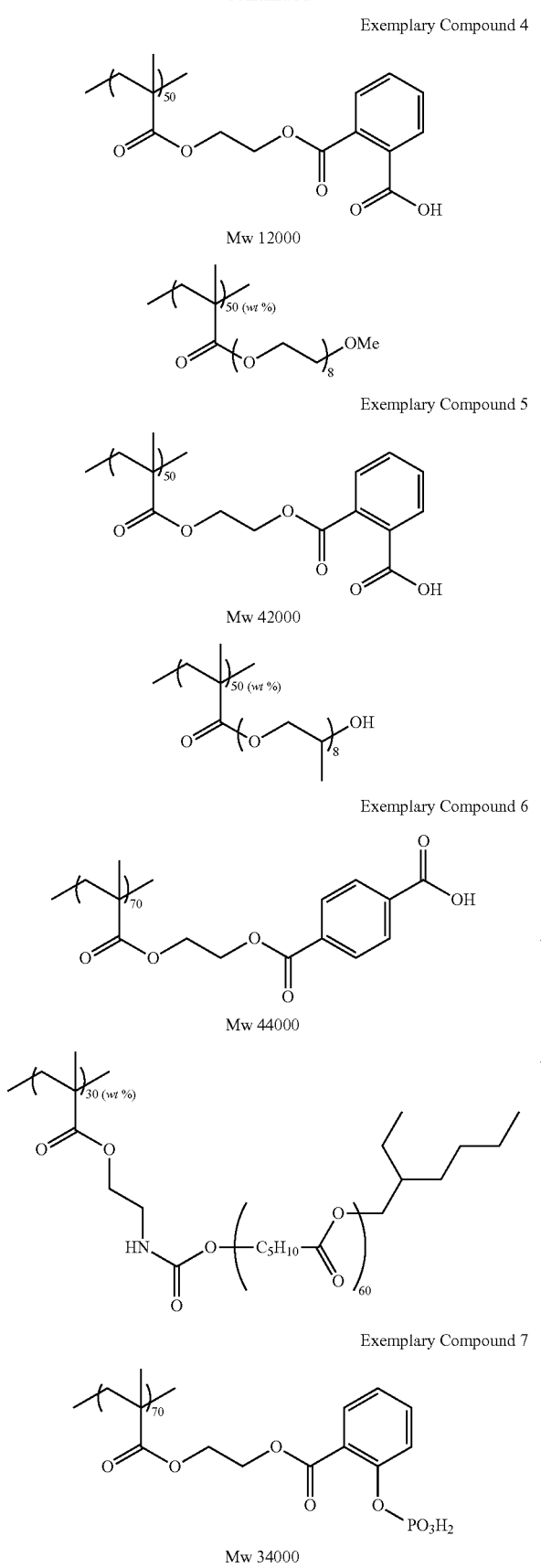
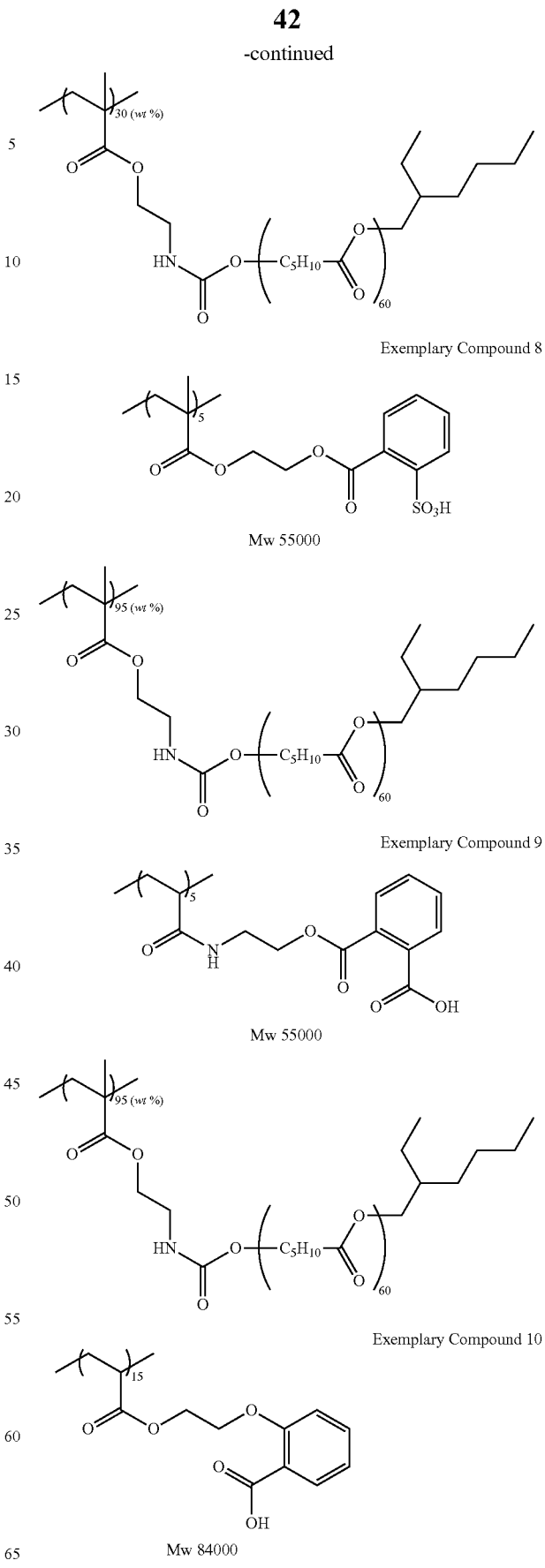

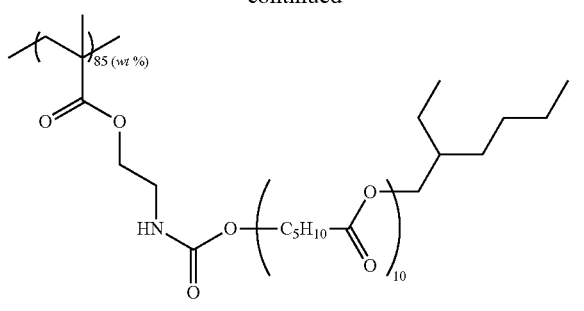
Exemplary Compound 11
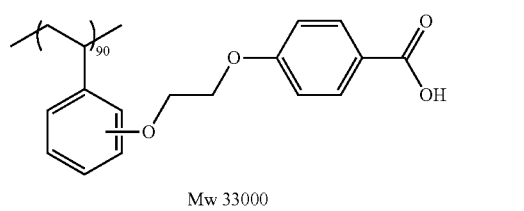
Mw 33000
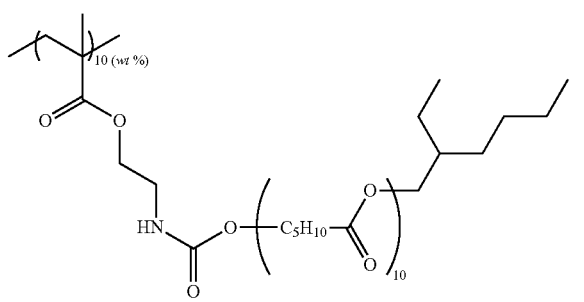
Exemplary Compound 12
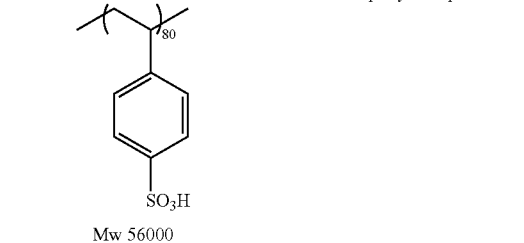
Mw 56000
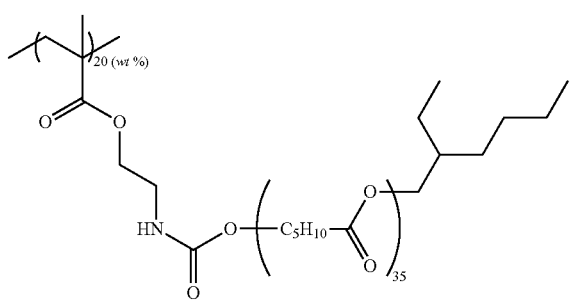
Exemplary Compound 13
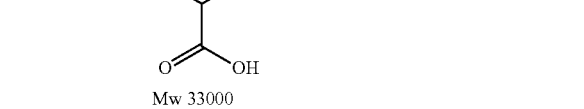
Mw 33000
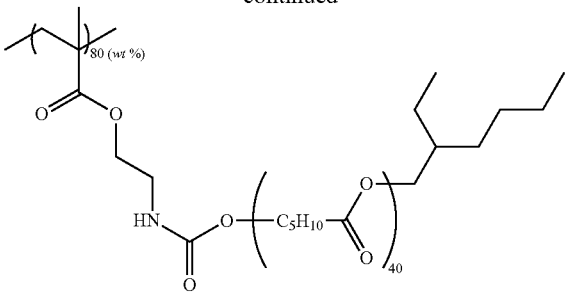
Exemplary Compound 14
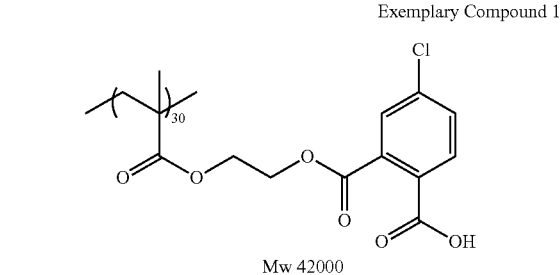
Mw 42000
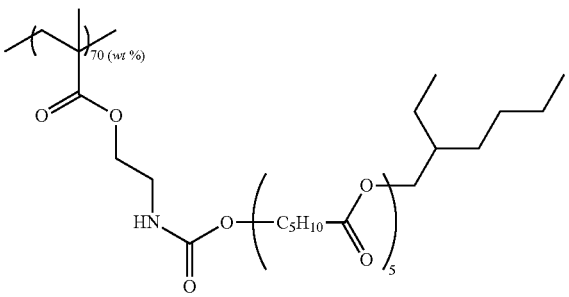
Exemplary Compound 15
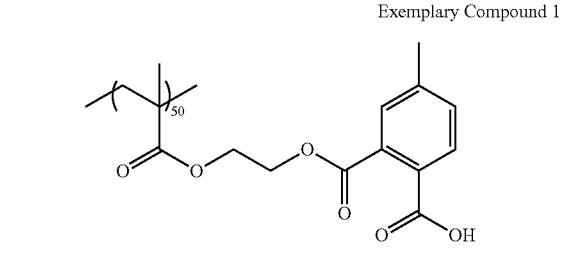
Mw 42000
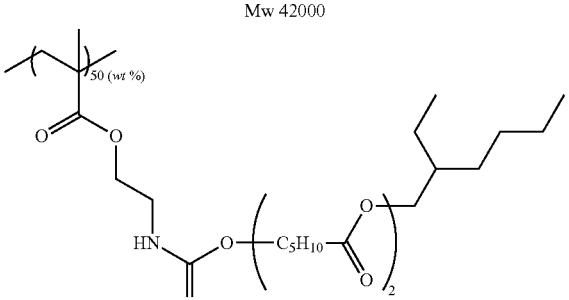
Exemplary Compound 16
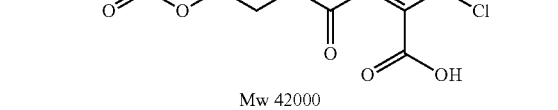
Mw 42000

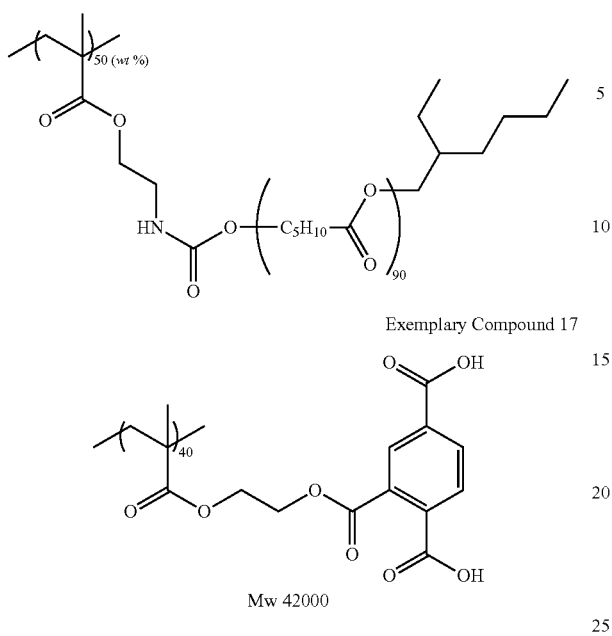
Exemplary Compound 17
Mw 42000
Exemplary Compound 18
Mw 33000
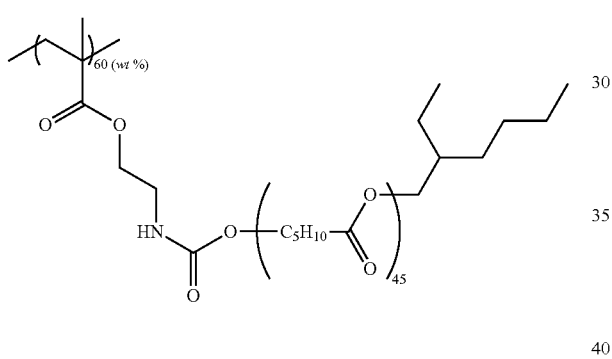
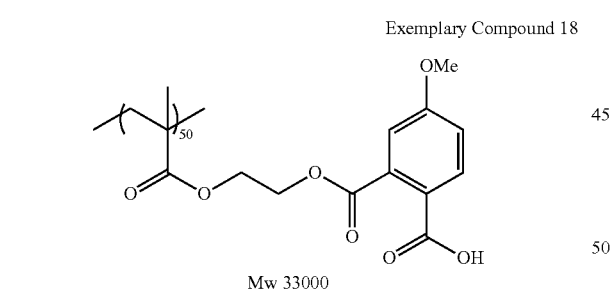
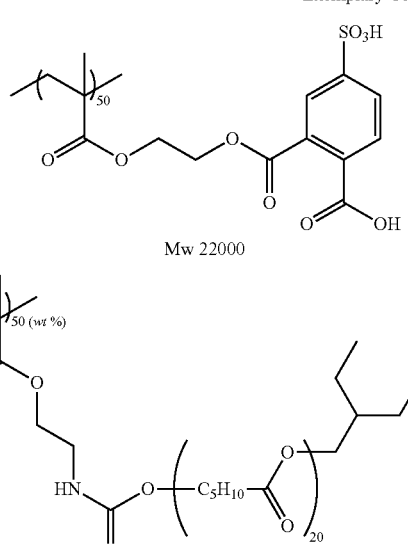
Exemplary Compound 19
Mw 22000
Exemplary Compound 20
Mw 52000
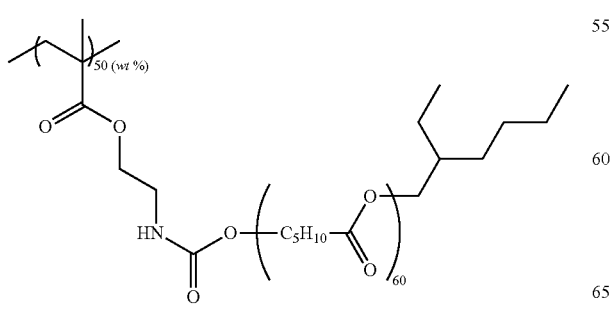
Exemplary Compound 21
Mw 34000

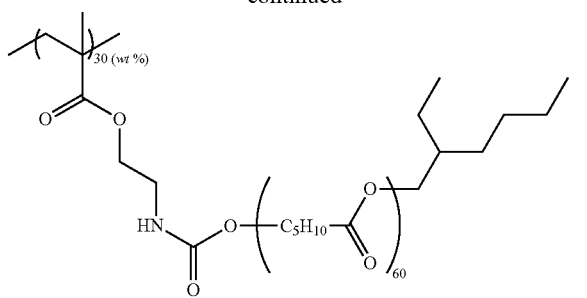
Exemplary Compound 22
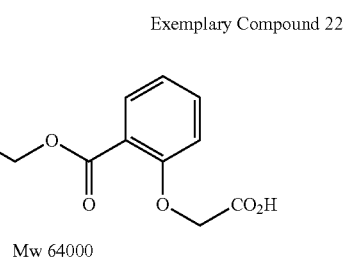
Mw 64000
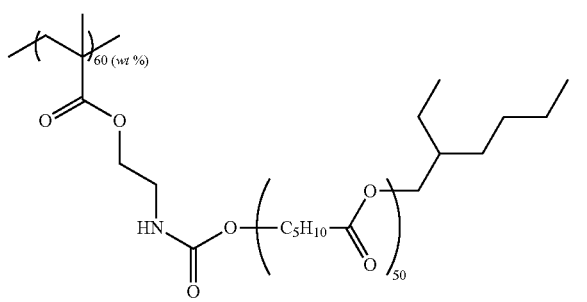
Exemplary Compound 23
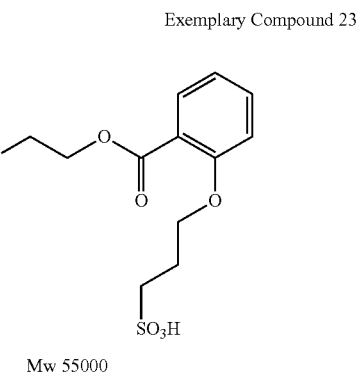
Mw 55000
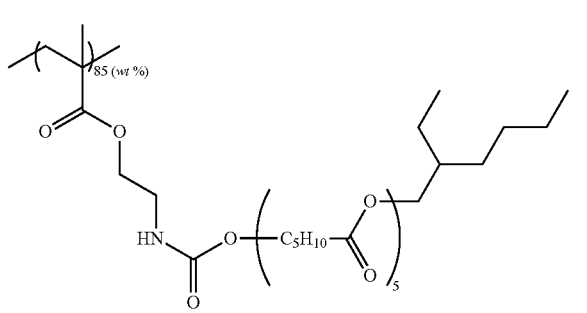
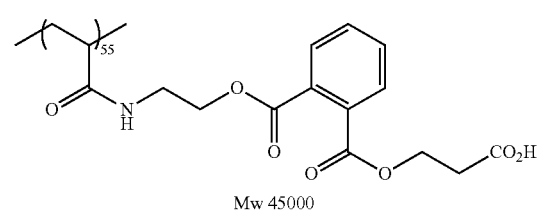
Exemplary Compound 24
Mw 45000
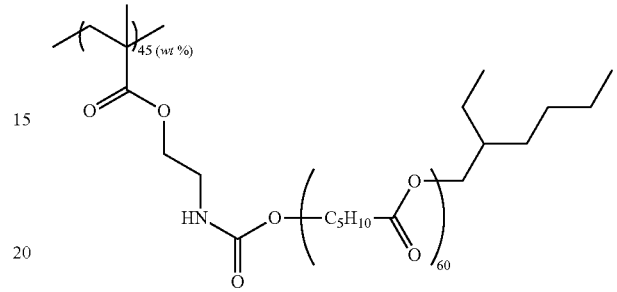
Exemplary Compound 25
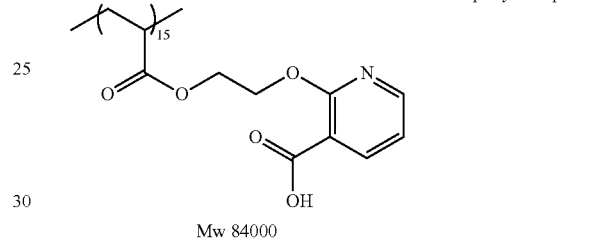
Mw 84000
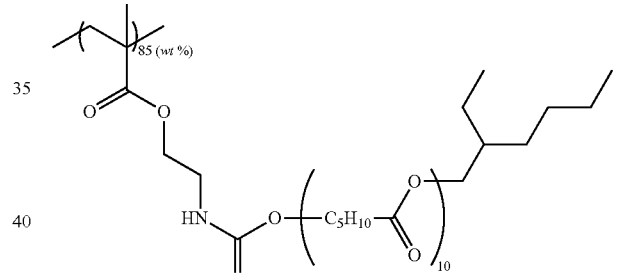
Exemplary Compound 26
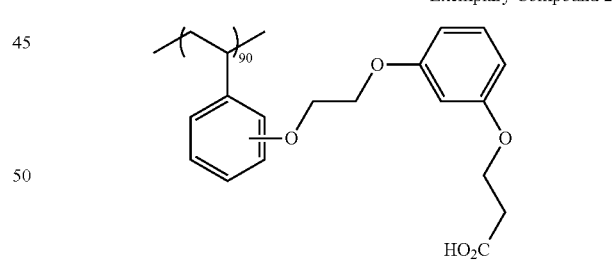
Mw 33000
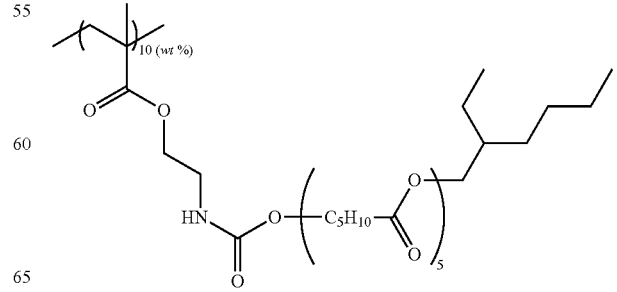

From the viewpoint of suppression of pattern separation at the time of development and developability, the weight average molecular weight of Exemplary Compounds 1 to 26 in the present invention is preferably from 10,000 to 300,000, more preferably from 15,000 to 200,000, still more preferably from 20,000 to 100,000, and particularly preferably from 25,000 to 50,000. The weight average molecular weight of the dispersant can be determined, for example, by GPC.

Specific examples of the dispersant used in the photosensitive resin composition of the present invention include the specific resin 9 described in paragraph "0225" of JP2013-249417A, the polymer compound described in paragraphs "0039" to "0140" of JP2007-277514A (paragraphs "0053" to "0180" of the corresponding US2010/0233595A), Compounds C-1 to C-57 synthesized in Examples described in paragraphs "0266" to "0348" of JP2007-277514A (paragraphs "0389" to "0429" of the corresponding US2010/0233595A), the polymer compound (B) described in JP2014-177613A, and the polymer compound (B) described in JP2014-177614A.

With regard to the dispersion liquid used in the photosensitive resin composition of the present invention, Exemplary Compounds 1 to 26 are a dispersion resin imparting dispersibility to titanium black, and exhibit excellent dispersibility, and due to having solvent affinity by means of graft chains, exhibit excellent dispersibility of titanium black and excellent dispersion stability with time. Moreover, when formed into a photosensitive resin composition, it is less likely to generate residues during alkali development since those Exemplary Compounds have an affinity for a solvent, a curing component, or other resins that can be used in combination.

The dispersant may be used alone or in combination of two or more thereof.

The content of the dispersant in the photosensitive resin composition of the present invention is preferably in the range of 2 mass % to 70 mass %, and more preferably in the range of 5 mass % to 50 mass %, based on the total content of titanium black.

(Component F) Basic Compound

The photosensitive resin composition of the present invention may contain (Component F) a basic compound.

(Component F) The basic compound that can be used is arbitrarily chosen from those used in chemically amplified resists. For example, the basic compound includes an aliphatic amine, an aromatic amine, a heterocyclic amine, a quaternary ammonium hydroxide, a quaternary ammonium salt of a carboxylic acid and the like. Specific examples thereof include the compounds described in paragraphs "0204" to "0207" of JP2011-221494A.

Specific examples of the aliphatic amine include trimethylamine, diethylamine, triethylamine, di-n-propyl amine, tri-n-propylamine, di-n-pentylamine, tri-n-pentylamine, diethanolamine, triethanolamine, dicyclohexylamine, and dicyclohexylmethylamine.

Examples of the aromatic amine include aniline, benzylamine, N,N-dimethylaniline, and diphenylamine.

Examples of the heterocyclic amine include pyridine, 2-methylpyridine, 4-methylpyridine, 2-ethylpyridine, 4-ethylpyridine, 2-phenylpyridine, 4-phenylpyridine, N-methyl-4-phenylpyridine, 4-dimethylaminopyridine, imidazole, benzimidazol e, 4-methylimidazole, 2-phenylbenzimidazole, 2,4,5-triphenylimidazole, nicotine, nicotinic acid, nicotinic acid amide, quinoline, 8-oxyquinoline, pyrazine, pyrazole, pyridazine, purine, pyrrolidine, piperidine, piperazine, morpholine, 4-methylmorpholine, N-cyclohexyl-N'-[2-(4-morpholinyl)ethyl]thiourea, 1,5-diazabicyclo[4.3.0]-5-nonene, and 1,8-diazabicyclo[5.3.0]-7-undecene.

Examples of the quaternary ammonium hydroxide include tetramethylammonium hydroxide, tetraethylammonium hydroxide, tetra-n-butylammonium hydroxide, and tetra-n-hexylammonium hydroxide.

Examples of the quaternary ammonium salt of a carboxylic acid include tetramethylammonium acetate, tetramethylammonium benzoate, tetra-n-butylammonium acetate, and tetra-n-butylammonium benzoate.

Among them, preferred is a heterocyclic amine, and particularly preferred are 2,4,5-triphenyl imidazole and/or N-cyclohexyl-N'-[2-(4-morpholinyl)ethyl]thiourea.

The basic compound that can be used in the present invention may be used alone or in combination of two or more thereof.

The content of the basic compound in the photosensitive resin composition of the present invention is preferably 0.001 parts by mass to 5 parts by mass, and more preferably 0.005 parts by mass to 3 parts by mass, based on 100 parts by mass of the solid content other than titanium black in the photosensitive resin composition.

(Component G) Surfactant

The photosensitive resin composition of the present invention may contain (Component G) a surfactant.

Any of an anionic, cationic, nonionic or zwitterionic surfactant may be used as the (Component G) surfactant, but a preferred surfactant is a nonionic surfactant. Examples of the surfactant used in the composition of the present invention include those described in paragraphs "0201" to "0205" of JP2012-88459A and those described in paragraphs "0185" to "0188" of JP2011-215580A, the disclosures of which are incorporated herein by reference.

Examples of the nonionic surfactant include polyoxyethylene higher alkyl ethers, polyoxyethylene higher alkyl phenyl ethers, higher fatty acid diesters of polyoxyethylene glycol, silicone surfactants, and fluorosurfactants. The nonionic surfactant is commercially available under the trade name of series KP-341, X-22-822 (manufactured by Shin-Etsu Chemical Co., Ltd.), POLYFLOW No. 99C (manufactured by Kyoeisha Chemical Co., Ltd.), EFTOP (manufactured by Mitsubishi Materials Electronic Chemicals Co., Ltd.), MEGAFAC (manufactured by DIC Corporation), FLUORAD NOVEC FC-4430 (manufactured by Sumitomo 3M Limited), SURFLON S-242 (manufactured by AGC Seimi Chemical Co., Ltd.), POLYFOXPF-6320 (manufactured by OMNOVA Solutions Inc.), SH-8400 (manufactured by Dow Corning Toray Silicone Co.), and FTERGENT FTX-218G (manufactured by Neos Co., Ltd.).

Further, preferred examples of the surfactant include copolymers including the Constitutional Unit A and Constitutional Unit B represented by Formula (G-1) below and having a weight average molecular weight (Mw) in terms of polystyrene of 1,000 to 10,000, as measured by gel permeation chromatography using tetrahydrofuran (THF) as a solvent.

(G-1)

Constitutional Unit A

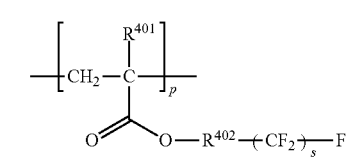

-continued

Constitutional Unit B

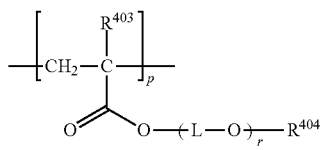

(In Formula (G-1), each of $R^{401}$ and $R^{403}$ independently represents a hydrogen atom or a methyl group, $R^{402}$ represents a linear alkylene group containing 1 to 4 carbon atoms, $R^{404}$ represents a hydrogen atom or an alkyl group containing 1 to 4 carbon atoms, L represents an alkylene group containing 3 to 6 carbon atoms, p and q are the mass percentage representing a polymerization ratio, p represents a value of 10 mass % to 80 mass %, q represents a value of 20 mass % to 90 mass %, r represents an integer of 1 to 18, and s represents an integer of 1 to 10)

L preferably represents a branched alkylene group represented by Formula (G-2) below. In Formula (G-2), $R^{405}$ represents an alkyl group containing 1 to 4 carbon atoms, preferably an alkyl group containing 1 to 3 carbon atoms, and more preferably an alkyl group containing 2 or 3 carbon atoms in terms of the compatibility and the wettability on the surface to be coated. The sum of p and q (p+q) is preferably 100, that is, 100 mass %.

(G-2)

More preferably, the copolymer has a weight average molecular weight (Mw) of 1,500 to 5,000.

These surfactants may be used alone or in admixture of two or more thereof.

The amount of the surfactant added to the photosensitive resin composition of the present invention is preferably 10 parts by mass or less, more preferably 0.001 parts by mass to 10 parts by mass, and still more preferably 0.01 parts by mass to 3 parts by mass, based on 100 parts by mass of the solid content other than titanium black in the photosensitive resin composition.

(Component H) Antioxidant

The photosensitive resin composition of the present invention preferably contains an antioxidant. A known antioxidant can be contained. When an antioxidant is added, the following advantages are obtained: cured films can be prevented from staining; or the film thickness loss due to decomposition can be reduced; or superior heat-resistant transparency can be achieved.

Such antioxidants include, for example, phosphorus-based antioxidants, amides, hydrazides, hindered amine-based antioxidants, sulfur-based antioxidants, phenolic antioxidants, ascorbic acids, zinc sulfate, sugars, nitrites, sulfites, thiosulfates, hydroxylamine derivatives, and the like. Among them, phenolic antioxidants, amide-based antioxidants, hydrazide-based antioxidants, and sulfur-based antioxidants are preferred, and phenolic antioxidants are most preferred from the viewpoint of preventing cured films from staining and film thickness loss. These antioxidants may be used alone or in admixture of two or more thereof.

Specific examples thereof include the compounds described in paragraphs "0026" to "0031" of JP2005-29515A, the contents of which are incorporated herein by reference.

Commercially available products of phenolic antioxidants include, for example, ADEKA STAB AO-15, ADEKA STAB AO-18, ADEKA STAB AO-20, ADEKA STAB AO-23, ADEKA STAB AO-30, ADEKA STAB AO-37, ADEKA STAB AO-40, ADEKA STAB AO-50, ADEKA STAB AO-51, ADEKA STAB AO-60, ADEKA STAB AO-70, ADEKA STAB AO-80, ADEKA STAB AO-330, ADEKA STAB AO-4125, ADEKA STAB AO-503, ADEKA STAB A-611, ADEKA STAB A-612, ADEKA STAB A-613, ADEKA STAB PEP-4C, ADEKA STAB PEP-8, ADEKA STAB PEP-8W, ADEKA STAB PEP-24Q ADEKA STAB PEP-36, ADEKA STAB PEP-36Z, ADEKA STAB HP-10, ADEKA STAB 2112, ADEKA STAB 260, ADEKA STAB 522A, ADEKA STAB 1178, ADEKA STAB 1500, ADEKA STAB C, ADEKA STAB 135A, ADEKA STAB 3010, ADEKA STAB TPP, ADEKA STAB CDA-1, ADEKA STAB CDA-6, ADEKA STAB ZS-27, ADEKA STAB ZS-90, and ADEKA STAB ZS-91 (all manufactured by ADEKA CORPORATION); IRGANOX 245FF, IRGANOX 1010FF, IRGANOX 1010, IRGANOX MD 1024, IRGANOX 1035FF, IRGANOX 1035, IRGANOX 1098, IRGANOX 1330, IRGANOX 1520L, IRGANOX 3114, IRGANOX 1726, IRGAFOS 168, and IRGAMOD 295 (manufactured by BASF), TINUVIN 405 (manufactured by BASF); and the like. Among others, ADEKA STAB AO-60, ADEKA STAB AO-80, IRGANOX 1726, IRGANOX 1035, IRGANOX 1098, and TINUVIN 405 can be favorably used.

The content of the antioxidant is preferably 0.1 mass % to 10 mass %, more preferably 0.2 mass % to 5 mass %, and particularly preferably 0.5 mass % to 4 mass %, based on 100 parts by mass of the solid content other than titanium black in the photosensitive resin composition. When the content of the antioxidant is in the above-specified range, the resulting film exhibits sufficient transparency and better sensitivity during patterning.

Further, additives other than the antioxidant that may be added to the photosensitive resin composition of the present invention include various UV absorbers, metal deactivators, and the like described in "New Developments in Polymer Additives (Nikkan Kogyo Shimbun, Ltd.)".

(Component I) Sensitizer

The photosensitive resin composition of the present invention preferably contains a sensitizer in combination with the (Component B) photoacid generator to facilitate its decomposition. The sensitizer is electronically excited once it absorbs actinic rays or radiation. The electronically excited sensitizer comes into contact with the photoacid generator to induce a phenomenon such as electron transfer, energy transfer, heat generation, or the like. As a result, the photoacid generator undergoes a chemical change so that it decomposes to generate an acid. Preferred examples of the sensitizer include compounds belonging to the following classes and having an absorption wavelength in any of the wavelength region of from 350 nm to 450 nm.

Polynuclear aromatics (for example, pyrene, perylene, triphenylene, anthracene, 9,10-dibutoxyanthracene, 9,10-diethoxyanthracene, 3,7-dimethoxyanthracene, 9,10-dipropyloxyanthracene); xanthenes (for example, fluorescein, eosine, erythrosine, rhodamine B, rose bengal); xanthones (for example, xanthone, thioxanthone, dimethylthioxanthone, diethylthioxanthone); cyanines (for example, thiacarbocyanine, oxacarbocyanine); merocyanines (for example, merocyanine, carbomerocyanine); rhodacyanines; oxonols; thiazines (for example, thionine, methylene blue, toluidine blue); acridines (for example, acridine orange, chloroflavine, acriflavine); acridones (for example, acridone, 10-butyl-2-chloroacridone); anthraquinones (for example, anthraquinone); squaryliums (for example, squarylium); styryls and styryl-based compounds (for example, 2-{2-[4-(dimethylamino)phenyl]ethenyl}benzoxazole); and coumarins (for example, 7-diethyl amino-4-methyl coumarin, 7-hydroxy-4-methylcoumarin, 2,3,6,7-tetrahydro-9-methyl-1H, 5H, 11H-[1]benzopyrano[6,7,8-i j]quinolizin-11-one).

Among these sensitizers, preferred are polynuclear aromatics, acridones, styryls and styryl-based compounds, and coumarins, and more preferred are polynuclear aromatics. Among polynuclear aromatics, most preferred are anthracene derivatives.

The photosensitive resin composition of the present invention contains the sensitizer in an amount of preferably 0 parts by mass to 1,000 parts by mass, more preferably 10 parts by mass to 500 parts by mass, and still more preferably 50 parts by mass to 200 parts by mass, based on 100 parts by mass of the photoacid generator in the photosensitive resin composition.

Also, the sensitizer may be used alone or in combination of two or more thereof.

<Other Components>

In addition to the components described above, if necessary, known additives such as an ultraviolet absorber, and a metal deactivator, an acid amplifier, a development accelerator, a plasticizer, a thermal radical generator, a thermal acid generator, a thickener, and an organic or inorganic suspending agent may be added to the photosensitive resin composition of the present invention. Moreover, regarding these compounds, reference may also be made to, for example, those described in paragraphs "0201" to "0224" of JP2012-88459A, the contents of which are incorporated herein by reference.

Acid Amplifier

In the photosensitive resin composition of the present invention, an acid amplifier may be used for the purpose of improving sensitivity.

The acid amplifier that can be used in the present invention is a compound that can further generate an acid by an acid catalytic reaction to increase the acid concentration in the reaction system and that is stably present in the absence of an acid.

Specific examples of the acid amplifier include the acid amplifiers described in paragraphs "0226" to "0228" of JP2011-221494A, the contents of which are incorporated herein by reference.

The content of the acid amplifier in the photosensitive resin composition is preferably 10 parts by mass to 1,000 parts by mass and more preferably 20 parts by mass to 500 parts by mass based on 100 parts by mass of the photoacid generator, from the viewpoint of dissolution contrast between the exposed area and the unexposed area.

[Development Accelerator]

The photosensitive resin composition of the present invention may contain a development accelerator.

Any compound having a development accelerating effect can be used as the development accelerator. The development accelerator is preferably a compound having at least one structure selected from the group consisting of a carboxyl group, a phenolic hydroxyl group, and an alkyleneoxy group, more preferably a compound having a carboxyl group or a phenolic hydroxyl group, and most preferably a compound having a phenolic hydroxyl group.

Description about the development accelerator can be found in paragraphs "0171" to "0172" of JP2012-042837A, the contents of which are incorporated herein by reference.

The development accelerators may be used alone or in combination of two or more thereof.

The amount of the development accelerator added to the photosensitive resin composition of the present invention is preferably 0 parts by mass to 30 parts by mass, more preferably 0.1 parts by mass to 20 parts by mass, and most preferably 0.5 parts by mass to 10 parts by mass based on 100 parts by mass of the solid content other than titanium black in the photosensitive resin composition, from the viewpoint of sensitivity and residual film ratio.

Furthermore, the molecular weight of the development accelerator is preferably 100 to 2,000, more preferably 150 to 1,500, and still more preferably 150 to 1,000.

[Plasticizer]

The resin composition of the present invention may contain a plasticizer.

Examples of the plasticizer include dibutyl phthalate, dioctyl phthalate, didodecyl phthalate, polyethylene glycol, glycerin, dimethyl glycerin phthalate, dibutyl stannate, dioctyl adipate, and triacetylglycerin.

The content of the plasticizer in the resin composition of the present invention is preferably 0.1 parts by mass to 30 parts by mass, and more preferably 1 part by mass to 10 parts by mass, based on 100 parts by mass of Component A.

Other additives that can be used include the thermal radical generators described in paragraphs "0120" to "0121" of JP2012-8223A; and the nitrogen-containing compounds and thermal acid generators described in WO2011/136074A; the contents of which are incorporated herein by reference.

<Method for Preparing Photosensitive Resin Composition>

The photosensitive resin composition is prepared by mixing individual components in predetermined proportions by a given method and dissolving them with stirring. For example, a resin composition may also be prepared by dissolving each component in a solvent to prepare a solution in advance and then mixing the solutions in predetermined proportions. The solution of the composition solution thus prepared can also be used after it has been filtered through a filter having a pore size of 0.2 μm or the like.

In the present invention, the photosensitive resin composition is particularly preferably prepared by preparing a titanium black dispersion containing (Component S) titanium black, (Component C) a solvent, and (Component E) a dispersant in advance, and adding the titanium black dispersion with Component A, Component B and Component D, and optional components.

(Method for Producing Resin Pattern)

A method for producing a resin pattern of the present invention will be described.

The method for producing a resin pattern of the present invention preferably includes the following steps (1) to (4), and more preferably the following steps (1) to (5).

(1) A coating step of coating a photosensitive resin composition of the present invention on a substrate;

(2) A solvent removal step of removing the solvent from the applied resin composition;

(3) An exposure step of patternwise exposing the resin composition from which the solvent has been removed, to actinic rays;

(4) A development step of developing the exposed resin composition and the unexposed resin composition using an aqueous developer; and (5) A heat-treating step of heat-treating the developed resin composition.

Hereinafter, the respective steps will be described in order.

In the coating step (1), a photosensitive resin composition of the present invention is preferably applied by coating on a substrate to form a wet film containing a solvent. Before the photosensitive resin composition is applied on the substrate, the substrate is preferably cleaned by alkaline cleaning, plasma cleaning, or the like, and after the substrate has been cleaned, the substrate is more preferably further surface-treated with hexamethyldisilazane. This treatment improves adhesion of the photosensitive resin composition to the substrate. The method by which the substrate surface is treated with hexamethyldisilazane is not particularly limited, but involves, for example, exposing the substrate to the vapor of hexamethyldisilazane or other means.

Examples of the substrate include an inorganic substrate, a resin substrate or a resin composite material substrate, an ITO substrate, a Cu substrate, and a plastic substrate such as a polyethylene terephthalate or cellulose triacetate (TAC) substrate.

Examples of the inorganic substrate include glass, quartz, silicone, and silicon nitride substrates, as well as composite substrates obtained by depositing the vapor of molybdenum, titanium, aluminum, copper, or the like on such substrates.

Examples of the resin substrate include substrates made of synthetic resins such as polybutylene terephthalate, polyethylene terephthalate, polyethylene naphthalate, polybutylene naphthalate, polystyrene, polycarbonate, polysulfone, polyethersulfone, polyallylate, allyl diglycol carbonate, polyamide, polyimide, polyamide-imide, polyetherimide, polybenzazol, polyphenylene sulfide, polycycloolefin, norbornene resins, fluororesins such as polychlorotrifluoroethylene, liquid crystal polymers, acrylic resins, epoxy resins, silicone resins, ionomer resins, cyanate resins, crosslinked fumaric acid diester resins, cyclic polyolefins, aromatic ether resins, maleimide-olefin resins, cellulose, and episulfide resins.

These substrates are rarely used as such, but a multilayer structure such as a TFT device is typically formed thereon depending on the form of the end products.

Among them, in the present invention, the whole or part of the surface of the substrate is preferably at least one selected from the group consisting of glass, SiO, ITO, IZO, a metal film, and a metal oxide film, and the whole or part of the surface of the substrate is particularly preferably ITO.

As a result of intensive study, the present inventors have found that the occurrence of development residues onto ITO is particularly significant in the case where the whole or part of the surface of the substrate is Indium Tin Oxide (ITO). The photosensitive resin composition of the present invention has a very significant effect capable of suppressing the occurrence of development residues even in the case where the whole or part of the surface of the substrate is ITO.

The method that can be used for coating the substrate is not particularly limited, but includes, for example, inkjet coating, slit coating, spray coating, roll coating, spin coating, flow coating, and slit-and-spin coating. Further, the so-called prewetting technique as described in JP2009-145395A can also be applied.

The coated film thickness is not particularly limited, and the coating can be applied in any thickness depending on the purposes, but it is preferably used in a thickness ranging from 0.5 μm to 10 μm.

The inkjet coating exhibits a great reduction of a coating solution amount to be used, reduced influence of adhering mist, or the like during spin coating, and thus suppression of foreign matter generation as compared to a conventional coating method such spin coating or slit coating, and is therefore preferable from the overall point of view.

For example, the inkjet coating conditions may be suitably selected depending on the composition of the photosensitive resin composition, the type of a coating film to be produced, and the like. The ejection volume of a liquid photosensitive resin composition or the number of times of ejecting a liquid photosensitive resin composition into the same portion may be adjusted in order to control the thickness of a coating film. In addition, the shape and position of applying the photosensitive resin composition may also be appropriately selected, if desired. The apparatus used for the inkjet coating is not particularly limited and a known inkjet coating apparatus may be applied.

Specific examples of the inkjet coating apparatus include on-demand inkjet coating apparatuses IJ-DESK-S and IJ-DESK-H (manufactured by PMT Corporation), and Dimatix Material printers DMP2831 and DMP-3000 (manufactured by FUJIFILM Dimatix Inc.)

The inkjet recording apparatus that can be used in the inkjet coating method is not particularly limited, and any known inkjet recording apparatus that can achieve an intended resolution may be used. That is, any known inkjet recording apparatus including commercially available products may be used to carry out inkjet coating of the photosensitive resin composition of the present invention onto the substrate in the coating step.

The inkjet recording apparatus that can be used in the present invention is equipped with, for example, a composition supply system and a temperature sensor.

The ink supply system comprises, for example, a main tank containing the photosensitive resin composition of the present invention, a supply pipe, a composition supply tank immediately before an inkjet head, a filter, and a piezo-type inkjet head. The piezo-type inkjet head may be driven so as to eject a multisize dot of preferably 1 pL to 100 pL, and more preferably 8 pL to 30 pL, at a resolution of preferably 320×320 dots per inch (dpi) to 4,000×4,000 dpi, more preferably 400×400 dpi to 1,600×1,600 dpi, and still more preferably 720×720 dpi. The term "dpi" as used herein refers to the number of dots per 2.54 cm.

The coated film thickness is not particularly limited, and the coating can be applied in any thickness depending on the purposes, but it is preferably used in a thickness ranging from 0.5 μm to 10 μm.

In the solvent removal step (2), the solvent is preferably removed from the coating applied as described above by depressurization (vacuum) and/or heating to form a dried coating film on the substrate. Heating conditions during the solvent removal step preferably involve 70° C. to 130° C. for about 30 seconds to 300 seconds. When the temperature and the period are in the ranges defined above, favorable adhesion of patterns is achieved and residues can be further reduced.

Further, the coating step (1) and the solvent removal step (2) may be performed in this order, or may be performed simultaneously, or may be repeated alternately. For example, the solvent removal step (2) may be performed after the inkjet coating in the coating step (1) has been completed, or alternatively the substrate is heated, and the solvent removal may be performed while performing the discharge of the photosensitive resin composition by an inkjet coating method in the coating step (1).

Among them, it is preferred to perform the solvent removal step (2) after the completion of the inkjet coating in the coating step (1).

In the exposure step (3), the coated substrate is preferably irradiated with actinic rays through a mask having a desired pattern. In this step, the photoacid generator decomposes to generate an acid. The acid-decomposable group contained in the coating film components is hydrolyzed by catalytic action of the generated acid to produce an acid group, for example, a carboxyl group or a phenolic hydroxyl group.

The exposure light source of actinic rays that can be used includes a low pressure mercury lamp, a high pressure mercury lamp, a ultra-high pressure mercury lamp, a chemical lamp, an LED light source, an excimer laser generator, and the like, and actinic rays having a wavelength of 300 nm to 450 nm can be preferably used such as g-line (436 nm), i-line (365 nm), h-line (405 nm), or the like. Further, the irradiation light may be adjusted through a spectral filter such as a long-wavelength cut filter, a short-wavelength cut filter, or a bandpass filter as appropriate.

Exposure systems that can be used include various types of exposure systems such as a mirror projection aligner, a stepper, a scanner, a proximity system, a contact system, a microlens array, a laser exposure system, and the like.

To accelerate the hydrolysis reaction in regions where the acid catalyst has been generated, the post-exposure bake (hereinafter sometimes referred to as "PEB") can be performed. PEB can promote the production of a carboxyl group or phenolic hydroxyl group from the acid-decomposable group. The temperature at which PEB takes place is preferably 30° C. to 130° C., more preferably 40° C. to 110° C., and particularly preferably 50° C. to 100° C.

However, PEB may not necessarily take place but a positive image can be formed by development because the acid-decomposable group in the present invention has a low activation energy for acid decomposition so that it is readily decomposed by the acid derived from the acid generator via exposure to produce an acid group, for example, a carboxyl group or a phenolic hydroxyl group.

In the developing step (4), the copolymer containing the released acid group, for example, carboxyl group or phenolic hydroxyl group is preferably developed with an alkaline developer. The exposed areas containing the resin composition containing the acid group, for example, carboxyl group or phenolic hydroxyl group readily soluble in the alkaline developer are removed, whereby a positive image is formed.

The developer used in the developing step preferably includes a basic compound. Examples of the basic compound that can be used include aqueous solutions of alkali metal hydroxides such as lithium hydroxide, sodium hydroxide, and potassium hydroxide; alkali metal carbonate salts such as sodium carbonate, and potassium carbonate; alkali metal bicarbonate salts such as sodium bicarbonate, and potassium bicarbonate; ammonium hydroxides such as tetramethylammonium hydroxide, tetraethylammonium hydroxide, and choline hydroxide; sodium silicate, and sodium metasilicate. Further, aqueous solutions of the basic compounds described above further containing appropriate amounts of water-soluble organic solvents such as methanol or ethanol and surfactants can also be used as developers.

A preferred developer may be, for example, a 0.4 mass % aqueous solution, a 0.5 mass % aqueous solution, a 0.7 mass % aqueous solution or a 2.38 mass % aqueous solution of tetraethylammonium hydroxide.

The pH of the developer is preferably 10.0 to 14.0.

The developing time is preferably 30 seconds to 500 seconds, and any developing methods such as puddle process, dipping, and the like may be applied. Development is followed by washing with running water for 30 seconds to 300 seconds, whereby a desired pattern can be formed.

Development may be followed by a rinsing step. During the rinsing step, the substrate after development is rinsed with pure water or the like to remove the developer deposited on it and post-development residues. Known rinsing methods can be used. For example, shower rinsing, dip rinsing, and the like can be applied.

In the heat treatment step (postbaking) (5), the positive image thus formed is heated so that the acid-decomposable group is thermally decomposed to produce an acid group, for example a carboxyl group or a phenolic hydroxyl group, which can be crosslinked with a crosslinkable group, a crosslinking agent or the like to form a cured film. This heating preferably takes place using a heater such as a hot plate or an oven at a predetermined temperature such as 180° C. to 250° C. for a predetermined period such as 5 minutes to 90 minutes on a hot plate or 30 minutes to 120 minutes in an oven. Such a crosslinking reaction is allowed to proceed, whereby protective layers or interlayer insulating layers having higher heat resistance, hardness, and the like can be formed. Further, transparency can be further improved by performing the heat treatment under a nitrogen atmosphere. When a plastic substrate is used, the heat treatment is preferably performed at a temperature of 80° C. to 140° C. for 5 minutes to 120 minutes.

In addition, in the case where the substrate is mainly composed of glass, the heat treatment step (postbaking) is preferably performed at a predetermined temperature such as 120° C. to 250° C. and more preferably 140° C. to 220° C. for a predetermined period such as 5 minutes to 90 minutes on a hot plate or 30 minutes to 120 minutes in an oven.

The heat treatment step (postbaking) may be preceded by baking at a relatively low temperature (addition of an intermediate baking step). The intermediate baking step preferably includes heating at 90° C. to 150° C. for 1 minute to 60 minutes followed by postbaking at a high temperature of 200° C. or higher, if such a step is applied. Alternatively, intermediate baking and postbaking may be performed by heating in three or more stages. The taper angles of patterns can be adjusted by specially designing the intermediate baking and postbaking steps in this way. These heating steps can be performed by using a known heating method such as a hot plate, oven, infrared heater, or the like.

Alternatively, postbaking may be preceded by wholly re-exposing the patterned substrate to actinic rays (post-exposure), whereby an acid can be generated from the photoacid generator present in unexposed areas to serve as a catalyst for promoting the crosslinking process, thus promoting the curing reaction of the film. When the post-exposure step is included, the exposure dose is preferably 100 mJ/cm$^2$ to 3,000 mJ/cm$^2$, and particularly preferably 100 mJ/cm$^2$ to 500 mJ/cm$^2$.

Further, the cured film obtained from the photosensitive resin composition of the present invention can also be used as a dry etching resist. In the case where the cured film obtained by thermal curing through the postbaking step is used as a dry etching resist, the cured film can be subjected to dry etching processes such as ashing, plasma etching, ozone etching, and the like.

(Cured Film)

The cured film of the present invention is a film obtained by curing the photosensitive resin composition of the present invention.

The cured film of the present invention can be suitably used as a light-shielding color filter. Further, the cured film of the present invention is preferably a film obtained by the method for producing a cured product according to the present invention or the method for producing a resin pattern according to the present invention, and more preferably a film obtained by the method for producing a resin pattern according to the present invention.

(Cured Product and Production Method Thereof)

The cured product of the present invention is a cured product obtained by curing the photosensitive resin composition of the present invention, and as described above, the shape thereof may not be a film and may be of any shape.

Further, the cured product of the present invention may be at least a cured product whose hardness has been increased by removing at least a portion of the solvent from the photosensitive resin composition of the present invention, but is preferably a cured product obtained by removing the solvent from the photosensitive resin composition of the present invention and subjecting the solvent-free photosensitive resin composition to heat curing.

The method for producing a cured product according to the present invention is not particularly limited, but preferably includes at least the following Steps (a) to (c) in this order.

(a) a coating step of applying the photosensitive resin composition of the present invention onto a substrate;

(b) a solvent removal step of removing a solvent from the applied resin composition; and (c) a heat treatment step of heat-treating the resin composition freed from the solvent, or an exposure step of irradiating the resin composition freed from the solvent with actinic rays.

Step (a) and Step (b) are as defined in the above-mentioned coating step and the above-mentioned solvent removal step, respectively and preferred embodiments thereof are also the same.

The heat treatment step in Step (c) is the same step as the above-mentioned heat treatment step, except that an object to be heat treated is the solvent-removed resin composition obtained in Step (b), and a preferred embodiment of heating temperature, heating time, heating means, or the like in the above-mentioned heat treatment step is likewise preferred.

The exposure step in Step (c) is the same step as the above-mentioned exposure step, except that the exposure may not be performed in a patternwise manner. The exposure step in Step (c) is preferred to perform entire exposure of one surface of the resin composition from which the solvent has been removed.

In addition, the cured product of the present invention is preferably a cured product obtained by the method for producing a resin pattern according to the present invention.

The cured product of the present invention can be suitably used for a color filter in a liquid crystal display device or an organic EL device or the like, an insulating film in a liquid crystal display device, a spacer for maintaining a constant thickness of a liquid crystal layer, a structural member of a Micro Electro Mechanical Systems (MEMS) device, and electronic materials of an antireflection film or the like of various substrates and wirings.

(Shielding Film Provided on Light-Shielding Color Filter and Infrared Cut Filter, as Well as Solid-State Imaging Device)

The light-shielding color filter of the present invention is a light-shielding color filter obtained by curing the photosensitive resin composition of the present invention, and preferably a light-shielding color filter produced by the method for producing a resin pattern according to the present invention.

The light-shielding color filter of the present invention is formed by using the cured film of the present invention. The light-shielding color filter formed by using the cured film of the present invention exhibits excellent light-shielding properties.

The infrared cut filter of the present invention includes a light-shielding film (cured film) obtained by curing the photosensitive resin composition of the present invention. The light-shielding film provided on the infrared cut filter of the present invention is preferably formed by the method for producing a resin pattern. Such a light-shielding film exhibits excellent light-shielding properties.

Further, the infrared cut filter may be any substrate having an infrared cut function and the substrate is preferably a glass substrate (a substrate mainly composed of glass). According to the light-shielding film of the present invention, it is possible to obtain sufficient adhesion and it is possible to achieve high resolution even in the case of a glass substrate.

The light-shielding color filter of the present invention is suitably used as a black matrix.

The film thickness of the black matrix is not particularly limited, but is preferably 0.2 µm to 10 µm, more preferably 0.4 µm to 5 µm, and still more preferably 0.6 µm to 5 µm in terms of post-drying film thickness, from the viewpoint of more effectively obtaining the effects of the present invention.

The line width of the black matrix is not particularly limited, but is preferably 0.5 µm to 500 µm, more preferably 0.7 µm to 20 µm, and still more preferably 1.0 µm to 5 µm.

In the case where applied to an infrared cut filter (in particular, a glass substrate), the line width of the light-shielding film according to the present invention is not particularly limited, but is preferably 0.5 µm to 500 µm or less, more preferably 0.7 µm to 100 µm or less, and still more preferably 1.0 µm to 50 µm or less.

Since the light-shielding color filter of the present invention is formed using the photosensitive resin composition of the present invention, the formed colored pattern exhibits high adhesion to a support substrate, exhibits satisfactory adhesion of the exposed portion to a substrate due to excellent exposure sensitivity because the cured composition is excellent in development resistance, and is capable of forming a high resolution pattern giving a desired sectional shape.

Therefore, the light-shielding color filter of the present invention can be suitably used for liquid crystal display devices and solid image pickup elements such as CCD, and solid-state imaging devices, and is particularly suitable for FHD or higher resolution smart phones and CCD elements or CMOS of high resolution, which may contain more than five million pixels. That is, the light-shielding color filter of the present invention is preferably applied to liquid crystal display devices, organic EL display devices and solid-state imaging devices.

In addition, the light-shielding film of the infrared cut filter of the present invention is not particularly limited, except that the light-shielding film is obtained by curing the photosensitive resin composition of the present invention. The infrared cut filter including a light-shielding film of the present invention can be suitably used in solid-state imaging devices.

The solid-state imaging device of the present invention is characterized by including the cured product of the present invention.

The solid-state imaging device of the present invention is not particularly limited except that the solid-state imaging device has a light-shielding color filter, a light-shielding film or the like formed by using the photosensitive resin composition of the present invention, and examples thereof include known solid-state imaging devices having various structures.

Examples of the infrared cut filter and solid-state imaging device include those described in the claims of JP2014-132333A and JP2014-132644A.

(Liquid Crystal Display Device)

The liquid crystal display device of the present invention is characterized by including a cured film of the present invention.

The liquid crystal display device of the present invention is not particularly limited except that the liquid crystal display device has a light-shielding color filter or an insulating film formed by using the photosensitive resin composition of the present invention, and examples thereof include known liquid crystal display devices having various structures.

For example, specific examples of a Thin-Film Transistor (TFT) included in the liquid crystal display device of the present invention include an amorphous silicon-TFT, a low temperature polysilicon-TFT, and an oxide semiconductor TFT. The cured film of the present invention has excellent electrical properties and thus can preferably be used in combination with these TFTs.

Further, liquid crystal driving modes that can be employed by the liquid crystal display device of the present invention include Twisted Nematic (TN) mode, Vertical Alignment (VA) mode, In-Plane-Switching (IPS) mode, Fringe Field Switching (FFS) mode, Optically Compensated Bend (OCB) mode, and the like.

The cured film of the present invention can also be used in a liquid crystal display device having a Color Filter on Array (COA) mode-based panel architecture. For example, the cured film of the present invention can be used as an organic insulating layer (115) described in JP2005-284291A or an organic insulating layer (212) described in JP2005-346054A.

Specific alignment methods of the liquid crystal orientation film that may be employed in the liquid crystal display device of the present invention specifically include rubbing alignment, photo-alignment, and the like. Furthermore, a polymer alignment support may also be formed by the Polymer Sustained Alignment (PSA) technique described in JP2003-149647A or JP2011-257734A.

(Organic EL Display Device)

The organic EL display device of the present invention is characterized by including a cured product of the present invention.

The organic EL display device of the present invention is not particularly limited except that the organic EL display device has a planarization film or an interlayer insulating film formed by using the photosensitive resin composition of the present invention, and examples thereof include known various organic EL display devices and liquid crystal display devices having various structures.

For example, specific examples of a Thin-Film Transistor (TFT) included in the organic EL display device of the present invention include an amorphous silicon-TFT, a low temperature polysilicon-TFT, and an oxide semiconductor TFT. The cured film of the present invention has excellent electrical properties and thus can preferably be used in combination with these TFTs.

EXAMPLES

The present invention will be described in more detail with reference to the following Examples. The materials, amounts used, proportions, process details, procedures, and the like shown in the following Examples can be changed as appropriate without departing from the spirit of the present invention. Thus, the scope of the present invention is not limited to the specific Examples shown below. Unless otherwise specified, the "parts" and "%" are based on mass.

Furthermore, the crosslinkable group equivalent in Examples was measured by the method described above.

In the following Synthesis Examples, the following abbreviations mean the compounds below, respectively.

MATHF: Tetrahydrofuran-2-yl methacrylate (synthetic)

MAEVE: 1-Ethoxyethyl methacrylate (manufactured by Wako Pure Chemical Industries, Ltd.)

MACHOE: 1-(cyclohexyloxy) ethyl methacrylate (synthetic)

MATHP: Tetrahydro-2H-pyran-2-yl methacrylate (manufactured by Shin-Nakamura Chemical Industry Co., Ltd.)

PHSEVE: 1-Ethoxyethyl ether of p-hydroxystyrene (synthetic)

PHSTHF: Tetrahydrofuranyl ether of p-hydroxystyrene (synthetic)

PHSt-Bu: t-Butyl ether of p-hydroxystyrene (which was synthesized according to a conventional method of reacting p-hydroxystyrene with isobutene in the presence of an acid catalyst)

MAA: Methacrylic acid (manufactured by Wako Pure Chemical Industries, Ltd.)

MMA: Methyl methacrylate (manufactured by Wako Pure Chemical Industries, Ltd.)

St: styrene (manufactured by Wako Pure Chemical Industries, Ltd.)

DCPM: Dicyclopentanyl methacrylate (Hitachi Chemical Co., Ltd.)

HEMA: 2-Hydroxyethyl methacrylate (manufactured by Wako Pure Chemical Industries, Ltd.)

PHS: p-Hydroxystyrene (manufactured by Wako Pure Chemical Industries, Ltd.)

V-65: 2,2'-azobis(2,4-dimethylvaleronitrile) (manufactured by Wako Pure Chemical Industries, Ltd.)

PGMEA: Propylene glycol monomethyl ether acetate (manufactured by Showa Denko KK methoxypropyl acetate)

MATHF was synthesized in accordance with Synthesis Example described in paragraph "0187" of JP2013-80203A.

MACHOE was synthesized in the same manner as in MATHF, except that 2-dihydrofuran was changed to the corresponding compound.

PHSEVE was synthesized in the same manner as in MATHF, except that 2-dihydrofuran was changed to the corresponding compound and methacrylic acid was changed to 4-hydroxystyrene, in the synthesis method of MATHF.

PHSTHF was synthesized in the same manner as in MATHF, except that methacrylic acid was changed to 4-hydroxystyrene, in the synthesis method of MATHF.

<Synthesis of Polymer P-1>

PGMEA was charged into a three-neck flask and the temperature was raised to 90° C. under a nitrogen atmosphere. 0.65 molar equivalents of MATHF, 0.10 molar equivalents of MAA, 0.10 molar equivalents of MMA, 0.05 molar equivalents of St, 0.10 molar equivalents of HEMA, and V-65 (corresponding to 4 mol % based on the total 100 mol % of the total monomer components) were dissolved in the solution, followed by dropwise addition over 2 hours. After the completion of dropwise addition, the reaction solution was stirred for 2 hours, and the reaction was terminated. Therefore, a polymer P-1 was obtained. Further, the ratio of the total amount of PGMEA:other ingredients was set to 60:40. In other words, a polymer solution having a solid content concentration of 40% was prepared.

<Synthesis of Polymers P-2 to P-10>

Other polymers were respectively synthesized in the same manner as in the synthesis of the polymer P-1, except that the types of monomers used and the like were changed to those as shown in Table 1.

TABLE 1

|  |  |  | P-1 | P-2 | P-3 | P-4 | P-5 | P-6 |
|---|---|---|---|---|---|---|---|---|
| Monomer component | Ingredients of Constitutional Unit (a1) | MATHF | 65 | — | — | — | — | — |
|  |  | MAEVE | — | 65 | — | — | — | — |
|  |  | MACHOE | — | — | 65 | — | — | — |
|  |  | MATHP | — | — | — | 65 | — | — |
|  |  | PHSEVE | — | — | — | — | 40 | — |
|  |  | PHSTHF | — | — | — | — | — | 40 |
|  |  | PHSt-Bu | — | — | — | — | — | — |
|  | Constitutional Unit (a3) | MAA | 10 | — | 10 | 5 | — | — |
|  |  | MMA | 10 | 10 | — | 10 | — | — |
|  | Additional ingredients | St | 5 | 10 | 10 | 10 | — | — |
|  |  | DCPM | — | 5 | 5 | 5 | — | — |
|  |  | HEMA | 10 | 10 | 10 | 5 | — | — |
|  |  | PHS | — | — | — | — | 60 | 60 |
| Weight average molecular weight |  |  | 15,000 | 13,000 | 15,000 | 14,000 | 15,000 | 14,000 |
| Solvent |  |  | PGMEA |  |  |  |  |  |
| Solid content concentration |  |  | 40 |  |  |  |  |  |

|  |  |  | P-7 | P-8 | P-9 | P-10 |
|---|---|---|---|---|---|---|
| Monomer component | Ingredients of Constitutional Unit (a1) | MATHF | — | — | — | — |
|  |  | MAEVE | — | — | 65 | — |
|  |  | MACHOE | — | — | — | — |
|  |  | MATHP | — | — | — | — |
|  |  | PHSEVE | — | 40 | — | — |
|  |  | PHSTHF | — | — | — | — |
|  |  | PHSt-Bu | 40 | — | — | — |
|  | Constitutional Unit (a3) | MAA | — | — | 5 | 15 |
|  |  | MMA | — | — | 5 | 45 |
|  | Additional ingredients | St | — | — | 20 | 10 |
|  |  | DCPM | — | — | 5 | 10 |
|  |  | HEMA | — | — | — | 20 |
|  |  | PHS | 60 | 60 | — | — |
| Weight average molecular weight |  |  | 16,000 | 15,000 | 15,000 | 16,000 |
| Solvent |  |  | PGMEA |  |  |  |
| Solid content concentration |  |  | 40 |  |  |  |

<Synthesis of Specific Resin 1>

600.0 parts of ε-caprolactone and 22.8 parts of 2-ethyl-1-hexanol were introduced into a three-neck flask and dissolved with stirring while blowing nitrogen. 0.1 parts of monobutyltin oxide were added thereto, followed by heating to 100° C. After 8 hours, the disappearance of the raw materials was confirmed by gas chromatography, followed by cooling to 80° C. After addition of 0.1 parts of 2,6-di-t-butyl-4-methylphenol, 27.2 parts of 2-methacryloyloxyethyl isocyanate were added. After 5 hours, the disappearance of the raw materials was confirmed by $^1$H-NMR, followed by cooling to room temperature (25° C.), thus giving 200 parts of a solid precursor M1. $^1$H-NMR, IR, and mass spectrometry revealed that the chemical structure is M1.

50.0 parts of Precursor M1, 50.0 parts of 4-vinyl benzoic acid, 2.3 parts of dodecyl mercaptan, and 233.3 parts of propylene glycol monomethyl ether acetate were introduced into a nitrogen-substituted three-neck flask, stirred with a stirrer (Three-One Motor, manufactured by Shinto Science Co., Ltd.), and heated up to 75° C. while nitrogen is blown into the flask. 0.2 parts of dimethyl 2,2'-azobis(2-methylpropionate) (V-601 manufactured by Wako Pure Chemical Industries, Ltd.) were added thereto, and the mixture was heated and stirred at 75° C. for 2 hours. After 2 hours, 0.2 parts of V-601 were further added, and the mixture was heated and stirred for 3 hours to give a 30 mass % solution of a specific resin 1 having the following structure: (x:y (mass %)=50:50).

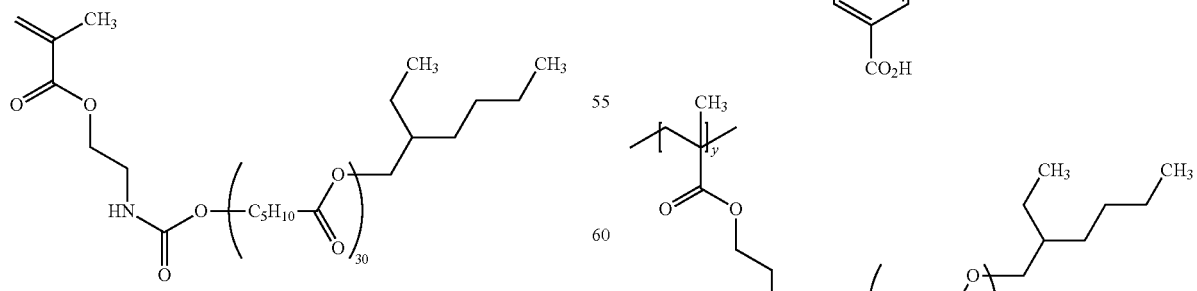

Precursor M1

Specific resin 1

<Preparation of Titanium Black Dispersion>

The following composition 1 was subjected to a high viscosity dispersion treatment using two rolls, thereby obtaining a dispersion. Prior to the high viscosity dispersion treatment, the composition was kneaded for 30 minutes using a kneader.

—Composition 1—

Titanium black: 35 parts
(average primary particle size: 75 nm, trade name: 13M-C, manufactured by Mitsubishi Materials Corp.)
Propylene glycol monomethyl ether acetate (PGMEA): 65 parts The following composition 2 was added to the obtained dispersion, and the mixture was stirred for 3 hours using a homogenizer under the conditions of 3,000 rpm. The resulting mixed solution was subjected to a dispersion treatment for 4 hours in a dispersing machine (trade name: DISPERMAT, manufactured by GETZMANN), using zirconia beads having a diameter of 0.3 mm. A titanium black dispersion liquid A (hereinafter, indicated as TB dispersion liquid A) was thus obtained.

—Composition 2—

30 mass % solution of specific resin 1 in propylene glycol monomethyl ether acetate: 30 parts <Production of Titanium Black Dispersion Liquid B>

—Preparation of Titanium Black T-1—

100 g of titanium oxide MT-150A (trade name, manufactured by Tayca Corporation) having an average particle diameter of 15 nm, 25 g of silica particles AEROGIL (registered trademark) 300/30 having a BET specific surface area of 300 m$^2$/g (manufactured by Evonik Industries AG), and 100 g of a dispersant DISPERBYK190 (trade name: manufactured by BYK-Chemie GmbH) were weighed out, 71 g of ion exchange water was added thereto, and the resultant mixture was treated for 20 minutes using a MAZERSTAR KK-400W (manufactured by Kurabo Industries Ltd.) at an orbital rotation number of 1,360 rpm and a spin rotation number of 1,047 rpm, as a result of which a uniform mixture aqueous solution was obtained. This aqueous solution was filled into a quartz container, and heated under an oxygen atmosphere at 920° C. using a small Rotary kiln (manufactured by Motoyama Co., Ltd.). Then, the atmosphere was replaced with nitrogen, and nitridation reduction treatment was carried out by flowing an ammonia gas at 100 mL/min at 920° C. for 5 hours. After completion of the nitridation reduction treatment, the recovered powder was ground with a mortar, as a result of which a powdery titanium black T-1 containing Si atoms and having a specific surface area of 73 m$^2$/g [dispersion containing titanium black particles and Si atoms] was obtained.

The ingredients listed in the following composition 3 were mixed using a stirrer (EUROSTAR, manufactured by IKA Laboratory) for 15 minutes to obtain a dispersion "a".

In addition, the polymer compound described below (X1) was synthesized with reference to the description of JP2013-249417A. In the formulae of the polymer compound (X1), x is 30 mass %, y is 20 mass %, and z is 50 mass %. The polymer compound (X1) has a weight average molecular weight of 30,000 and an acid value of 60 mgKOH/g, and the number of atoms of the graft chain (excluding hydrogen atoms) is 117.

—Composition 3—

Titanium black T-1 obtained as described above: 25 parts by mass 30 mass % solution of propylene glycol monomethyl ether acetate of polymer compound (X1): 25 parts by mass Propylene glycol monomethyl ether acetate (PGMEA) (solvent): 50 parts by mass Polymer compound (X1)

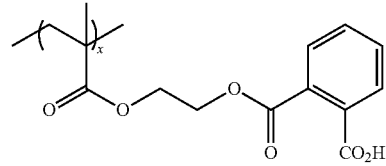

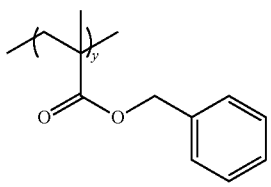

CLogP: 2.87

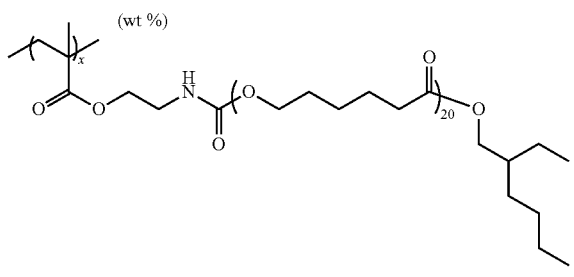

The resultant dispersion "a" was subjected to a dispersion treatment using an NPM Pilot (manufactured by Shinmaru Enterprises Corp.) under the following conditions, and thereby a titanium black dispersion liquid B was obtained.

(Dispersion Conditions)

Bead diameter: φ 0.05 mm

Beads filling rate: 65 volume %

Mill peripheral speed: 10 m/sec

Separator peripheral speed: 11 m/s

Amount of mixture liquid to be subjected to dispersion treatment: 15.0 g

Circulation flow rate (pump feed rate): 60 kg/hour

Temperature of liquid being treated: 20° C. to 25° C.

Cooling water: tap water, 5° C.

Inner volume of bead mill annular passage: 2.2 L

Number of passes: 84 passes

<Carbon Black Dispersion Liquid>

A carbon black dispersion liquid having the following composition was used.

Carbon black (Nipex35, manufactured by Degussa): 13.1%

Dispersant 1 below: 0.65%

Polymer (random copolymer of benzyl methacrylate/methacrylic acid=72/28 molar ratio, molecular weight 37,000): 6.72%

Propylene glycol monomethyl ether acetate: 79.53%

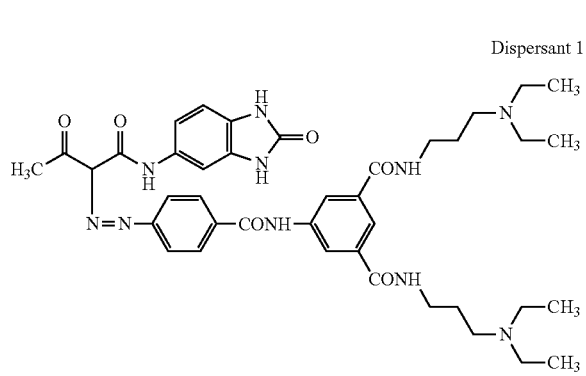

Dispersant 1

Example 1

<Preparation of Photosensitive Resin Composition>

The components of the composition shown in Table 2 were blended and mixed to form a homogeneous solution which was then filtered through a polyethylene filter having a pore size of 0.2 μm to prepare a photosensitive resin composition of Example 1 (solid content: 25%). The resulting photosensitive resin composition was subjected to various evaluations described below. The evaluation results are shown in Table 2 below. The numerical values of the blended amounts in Table 2 indicate parts by mass of the solid content.

Examples 2 to 11 and Comparative Examples 1 to 7

Each of photosensitive resin compositions of Examples 2 to 11 and Comparative Examples 1 to 7 was prepared in the same manner as in Example 1, except that the composition in Example 1 was changed to the composition shown in Table 2 below.

<Evaluation>

The thus obtained respective photosensitive resin compositions of Examples 1 to 11 and Comparative Examples 1 to 7 were evaluated as follows. The evaluation results are shown in Table 3.

—Optical Density Evaluation—

Each of the photosensitive resin compositions obtained in Examples and Comparative Examples was spin coated on a glass substrate at arbitrary rotating speed, followed by removal of a solvent, and subjected to firing at 250° C. for 1 hour to prepare a fired film (solid film). An Optical Density (OD) value of the fired film was measured using a transmission densitometer (BMT-1, manufactured by Sakata Inx Engineering Co., Ltd.). In addition, the film thickness was measured. A value obtained by dividing the OD value by the film thickness (OD value/μm) was defined as the evaluation value.

The evaluation values are ranked as follows.

A 4.0 or more
B 3.5 or more and less than 4.0 (this level or higher is a practical level)
C 3.0 or more and less than 3.5
D 2.5 or more and less than 3.0
E less than 2.5

—Surface Strength Evaluation—

A fired film was prepared in the same manner as in "Optical Density Evaluation" and subjected to a pencil hardness test (JIS K5600-5-4 (ISO/DIN 15184)). The pencil hardness was defined as the evaluation value. The evaluation values are ranked as follows.

A 5H or higher
B 3H to 4H
C 1H to 2H (this level or higher is a practical level)
D B to HB
E 2B or lower

TABLE 2

|  | (Component A) Polymer | | (Component B) Photoacid generator | | (Component S) Titanium black | | (Component D) Crosslinking agent | | (Component F) Basic compound Type |
|---|---|---|---|---|---|---|---|---|---|
|  | Type | Amount added | Type | Amount added | Type | Amount added | Type | Amount added |  |
| Example 1 | P-1 | 100 | B-5 | 2 | S-1 | 150 | D-1 | 10 | F-4 |
| Example 2 | P-2 | 100 | B-4 | 2 | S-1 | 150 | D-2 | 10 | F-5 |
| Example 3 | P-3 | 100 | B-2 | 2 | S-1 | 150 | D-3 | 10 | F-4 |
| Example 4 | P-3 | 100 | B-3 | 2 | S-1 | 150 | D-4 | 10 | F-5 |
| Example 5 | P-4 | 100 | B-1 | 2 | S-1 | 150 | D-5 | 10 | F-5 |
| Example 6 | P-5 | 100 | B-5 | 2 | S-1 | 150 | D-6 | 10 | F-5 |
| Example 7 | P-6 | 100 | B-4 | 2 | S-1 | 150 | D-7 | 10 | F-4 |
| Example 8 | P-7 | 100 | B-3 | 2 | S-1 | 150 | D-8 | 10 | F-4 |
| Example 9 | P-7 | 100 | B-2 | 2 | S-1 | 150 | D-9 | 10 | F-4 |
| Example 10 | P-8 | 100 | B-1 | 2 | S-1 | 150 | D-10 | 10 | F-5 |
| Example 11 | P-9 | 100 | B-5 | 2 | S-1 | 150 | D-11 | 10 | F-5 |
| Comparative Example 1 | P-1 | 75 | B-5 | 2 | S-1 | 150 | D-11 | 10 | F-4 |
| Comparative Example 2 | P-3 | 300 | B-2 | 2 | S-1 | 150 | D-3 | 10 | F-4 |
| Comparative Example 3 | P-1 | 100 | B-1 | 2 | S-2 | 104 | D-1 | 10 | F-4 |
| Comparative Example 4 | P-1 | 100 | B-3 | 2 | S-1 | 150 | — | — | F-4 |
| Comparative Example 5 | P-10 | 100 | B-2 | 2 | S-2 | 104 | D-1 | 10 | F-4 |
| Comparative Example 6 | P-10 | 100 | B-1 | 2 | S-1 | 150 | D-1 | 10 | F-5 |
| Comparative Example 7 | P-10 | 100 | — | — | S-1 | 150 | D-11 | 40 | F-4 |

TABLE 2-continued

|  | (Component F) Basic compound Amount added | (Component G) Surfactant Type | (Component G) Surfactant Amount added | (Component C) Solvent Type | Other additives Type | Other additives Amount added | Crosslinkable group equivalent |
|---|---|---|---|---|---|---|---|
| Example 1 | 0.02 | W-1 | 0.02 | C-1 | — | — | 132 |
| Example 2 | 0.02 | W-1 | 0.02 | C-1 | — | — | 139 |
| Example 3 | 0.02 | W-1 | 0.02 | C-1 | — | — | 302 |
| Example 4 | 0.02 | W-1 | 0.02 | C-1 | — | — | 191 |
| Example 5 | 0.02 | W-1 | 0.02 | C-1 | Z-2 | 2 | 214 |
| Example 6 | 0.02 | W-1 | 0.02 | C-1 | — | — | 141 |
| Example 7 | 0.02 | W-1 | 0.02 | C-1 | — | — | 120 |
| Example 8 | 0.02 | W-1 | 0.02 | C-1 | — | — | 276 |
| Example 9 | 0.02 | W-1 | 0.02 | C-1 | — | — | 146 |
| Example 10 | 0.02 | W-1 | 0.02 | C-1 | Z-2 | 2 | 113 |
| Example 11 | 0.02 | W-1 | 0.02 | C-1 | — | — | 108 |
| Comparative Example 1 | 0.02 | W-1 | 0.02 | C-1 | — | — | 84 |
| Comparative Example 2 | 0.02 | W-1 | 0.02 | C-1 | — | — | 571 |
| Comparative Example 3 | 0.02 | W-1 | 0.02 | C-1 | Z-2 | 2 | 132 |
| Comparative Example 4 | 0.02 | W-1 | 0.02 | C-1 | — | — | — |
| Comparative Example 5 | 0.02 | W-1 | 0.02 | C-1 | — | — | 132 |
| Comparative Example 6 | 0.02 | W-1 | 0.02 | C-1 | Z-2 | 2 | 132 |
| Comparative Example 7 | 0.02 | W-1 | 0.02 | C-1 | Z-1 | 0.1 | 135 |

TABLE 3

|  | Optical density | Strength |
|---|---|---|
| Example 1 | A | A |
| Example 2 | A | A |
| Example 3 | B | C |
| Example 4 | B | B |
| Example 5 | B | B |
| Example 6 | A | A |
| Example 7 | A | A |
| Example 8 | B | B |
| Example 9 | B | A |
| Example 10 | B | A |
| Example 11 | B | A |
| Comparative Example 1 | (incapable of forming film) | |
| Comparative Example 2 | B | D |
| Comparative Example 3 | A | D |
| Comparative Example 4 | A | E |
| Comparative Example 5 | E | D |
| Comparative Example 6 | E | A |
| Comparative Example 7 | E | A |

Details of the abbreviations other than those described hereinbefore among the abbreviations set forth in Table 2 are as follows.

B-1: DTS-105 (Triarylsulfonium salt, manufactured by Midori Chemical Co., Ltd.)

B-2: CGI1397 (Compound below, manufactured by BASF Japan Co., Ltd.)

B-3: PAI-101 (Compound below, manufactured by Midori Kagaku Co., Ltd.)

B-4: Compound below

B-5: Compound below

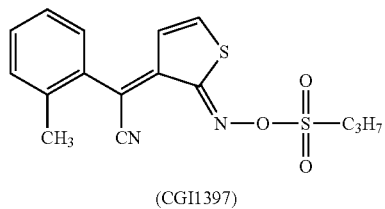

(CGI1397) B-2

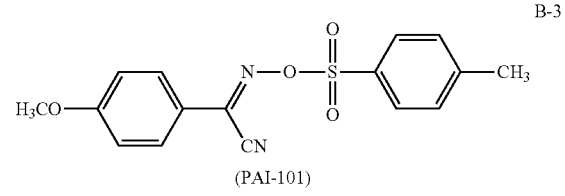

(PAI-101) B-3

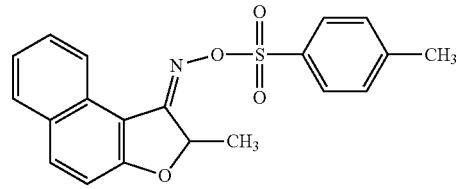

B-4

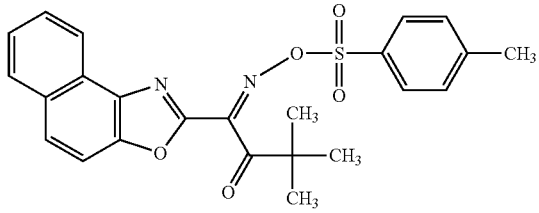

B-5

<Synthesis of Compound B-4>
The title compound was synthesized according to the method described in paragraph "0239" of JP2013-182077A.

<Synthesis of Compound B-5>
4.0 g of 1-amino-2-naphthol hydrochloride (manufactured by Tokyo Chemical Industry Co., Ltd.) was suspended in 16 g of N-methylpyrrolidone (manufactured by Wako Pure Chemical Industries, Ltd.), and 3.4 g of sodium hydrogen carbonate (manufactured by Wako Pure Chemical Industries, Ltd.) was added to the suspension. Then, 4.9 g of methyl 4,4-dimethyl-3-oxovalerate (manufactured by Wako Pure Chemical Industries, Ltd.) was added dropwise thereto and the mixture was heated for 2 hours at 120° C. under a nitrogen atmosphere. After allowing to cool, water and ethyl acetate were added to the reaction mixture to carry out liquid separation. The organic phase was dried over magnesium sulfate, filtered, and concentrated to give a crude B-5-2A. The crude B-5-2A was purified by silica gel column chromatography to give 1.7 g of an intermediate B-5-2A.

B-5-2A (1.7 g) and p-xylene (6 mL) were mixed, and 0.23 g of a p-toluenesulfonic acid monohydrate (manufactured by Wako Pure Chemical Industries, Ltd.) was added thereto, followed by heating at 140° C. for 2 hours. After allowing to cool, water and ethyl acetate were added to the reaction mixture to carry out liquid separation. The organic phase was dried over magnesium sulfate, filtered and concentrated to give a crude B-5-2B.

Tetrahydrofuran (THF) (2 mL) and a total volume of crude B-5-2B were mixed. Under ice cooling, 6.0 mL of a 2M hydrochloric acid/THF solution and then isopentyl nitrite (manufactured by Wako Pure Chemical Industries, Ltd.) (0.84 g) were added dropwise thereto and the mixture was warmed to room temperature (25° C.) and stirred for 2 hours. Water and ethyl acetate were added to the resulting reaction mixture to carry out liquid separation. The organic layer was washed with water, dried over magnesium sulfate, filtered and concentrated to give an intermediate crude B-5-2C.

A total volume of the intermediate crude B-5-2C was mixed with acetone (10 mL). Under ice cooling, triethylamine (manufactured by Wako Pure Chemical Industries, Ltd.) (1.2 g) and p-toluenesulfonyl chloride (manufactured by Tokyo Chemical Industry Co., Ltd.) (1.4 g) were added thereto and the mixture was warmed to room temperature and stirred for 1 hour. Water and ethyl acetate were added to the reaction mixture to carry out liquid separation. The organic phase was dried over magnesium sulfate, filtered and concentrated to give a crude B-5. The crude B-5 was re-slurried in cold methanol, filtered and dried to give a B-5 (1.2 g).

$^1$H-NMR spectrum (300 MHz, CDCl$_3$) of B-5 is as follows:

δ=8.5-8.4 (m, 1H), 8.0-7.9 (m, 4H), 7.7-7.6 (m, 2H), 7.6-7.5 (m, 1H), 7.4 (d, 2H), 2.4 (s, 3H), at 1.4 (s, 9H).

C-1: PGMEA (propylene glycol monomethyl ether acetate)
C-2: PGME (propylene glycol monomethyl ether)
C-3: Cyclohexanone
C-4: Cyclopentanone
C-5: Ethyl-3-ethoxypropionate
S-1: Titanium black dispersion liquid A described above
S-2: Carbon black dispersion liquid described above
S-3: Titanium black dispersion liquid B described above
D-1: γ-Glycidoxypropyltrimethoxysilane (KBM-403, manufactured by Shin-Etsu Chemical Co., Ltd.)
D-2: γ-Methacryloxypropyltrimethoxysilane (KBM-503, manufactured by Shin-Etsu Chemical Co., Ltd.)
D-3: Bis(triethoxysilylpropyl) tetrasulfide (KBE-846, manufactured by Shin-Etsu Chemical Co., Ltd.)
D-4: JER828 (Bisphenol-A epoxy resin, manufactured by Mitsubishi Chemical Holdings Co., Ltd.)
D-5: JER157S65 (Phenol novolac epoxy resin, manufactured by Mitsubishi Chemical Holdings Co., Ltd.)
D-6: CELLOXIDE 2021P (3',4'-Epoxycyclohexylmethyl-3,4-epoxycyclohexane carboxylate, manufactured by DAICEL CORPORATION)
D-7: 3-Ethyl-3-{[(3-ethyloxetane-3-yl) methoxy]methyl}oxetane (OXT-221, manufactured by Toagosei Co., Ltd.)
D-8: DURANATE 17B-60P (Blocked isocyanate compound, manufactured by Asahi Kasei Chemicals Co., Ltd.)
D-9: NIKALAC MW-100LM (Compound below; alkoxymethyl group-containing crosslinking agent, manufactured by Sanwa Chemical Co., Ltd.)

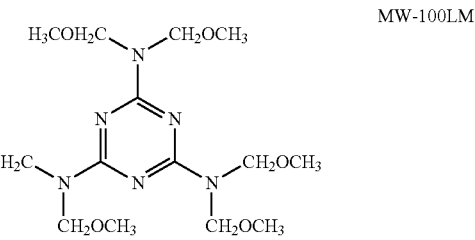

MW-100LM

D-10: DENACOL EX-321L (liquid aliphatic epoxy compound, manufactured by Nagase ChemteX Corporation)
D-11: DPHA (Dipentaerythritol hexaacrylate, KAYARAD DPHA manufactured by Nippon Kayaku Co., Ltd.)
D-12: γ-Methacryloxypropylmethyldimethoxysilane (KBM-502, manufactured by Shin-Etsu Chemical Co., Ltd.)
F-4: Diazabicyclononene (manufactured by Tokyo Chemical Industry Co., Ltd.)
F-5: N-cyclohexyl-N'-[2-(4-morpholinyl)ethyl]thiourea (CMTU, compound below, manufactured by TOYO KASEI Co., Ltd.)
F-6: N,N-dibutylaniline (manufactured by Tokyo Chemical Industry Co., Ltd.)
F-7: N,N-dicyclohexylmethylamine (manufactured by Wako Pure Chemical Industries, Ltd.)

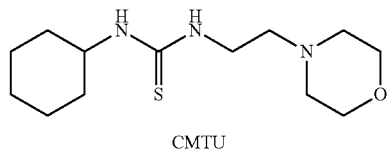 [SMILES: S=C(NCCN1CCOCC1)NC1CCCCC1]

CMTU

W-1: Perfluoroalkyl group-containing nonionic surfactant represented by the following structural formula (F-554, manufactured by DIC Corporation)
W-2: MEGAFAC F-781F (manufactured by DIC Corporation)

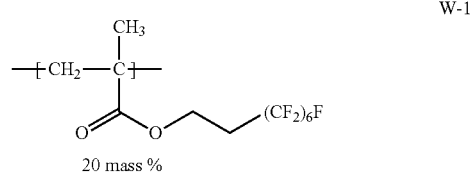

W-1

20 mass %

-continued

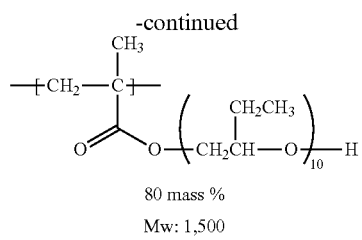

80 mass %

Mw: 1,500

Z-1: IRGACURE 369 (2-benzyl-2-dimethylamino-1-(4-morpholinophenyl)-1-butanone, radical polymerization initiator, manufactured by BASF Japan Ltd.)

Z-2: Dibutoxyanthracene having the following structure (sensitizer, manufactured by Kawasaki Kasei Chemicals Ltd.) in which Bu represents a butyl group.

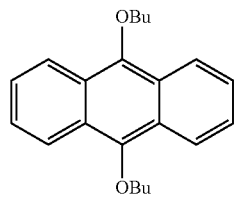

Example 12

<Preparation of Color Filter>

—Formation of Black Matrix—

The photosensitive resin composition prepared in Example 1 was applied onto a clean glass substrate at a coating speed of 120 mm/sec using a slit coater.

Next, the coated film was heated (pre-bake treatment) at 80° C. for 120 seconds using a hot plate, and then exposed at an exposure dose of 50 mJ/cm$^2$ using a proximity type exposure machine (model number LE5565A, manufactured by Hitachi High-Technologies Corporation).

Then, the exposed film was shower-developed with a 1.0% developer of a potassium hydroxide developer CDK-1 (manufactured by FUJIFILM Electronic Materials Co., Ltd.) for 50 seconds, and washed with pure water.

Then, the developed film was subjected to post-baking in a clean oven at 220° C. for 40 minutes, as a result of which a lattice-shaped black matrix substrate was formed having an opening of a colored pixel-forming region of 15 μm×45 μm, a black matrix thickness of 1.2 and a black matrix line width of about 5 μm.

—Preparation of Colored Composition—

A red photosensitive coloring composition coating liquid CR-1, a green photosensitive coloring composition coating liquid CG-1, and a blue photosensitive coloring composition coating liquid CB-1 were prepared according to the method described in paragraphs "0173" to "0185" of JP2009-199066A.

—Formation of Colored Pixel—

The obtained red photosensitive coloring composition coating liquid CR-1 was applied onto a black matrix-forming surface side of the black matrix substrate. Specifically, similar to the case of forming the black matrix, the coating liquid was applied at a coating speed of 100 mm/sec by adjusting a distance between the slits and the black matrix substrate, and an ejection amount of the coating liquid in such a manner that the layer thickness of the photosensitive color composition layer after the post-baking is about 2.1 μm.

—Colored Layer Pre-Baking Step, and Colored Layer Exposure Step—

Next, the coated film was heated at 100° C. for 120 seconds using a hot plate, and then exposed at an exposure dose of 90 mJ/cm$^2$ using a proximity type exposure machine.

Then, the exposed film was shower-developed with a 1.0% developer of a potassium hydroxide developer CDK-1 (manufactured by FUJIFILM Electronic Materials Co., Ltd.) at a shower pressure set to 0.2 MPa for 45 seconds, and washed with pure water.

Then, the developed film was post-baked in a clean oven at 220° C. for 30 minutes to form a heat-treated red pixel.

A green pixel, and a blue pixel were formed in the same manner as in the red pixel to thereby obtain a color filter.

The black matrix in the resulting color filter exhibited a thin film thickness, excellent light-shielding properties, and a high surface hardness.

Examples 13 to 22

Color filters were respectively prepared in the same manner as in Example 12, except that the photosensitive resin composition prepared in Example 1 was changed to each of the photosensitive resin compositions prepared in Examples 2 to 11.

Each black matrix in the resulting color filters exhibited a thin film thickness, excellent light-shielding properties, and a high surface hardness.

Examples 23 to 28

Photosensitive resin compositions of Examples 23 to 28 were respectively prepared in the same manner as in Example 1, except that the composition in Example 1 was changed to the composition described in Table 4 below.

The compositions of Examples 23 to 28 were subjected to surface hardness evaluation using the same method as in the test performed on the composition of Example 1. The evaluation results are shown in Table 5.

Any of the compositions provided a cured film having excellent light-shielding properties.

TABLE 4

|  | (Component A) Polymer | | (Component B) Photoacid generator | | (Component S) Titanium black | | (Component D) Crosslinking agent | | (Component F) |
|---|---|---|---|---|---|---|---|---|---|
|  | Type | Amount added | Type | Amount added | Type | Amount added | Type | Amount added | Basic compound Type |
| Example 23 | P-5 | 45 | B-5 | 2.5 | S-3 | 150 | D-1 | 2.5 | F-6 |
| Example 24 | P-5 | 45 | B-5 | 2.5 | S-3 | 150 | D-12 | 2.5 | F-5 |
| Example 25 | P-6 | 45 | B-4 | 2.5 | S-3 | 150 | D-12 | 2.5 | F-7 |

TABLE 4-continued

| | | | | | | | | |
|---|---|---|---|---|---|---|---|---|
| Example 26 | P-6 | 45 | B-4 | 2.5 | S-3 | 150 | D-2 | 2.5 | F-5 |
| Example 27 | P-1 | 45 | B-4 | 2.5 | S-3 | 150 | D-12 | 2.5 | F-6 |
| Example 28 | P-1 | 45 | B-4 | 2.5 | S-3 | 150 | D-12 | 2.5 | F-6 |

| | (Component F) Basic compound | (Component G) Surfactant | | (Component C) | Other additives | | Crosslinkable |
|---|---|---|---|---|---|---|---|
| | Amount added | Type | Amount added | Solvent Type | Type | Amount added | group equivalent |
| Example 23 | 0.1 | W-2 | 0.08 | C-3 | — | — | 141 |
| Example 24 | 0.1 | W-2 | 0.08 | C-4 | — | — | 141 |
| Example 25 | 0.1 | W-2 | 0.08 | C-2 | — | — | 120 |
| Example 26 | 0.1 | W-2 | 0.08 | C-5 | — | — | 120 |
| Example 27 | 0.1 | W-1 | 0.08 | C-4 | Z-2 | 1 | 132 |
| Example 28 | 0.1 | W-2 | 0.08 | C-3 | — | — | 132 |

TABLE 5

| | Strength |
|---|---|
| Example 23 | A |
| Example 24 | A |
| Example 25 | A |
| Example 26 | A |
| Example 27 | A |
| Example 28 | A |

<Preparation of Infrared Cut Filter Having Light-Shielding Portion Containing Titanium Black>

The composition of Example 23 was applied onto the incident surface of the infrared cut filter by spin coating with a coater-developer ACT (manufactured by Tokyo Electron Ltd.), and was heated (pre-baking) using a hot plate at 100° C. for 120 seconds to form a coating film. Subsequently, the coating film was patternwise exposed at an exposure dose of 200 mJ/cm$^2$ through a mask, using an i-line stepper exposure apparatus FPA-3000i5+ (manufactured by Canon Inc.).

Then, the infrared cut filter on which the irradiated coating film has been formed was subjected to puddle development at room temperature for 60 seconds by a coater-developer ACT, using a 0.3 mass % aqueous solution of tetramethyl ammonium hydroxide as a developer. After the development, the developed film was rinsed with pure water for 20 seconds by spin shower, followed by further washing with pure water, and then subjected to a heat treatment (post-baking) for 300 seconds using a hot plate at 200° C., whereby an infrared cut filter with a frame pattern was prepared on which a black layer with a frame pattern having a size of 7.0 mm×5.0 mm and a width of 0.7 mm was formed.

The black layer in the resulting infrared cut filter exhibited excellent light-shielding properties and a high surface hardness.

What is claimed is:

1. A photosensitive resin composition comprising:
   (Component A) a polymer having a constitutional unit containing a group in which an acid group is protected by an acid-decomposable group;
   (Component B) a photoacid generator;
   (Component C) a solvent;
   (Component D) a compound having a crosslinkable group and a molecular weight in the range of 100 to 2,000;
   (Component E) a dispersant; and
   (Component S) titanium black,
   wherein Component E comprises a polymer dispersant having an acid group in the side chain.

2. The photosensitive resin composition according to claim 1, wherein the crosslinkable group is at least one selected from the group consisting of an epoxy group, an oxetanyl group, an alkoxymethyl group, a methylol group, a blocked isocyanate group, and a group having an ethylenically unsaturated bond.

3. The photosensitive resin composition according to claim 1, wherein the crosslinkable group equivalent in the photosensitive resin composition is 100 to 1,000 per 1 g of organic solid content.

4. The photosensitive resin composition according to claim 1, wherein the content of Component S is 40 mass % to 80 mass % based on the total solid content of the photosensitive resin composition.

5. The photosensitive resin composition according to claim 1, wherein the crosslinkable group is at least one selected from the group consisting of an epoxy group, an oxetanyl group, and a (meth)acryloxy group.

6. The photosensitive resin composition according to claim 1, wherein Component B is an oxime sulfonate compound.

7. A method for producing a cured product, comprising in this order:
   applying the photosensitive resin composition according to claim 1 onto a substrate;
   removing a solvent from the applied resin composition; and
   heat-treating the resin composition freed from the solvent, or irradiating the resin composition freed from the solvent with actinic rays.

8. A method for producing a resin pattern, comprising in this order:
   applying the photosensitive resin composition according to claim 1 onto a substrate;
   removing a solvent from the applied resin composition;
   patternwise exposing the resin composition freed from the solvent to actinic rays; and
   developing the exposed resin composition and the unexposed resin composition with an aqueous developer.

9. A photosensitive resin composition comprising:
   (Component A) a polymer having a constitutional unit containing a group in which an acid group is protected by an acid-decomposable group;
   (Component B) a photoacid generator;
   (Component C) a solvent;
   (Component D) a compound having a crosslinkable group and a molecular weight in the range of 100 to 2,000; and
   (Component S) titanium black, wherein the crosslinkable group equivalent in the photosensitive resin composition is 100 to 550 per 1 g of organic solid content.

10. The photosensitive resin composition according to claim 9, wherein the crosslinkable group is at least one selected from the group consisting of an epoxy group, an oxetanyl group, an alkoxymethyl group, a methylol group, a blocked isocyanate group, and a group having an ethylenically unsaturated bond.

11. The photosensitive resin composition according to claim 9, further comprising (Component E) a dispersant.

12. The photosensitive resin composition according to claim 9, wherein the content of Component S is 40 mass % to 80 mass % based on the total solid content of the photosensitive resin composition.

13. The photosensitive resin composition according to claim 9, wherein the crosslinkable group is at least one selected from the group consisting of an epoxy group, an oxetanyl group, and a (meth)acryloxy group.

14. The photosensitive resin composition according to claim 9, wherein Component B is an oxime sulfonate compound.

15. A method for producing a cured product, comprising in this order:
applying the photosensitive resin composition according to claim 9 onto a substrate;
removing a solvent from the applied resin composition; and
heat-treating the resin composition freed from the solvent, or irradiating the resin composition freed from the solvent with actinic rays.

16. A method for producing a resin pattern, comprising in this order:
applying the photosensitive resin composition according to claim 9 onto a substrate;
removing a solvent from the applied resin composition;
patternwise exposing the resin composition freed from the solvent to actinic rays; and
developing the exposed resin composition and the unexposed resin composition with an aqueous developer.

17. A photosensitive resin composition comprising:
(Component A) a polymer having a constitutional unit containing a group in which an acid group is protected by an acid-decomposable group;
(Component B) a photoacid generator;
(Component C) a solvent;
(Component D) a compound having a crosslinkable group and a molecular weight in the range of 100 to 2,000; and
(Component S) titanium black,
wherein the average primary particle diameter of Component S is in the range of from 10 nm to 100 nm, and
the specific surface area of Component S is from 20 m$^2$/g to 100 m$^2$/g.

18. The photosensitive resin composition according to claim 17, wherein the crosslinkable group is at least one selected from the group consisting of an epoxy group, an oxetanyl group, an alkoxymethyl group, a methylol group, a blocked isocyanate group, and a group having an ethylenically unsaturated bond.

19. The photosensitive resin composition according to claim 17, wherein the crosslinkable group equivalent in the photosensitive resin composition is 100 to 1,000 per 1 g of organic solid content.

20. The photosensitive resin composition according to claim 17, further comprising (Component E) a dispersant.

21. The photosensitive resin composition according to claim 17, wherein the content of Component S is 40 mass % to 80 mass % based on the total solid content of the photosensitive resin composition.

22. The photosensitive resin composition according to claim 17, wherein the crosslinkable group is at least one selected from the group consisting of an epoxy group, an oxetanyl group, and a (meth)acryloxy group.

23. The photosensitive resin composition according to claim 17, wherein Component B is an oxime sulfonate compound.

24. A method for producing a cured product, comprising in this order:
applying the photosensitive resin composition according to claim 17 onto a substrate;
removing a solvent from the applied resin composition; and
heat-treating the resin composition freed from the solvent, or irradiating the resin composition freed from the solvent with actinic rays.

25. A method for producing a resin pattern, comprising in this order:
applying the photosensitive resin composition according to claim 17 onto a substrate;
removing a solvent from the applied resin composition;
patternwise exposing the resin composition freed from the solvent to actinic rays; and
developing the exposed resin composition and the unexposed resin composition with an aqueous developer.

* * * * *